(12) United States Patent
Lee et al.

(10) Patent No.: US 11,380,664 B2
(45) Date of Patent: Jul. 5, 2022

(54) DISPLAY DEVICE AND METHOD OF FABRICATING THE DISPLAY DEVICE

(71) Applicant: Samsung Display Co., Ltd., Yongin-si (KR)

(72) Inventors: Ji Hye Lee, Yongin-si (KR); Kyung Bae Kim, Yongin-si (KR); Mee Hye Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/038,318

(22) Filed: Sep. 30, 2020

(65) Prior Publication Data

US 2021/0272943 A1 Sep. 2, 2021

(30) Foreign Application Priority Data

Feb. 27, 2020 (KR) .................. 10-2020-0024308

(51) Int. Cl.
*H01L 25/16* (2006.01)
*H01L 33/62* (2010.01)
*H01L 27/12* (2006.01)
*H01L 33/60* (2010.01)
*H01L 23/00* (2006.01)

(52) U.S. Cl.
CPC .......... *H01L 25/167* (2013.01); *H01L 24/92* (2013.01); *H01L 27/124* (2013.01); *H01L 27/1259* (2013.01); *H01L 33/60* (2013.01); *H01L 33/62* (2013.01); *H01L 2224/9201* (2013.01); *H01L 2224/92144* (2013.01); *H01L 2933/0066* (2013.01)

(58) Field of Classification Search
CPC ..... H01L 25/167; H01L 24/92; H01L 27/124; H01L 27/1259; H01L 33/60; H01L 33/62; H01L 2224/9201; H01L 2224/92144; H01L 2933/0066; H01L 27/1214; H01L 27/12; H01L 27/13; H01L 29/66757; G02F 1/136213
USPC .............................. 257/71, 72, 222, E27.084
See application file for complete search history.

(56) References Cited

U.S. PATENT DOCUMENTS 10,249,603 B2 4/2019 Cho et al.
10,461,123 B2 10/2019 Kim et al.
10,790,348 B2 * 9/2020 Lee ..................... H01L 27/3276
(Continued)

FOREIGN PATENT DOCUMENTS

KR 10-2018-0007025 A 1/2018
KR 10-2018-0072909 A 7/2018
(Continued)

*Primary Examiner* — Bo B Jang
(74) *Attorney, Agent, or Firm* — Lewis Roca Rothgerber Christie LLP

(57) ABSTRACT

A display device includes a substrate including a display area having a plurality of pixel areas and a non-display area located at at least one side of the display area; a pixel in each of the pixel areas; and a plurality of fan-out lines in the non-display area to form a first conductive layer. The pixel includes a pixel circuit layer including at least one transistor and a first bridge line and a second bridge line; and a display element layer on the pixel circuit layer. Each of the first and second bridge lines is electrically connected to a corresponding fan-out line from among the fan-out lines.

14 Claims, 46 Drawing Sheets

(56) References Cited

U.S. PATENT DOCUMENTS

| | | | |
|---|---|---|---|
| 2010/0109993 A1* | 5/2010 | Chang | G02F 1/1345 345/92 |
| 2017/0047347 A1* | 2/2017 | Kim | G02F 1/1345 |
| 2017/0047356 A1* | 2/2017 | Lee | G02F 1/13452 |
| 2017/0365808 A1* | 12/2017 | Lee | H01L 27/3276 |
| 2018/0012876 A1 | 1/2018 | Kim et al. | |
| 2018/0130856 A1* | 5/2018 | Kim | H01L 27/3218 |
| 2019/0067404 A1* | 2/2019 | Lee | H01L 51/5218 |
| 2020/0373375 A1* | 11/2020 | Na | H01L 27/3246 |
| 2020/0403129 A1 | 12/2020 | Lee et al. | |

FOREIGN PATENT DOCUMENTS

| | | |
|---|---|---|
| KR | 10-1987196 B1 | 6/2019 |
| KR | 10-2020-0145899 A | 12/2020 |

\* cited by examiner

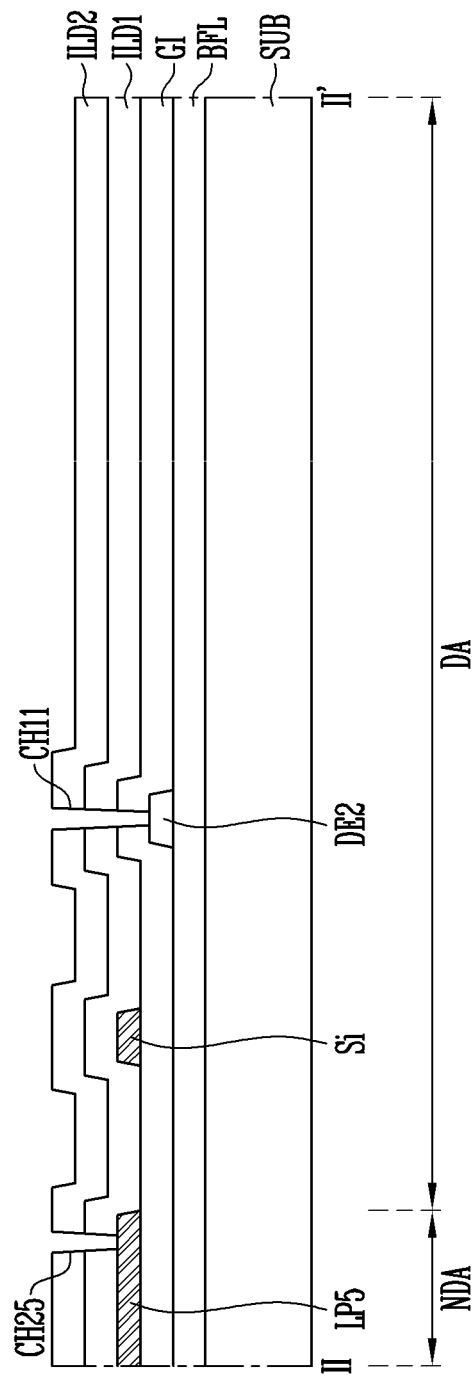

DISPLAY DEVICE AND METHOD OF FABRICATING THE DISPLAY DEVICE

CROSS-REFERENCE TO RELATED APPLICATION

This application claims priority to and the benefit of Korean patent application 10-2020-0024308 filed on Feb. 27, 2020 in the Korean Intellectual Property Office, the entire disclosure of which is incorporated herein by reference.

BACKGROUND

1. Field

The present disclosure generally relates to a display device and a method of fabricating the display device.

2. Related Art

With the increased interest in information displays and the high demand for portable information media, display devices have been in high demand recently, and commercialization of display devices has been intensified.

SUMMARY

One or more embodiments of the present disclosure provide a display device formed through a simple fabricating process by decreasing a number of masks, and a method of fabricating the display device.

In accordance with one or more embodiments of the present disclosure, there is provided a display device including a substrate including a display area including a plurality of pixel areas and a non-display area located at at least one side of the display area; a pixel in each of the pixel areas; and a plurality of fan-out lines in the non-display area to form a first conductive layer, wherein the pixel includes a pixel circuit layer including a data line, at least one transistor, at least one capacitor, and a first bridge line and a second bridge line to form a second conductive layer different from the first conductive layer; and a display element layer on the pixel circuit layer, the display element layer including a plurality of light emitting elements, wherein each of the first and second bridge lines is electrically connected to a corresponding fan-out line from among the fan-out lines.

In one or more embodiments, the pixel circuit layer may include first to fourth insulating layers sequentially disposed on the substrate. The display element layer may include first to third electrodes spaced from each other on the fourth insulating layer; the light emitting elements between the first to third electrodes; a first sub-electrode electrically connected to the first bridge line through a first contact hole penetrating the fourth insulating layer; and a second sub-electrode electrically connected to the data line through a second contact hole penetrating the fourth insulating layer.

In one or more embodiments, each of the first and second sub-electrodes may be electrically separated from the first to third electrodes.

In one or more embodiments, the first and second sub-electrodes may be at the same layer as the first to third electrodes.

In one or more embodiments, the second electrode may be electrically connected to the second bridge line through a third contact hole penetrating the fourth insulating layer.

In one or more embodiments, the pixel circuit layer may include a scan line to transfer a scan signal to the pixel; the data line to transfer a data signal to the pixel; a power line to transfer a driving voltage to the pixel; and an initialization power line to transfer an initialization voltage to the pixel.

In one or more embodiments, the first electrode may be electrically separated from the first bridge line, and the third electrode may be electrically separated from the data line.

In one or more embodiments, at least a portion of the first electrode may overlap with the first bridge line in a plan view, at least a portion of the second electrode may overlap with the second bridge line in a plan view, and at least a portion of the third electrode may overlap with the data line in a plan view.

In one or more embodiments, the first conductive layer may be on the first insulating layer, and the second conductive layer may be on the third insulating layer.

In one or more embodiments, the scan line may be at the same layer as the fan-out lines, and the data line may be at the same layer as the first and second bridge lines.

In one or more embodiments, the first and second bridge lines and the data line may extend in one direction, and be spaced from each other.

In one or more embodiments, the display element layer may further include an insulating pattern on an upper surface of each of the light emitting elements; and a contact electrode on each of the first to third electrodes.

In one or more embodiments, the contact electrode on the first electrode, the contact electrode on the second electrode, and the contact electrode on the third electrode may be on the insulating pattern, and may be spaced from each other.

In one or more embodiments, the first bridge line may be connected to a corresponding fan-out line from among the fan-out lines and the first sub-electrode, the second bridge line may be connected to a corresponding fan-out line from among the fan-out lines and the second electrode, and the data line may be connected to a corresponding fan-out line from among the fan-out lines and the second sub-electrode.

In accordance with one or more embodiments of the present disclosure, there is provided a method of fabricating a display device, the method including preparing a substrate including a display area including a pixel area in which each pixel is located and a non-display area; forming, on the substrate, a first conductive layer including a plurality of fan-out lines and a plurality of scan lines; forming an interlayer insulating layer on the first conductive layer; forming, on the interlayer insulating layer, a second conductive layer including a plurality of data lines, a plurality of first bridge lines respectively connected to corresponding fan-out lines from among the fan-out lines, and a plurality of second bridge lines respectively connected to corresponding fan-out lines from among the fan-out lines; forming, over the second conductive layer, a passivation layer including a plurality of contact holes exposing a portion of each of the first bridge lines, a portion of each of the second bridge lines, and a portion of each of the data lines; forming a first alignment electrode on the passivation layer, the first alignment electrode electrically connected to the first bridge lines, a second alignment electrode electrically connected to the second bridge lines, and a third alignment electrode electrically connected to the data lines; supplying light emitting elements in the pixel area, forming an electric field between the first to third alignment electrodes by applying a corresponding alignment voltage to each of the first bridge lines, each of the second bridge lines, and each of the data lines, and aligning the light emitting elements between the first to third alignment electrodes; and forming a first electrode and a first sub-electrode that are spaced from each other, by removing a portion of the first alignment electrode, and forming a third electrode and a second sub-electrode that are spaced from each other, by removing a portion of the third alignment electrode.

In one or more embodiments, the first sub-electrode may be electrically connected to the first bridge line, and the first electrode may be electrically separated from the first bridge line. The second sub-electrode may be electrically connected to the data line, and the third electrode may be electrically separated from the data line.

In one or more embodiments, the first and second sub-electrodes, the first electrode, the second alignment electrode, and the second electrode may be at the same layer.

In one or more embodiments, to align the light emitting elements, a first alignment signal from a corresponding fan-out line is applied to each of the first bridge lines, a second alignment signal from a corresponding fan-out line is applied to each of the second bridge lines, and a third alignment signal from a corresponding fan-out line is applied to each of the data lines.

In one or more embodiments, at least a portion of the first electrode may overlap with each of the first bridge lines in a plan view, at least a portion of the second alignment electrode may overlap with each of the second bridge lines in a plan view, and at least a portion of the third electrode may overlap with each of the data lines in a plan view.

In one or more embodiments, the method may further include forming a contact electrode on each of the first electrode, the second alignment electrode, and the third electrode.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawings, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 5 is a schematic plan view of a display device using, as a light emitting source, any one light emitting element from among the light emitting elements shown in FIGS. 1A, 1B, 2A, 2B, 3A, 3B, 4A, and 4B.

FIGS. 18A-18L are sectional views sequentially illustrating a method of fabricating the display device shown in FIG. 12.

DETAILED DESCRIPTION

Figure 1A:
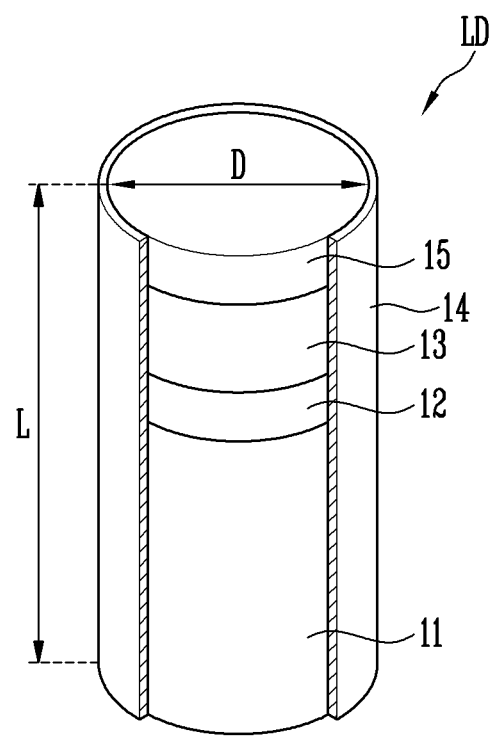
FIG. 1A is a perspective view schematically illustrating a light emitting element in accordance with one or more embodiments of the present disclosure.

The present disclosure may apply various changes and different shape, therefore only illustrate in details with particular examples. However, the examples do not limit to certain shapes but apply to all the change and equivalent material and replacement. The drawings included are illustrated in a fashion where the drawings are expanded for better understanding.

Like reference numbers refer to like elements throughout. In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

As used herein, a plan view is a view that can be seen when all elements on the same layer or different layers are visible on the same plane, or a view from the top or from a direction orthogonal to a substrate on which elements are located assuming that all relevant elements are visible.

Hereinafter, example embodiments of the present disclosure and items required for those skilled in the art to understand the content of the present disclosure will be described in detail with reference to the accompanying drawings. In the following description, singular forms in the present disclosure are intended to include the plural forms as well, unless the context clearly indicates otherwise.

Figure 1B:
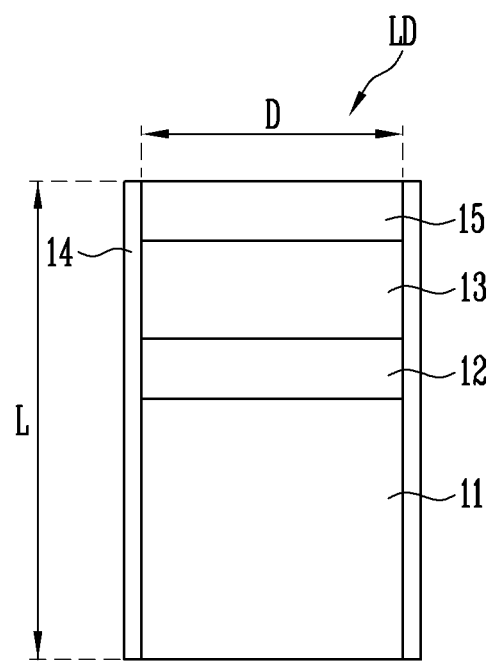
FIG. 1B is a sectional view of the light emitting element shown in FIG. 1A.
Figure 2A:
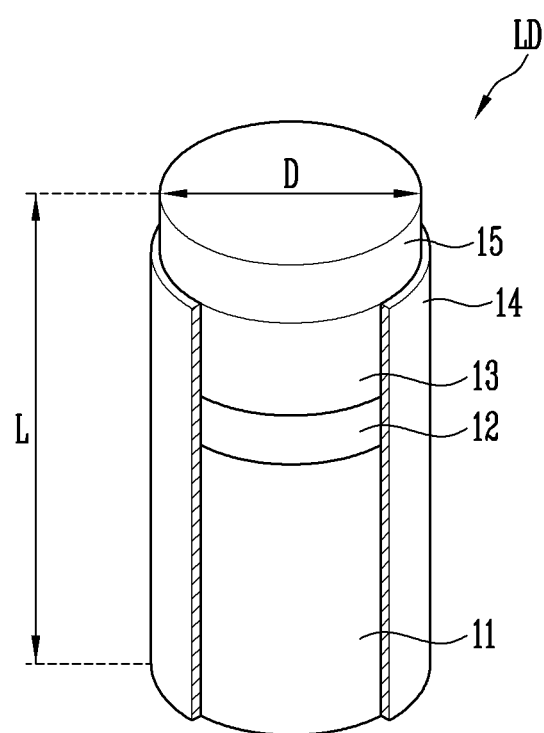
FIG. 2A is a perspective view schematically illustrating a light emitting element in accordance with another embodiment of the present disclosure.
Figure 2B:
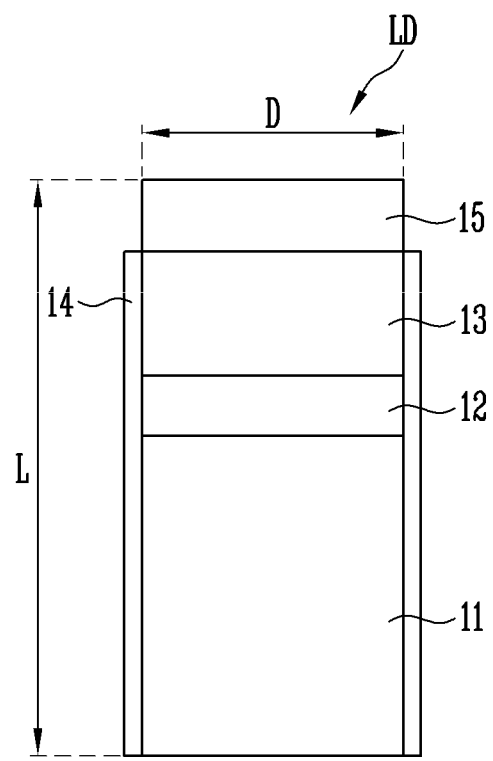
FIG. 2B is a sectional view of the light emitting element shown in FIG. 2A.
Figure 3A:
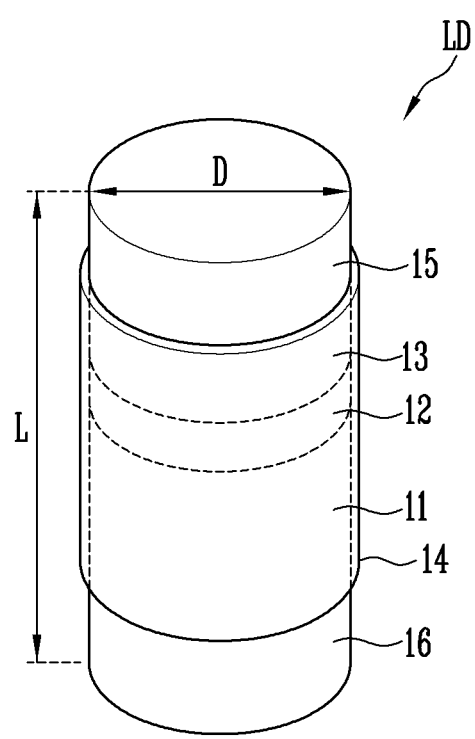
FIG. 3A is a perspective view schematically illustrating a light emitting element in accordance with still another embodiment of the present disclosure.
Figure 3B:
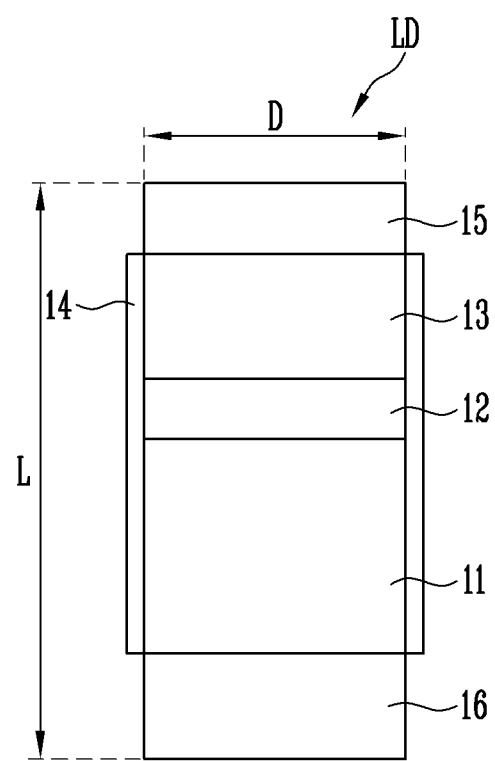
FIG. 3B is a sectional view of the light emitting element shown in FIG. 3A.
Figure 4A:
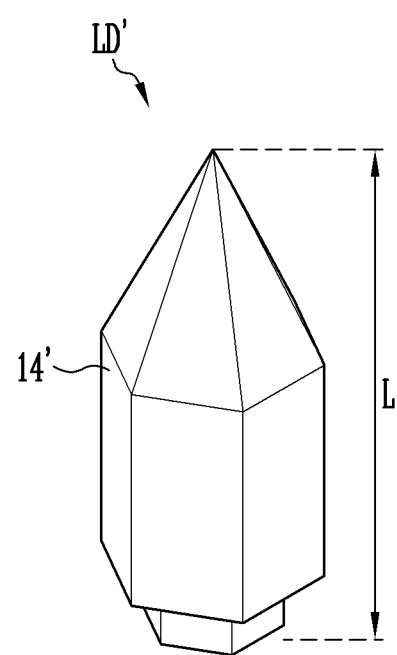
FIG. 4A is a perspective view schematically illustrating a light emitting element in accordance with still another embodiment of the present disclosure.
Figure 4B:
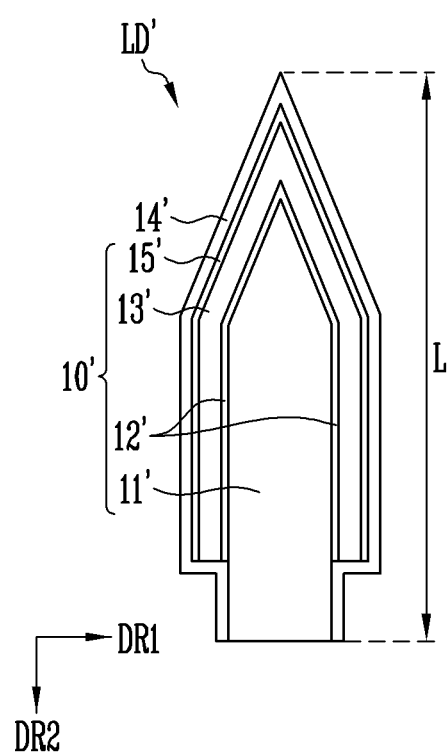
FIG. 4B is a sectional view of the light emitting element shown in FIG. 4A.

FIG. 1A is a perspective view schematically illustrating a light emitting element in accordance with one or more embodiments of the present disclosure. FIG. 1B is a sectional view of the light emitting element shown in FIG. 1A. FIG. 2A is a perspective view schematically illustrating a light emitting element in accordance with another embodiment of the present disclosure. FIG. 2B is a sectional view of the light emitting element shown in FIG. 2A. FIG. 3A is a perspective view schematically illustrating a light emitting element in accordance with still another embodiment of the present disclosure. FIG. 3B is a sectional view of the light emitting element shown in FIG. 3A. FIG. 4A is a perspective view schematically illustrating a light emitting element in accordance with still another embodiment of the present disclosure. FIG. 4B is a sectional view of the light emitting element shown in FIG. 4A.

For convenience, FIGS. 1A, 1B, 2A, 2B, 3A, and 3B, which illustrate light emitting elements fabricated through an etching process, will be described, and FIGS. 4A and 4B, which illustrate a light emitting element fabricated through a growth process, will then be described. In one or more embodiments of the present disclosure, kinds and/or shapes of the light emitting elements are not limited to the embodiments shown in FIGS. 1A, 1B, 2A, 2B, 3A, 3B, 4A, and 4B.

First, referring to FIGS. 1A, 1B, 2A, 2B, 3A, and 3B, each light emitting element LD may include a first semiconductor layer 11, a second semiconductor layer 13, and an active layer 12 interposed between the first and second semiconductor layers 11 and 13. In one or more embodiments, the light emitting element LD may be implemented as a light emitting stack structure in which the first semiconductor layer 11, the active layer 12, and the second semiconductor layer 13 are sequentially stacked.

In accordance with one or more embodiments of the present disclosure, the light emitting element LD may have a shape extending in one direction. When assuming that an extending direction of the light emitting element LD is a length direction, the light emitting element LD may have one end portion and the other end portion along the extending direction. Any one of the first and second semiconductor layers 11 and 13 may be disposed at the one end portion of the light emitting element LD, and the other one of the first and second semiconductor layers 11 and 13 may be disposed at the other end portion of the light emitting element LD.

The light emitting element LD may be provided in various shapes. In one or more embodiments, the light emitting element LD may have a rod-like shape or bar-like shape, which is long in its length direction (e.g., the aspect ratio of the light emitting element LD is greater than 1). In one or more embodiments of the present disclosure, a length L of the light emitting element LD in the length direction may be greater than a diameter D (or a width of a cross-section) of the light emitting element LD. The light emitting element LD may include, for example, a light emitting diode fabricated small enough to have a diameter D and/or a length L to a degree of nano scales to micro scales. In one or more embodiments of the present disclosure, the size of the light emitting element LD may be modified to be suitable for requirements (or design conditions) of a lighting device or a self-luminescent display device, to which the light emitting element LD is applied.

The first semiconductor layer 11 may include, for example, at least one n-type semiconductor layer. For example, the first semiconductor layer 11 may include any one semiconductor material from among the semiconductor materials InAlGaN, GaN, AlGaN, InGaN, AlN, and InN, and may include an n-type semiconductor layer doped with a first conductive dopant such as Si, Ge, or Sn. However, the material constituting the first semiconductor layer 11 is not limited thereto. In one or more embodiments, the first semiconductor layer 11 may be configured with various materials.

The active layer 12 is formed on the first semiconductor layer 11, and may be formed in a single or multiple quantum well structure. The position of the active layer 12 may be variously changed depending on a kind of the light emitting element LD. The active layer 12 may emit light having a wavelength of 400 nm to 900 nm, and use a double hetero structure. In one or more embodiments of the present disclosure, a clad layer doped with a conductive dopant may be formed on the top and/or the bottom of the active layer 12. In one or more embodiments, the clad layer may be formed as an AlGaN layer or InAlGaN layer. In some embodiments, a material such as AlGaN or AlInGaN may be used to form the active layer 12. In one or more embodiments, the active layer 12 may be configured with various materials.

When an electric field having a suitable voltage (e.g., a set or predetermined voltage) or more is applied between end portions of the light emitting element LD, the light emitting element LD emits light as electron-hole pairs are combined in the active layer 12. The light emission of the light emitting element LD is controlled using such a principle, so that the light emitting element LD may be used as a light source for various light emitting apparatuses, including a pixel of a display device.

The second semiconductor layer 13 is formed on the active layer 12, and may include a semiconductor layer having a type different from that of the first semiconductor layer 11. For example, the second semiconductor layer 13 may be formed of a semiconductor material different from the semiconductor material of the first semiconductor layer 11, or the second semiconductor layer 13 may be formed of a semiconductor material having material properties that are different from material properties of the semiconductor material of the first semiconductor layer 11. In one or more embodiments, the second semiconductor layer 13 may include at least one p-type semiconductor material. For example, the second semiconductor layer 13 may include at least one semiconductor material from among InAlGaN, GaN, AlGaN, InGaN, AlN, and InN, and may include a p-type semiconductor layer doped with a second conductive dopant such as Mg. However, the material constituting the second semiconductor layer 13 is not limited thereto. In one or more embodiments, the second semiconductor layer 13 may be configured with various materials.

In one or more embodiments of the present disclosure, the first semiconductor layer 11 and the second semiconductor layer 13 may have different widths (or thicknesses) in the length L direction of the light emitting element LD. In one or more embodiments, the first semiconductor layer 11 may have a width (or thickness) relatively wider (or thicker) than that of the second semiconductor layer 13 along the length L direction of the light emitting element LD. For example, the active layer 12 of the light emitting element LD may be located more adjacent to an upper surface of the second semiconductor layer 13 than a lower surface of the first semiconductor layer 11 as shown in FIGS. 1A-3B.

In accordance with one or more embodiments of the present disclosure, the light emitting element LD may further include an additional electrode 15 disposed on the top of the second semiconductor layer 13, in addition to the first semiconductor layer 11, the active layer 12, and the second semiconductor 13, which are described above. In some embodiments, the light emitting element LD may further include another additional electrode 16 disposed at one end of the first semiconductor layer 11 as shown in FIGS. 3A and 3B.

The additional electrodes 15 and 16 may be ohmic contact electrodes, but the present disclosure is not limited thereto. In some embodiments, the additional electrodes 15 and 16 may be Schottky contact electrodes. The additional electrodes 15 and 16 may include a metal or metal oxide. For example, the additional electrodes 15 and 16 may include one or mixture of chromium (Cr), titanium (Ti), aluminum (Al), gold (Au), nickel (Ni), indium tin oxide (ITO), and any oxide or alloy thereof, but the present disclosure is not limited thereto.

Materials respectively included in the additional electrodes 15 and 16 may be identical to (or substantially identical to) or different from each other. The additional electrodes 15 and 16 may be substantially transparent or translucent. For example, light generated in the light emitting element LD may be emitted to the outside of the light emitting element LD by passing through the additional electrodes 15 and 16. In some embodiments, when light generated in the light emitting element LD does not pass through the additional electrodes 15 and 16 and is emitted to the outside of the light emitting element LD through an area except both the end portions of the light emitting element LD, the additional electrodes 15 and 16 may include an opaque metal.

In one or more embodiments of the present disclosure, the light emitting element LD may further include an insulative film 14. However, in some embodiments, the insulative film 14 may be omitted, or may be provided to cover only portions of the first semiconductor layer 11, the active layer 12, and the second semiconductor layer 13.

The insulative film 14 may prevent (or protect from) an electrical short circuit that may occur when the active layer 12 is in contact with a conductive material except the first semiconductor layer 11 and the second semiconductor layer 13. Also, the insulative film 14 is formed, so that a surface defect of the light emitting element LD is minimized or reduced, thereby improving the lifespan and efficiency of the light emitting element LD. Also, when a plurality of light emitting elements LD are densely disposed, the insulative film 14 can prevent (or protect from) an unwanted short circuit that may occur between the light emitting elements LD. Whether the insulative film is provided is not limited as long as the active layer 12 can prevent (or protect from) occurrence of a short circuit with external conductive material.

As shown in FIGS. 1A and 1B, the insulative film 14 may be provided in a shape entirely surrounding (or partially covering) the outer peripheral (e.g., circumferential) surface of the light emitting stack structure including the first semiconductor layer 11, the active layer 12, the second semiconductor layer 13, and the additional electrode 15. For convenience of description, a case where a portion of the insulative layer 14 is omitted is illustrated in FIG. 1A, and the first semiconductor layer 11, the active layer 12, the second semiconductor layer 13, and the additional electrode 15, which are included in the actual light emitting element LD, may be surrounded by (or partially covered by) the insulative film 14. In some embodiments, when the light emitting element LD is implemented with a light emitting stack structure including the first semiconductor layer 11, the active layer 12, and the second semiconductor layer 13, the insulative film 14 may be provided in a shape surrounding (or partially covering) the outer peripheral (e.g., circumferential) surface of each of the first semiconductor layer 11, the active layer 12, and the second semiconductor layer 13.

Although a case where the insulative film 14 is provided in a shape entirely surrounding the outer peripheral (e.g., circumferential) surface of each of the first semiconductor layer 11, the active layer 12, the second semiconductor layer 13, and the additional electrode 15 is described in the above-described embodiment, the present disclosure is not limited thereto.

In some embodiments, as shown in FIGS. 2A and 2B, the insulative film 14 may surround (or partially cover) the outer peripheral (e.g., circumferential) surface of each of the first semiconductor layer 11, the active layer 12, and the second semiconductor layer 13, and may not entirely surround the outer peripheral (e.g., circumferential) surface of the additional electrode 15 disposed on the second semiconductor layer 13. In one or more embodiments, the insulative film 14 may surround only a portion of the outer peripheral (e.g., circumferential) surface of the additional electrode 15, and may not surround the outer peripheral (e.g., circumferential) surface of the additional electrode 15. However, the insulative film 14 may expose at least both end portions of the light emitting element LD. In other words, the insulative film 14 may expose a portion of the light emitting element LD at both ends. In one or more embodiments, the insulative film 14 may expose one end portion of the first semiconductor layer 11, in addition to the additional electrode 15 disposed at one end of the second semiconductor layer 13. In some embodiments, as shown in FIGS. 3A and 3B, when the additional electrodes 15 and 16 are disposed at both the end portions of the light emitting element LD, the insulative film 14 may expose at least one area of each of the additional electrodes 15 and 16. In one or more embodiments the insulative film 14 may not be provided.

In accordance with one or more embodiments of the present disclosure, the insulative film 14 may include a transparent insulating material. For example, the insulative film 14 may include at least one insulating material selected from the group consisting of silicon oxide (SiOx), silicon nitride (SiNx), silicon oxynitride (SiON), aluminum oxide (AlOx), and titanium dioxide (TiO$_2$). However, the present disclosure is not limited thereto, and various materials having insulating properties may be used for the insulative film 14.

When the insulative film 14 is provided in the light emitting element LD, the active layer 12 can be prevented (or protected) from being short-circuited with a first electrode and/or a second electrode. In one or more embodiments, the insulative film 14 is formed, so that a surface defect of the light emitting element LD is minimized or reduced, thereby improving the lifespan and efficiency of the light emitting element LD. In one or more embodiments, when a plurality of light emitting elements LD are densely disposed, the insulative film 14 can prevent (or protect from) an unwanted short circuit that may occur between the light emitting elements LD.

The above-described light emitting element LD may be used as a light emitting source for various display devices. The light emitting element LD may be fabricated through a surface treatment process. For example, when a plurality of light emitting elements LD are mixed in a liquid solution (or solvent) to be supplied to each light emitting area (e.g., a light emitting area of each pixel or a light emitting area of each sub-pixel), each light emitting element LD may be surface-treated such that the light emitting elements LD are not unequally condensed in the solution but substantially equally dispersed in the solution.

A light emitting apparatus including the above-described light emitting element LD may be used in various types of devices that require a light source, including a display device. When a plurality of light emitting elements LD are disposed in a light emitting area of each pixel of a display panel, the light emitting elements LD may be used as a light source of the pixel. However, the application field of the light emitting element LD is not limited to the above-described example. For example, the light emitting element LD may be used in other types of devices that require a light source, such as a lighting device.

Next, a light emitting element LD' fabricated through a growth process will be described with reference to FIGS. 4A and 4B.

In description of the light emitting element LD' fabricated through the growth process, portions different from those of the above-described embodiment will be mainly described to avoid redundancy. Portions not particularly described in the light emitting element LD' fabricated through the growth process follow those of the above-described embodiment. In addition, components similar and/or identical to those of the above-described embodiment are designated by like reference numerals.

Referring to FIGS. 4A and 4B, the light emitting element LD' in accordance with one or more embodiments of the present disclosure, includes a first semiconductor layer 11', a second semiconductor layer 13', and an active layer 12' interposed between the first and second semiconductor layers 11' and 13'. In some embodiments, the light emitting element LD' may include a light emitting pattern 10' having a core-shell structure including a first semiconductor layer 11' located at the center thereof, an active layer 12' surrounding at least one side of the first semiconductor layer 11' (e.g., the active layer 12' may surround the first semiconductor layer 11' around the periphery of the first semiconductor layer 11'), a second semiconductor layer 13' surrounding at least one side of the active layer 12' (e.g., the second semiconductor layer 13' may surround the active layer 12' around the periphery of the active layer 12'), and an additional electrode 15' surrounding at least one side of the second semiconductor layer 13' (e.g., the additional electrode 15' may surround the second semiconductor layer 13' around the periphery of the second semiconductor layer 13').

The light emitting element LD' may be provided in a polypyramid shape extending in one direction. In one or more embodiments, the light emitting element LD' may be provided in a hexagonal pyramid shape. When assuming that an extending direction of the light emitting element LD' is a length L direction of the light emitting element LD', the light emitting element LD' may have one end portion (or lower end portion) and the other end portion (or upper end portion) along the length L direction. A portion of one of the first and second semiconductor layers 11' and 13' may be exposed at the one end portion (or lower end portion) of the light emitting element LD, and a portion of the other one of the first and second semiconductor layers 11' and 13' may be exposed at the other end portion (or upper end portion) of the light emitting element LD'. In one or more embodiments, a portion of the first semiconductor layer 11' may be exposed at the one end portion (or lower end portion) of the light emitting element LD', and a portion of the second semiconductor layer 13' may be exposed at the other end portion (or upper end portion) of the light emitting element LD'. When the light emitting element LD' is applied as a light source of a display device, the exposed portion of the first semiconductor layer 11' may be in contact with one of driving electrodes for driving the light emitting element LD', and the exposed portion of the second semiconductor layer 13' may be in contact with another one of the driving electrodes.

In some embodiments, when the light emitting element LD' includes the additional electrode 15', a portion of the additional electrode 15' surrounding at least one side of the second semiconductor layer 13' may be exposed at the other end portion (or upper end portion) of the light emitting element LD. When the light emitting element LD' is applied as a light source of a display device, the exposed portion of the additional electrode 15' may be in contact with the another driving electrode to be electrically connected to the one electrode.

In one or more embodiments of the present disclosure, the first semiconductor layer 11' may be located at a core, e.g., the center (or middle) of the light emitting element LD'. The light emitting element LD' may be provided in a shape corresponding to that of the first semiconductor layer 11'. In one or more embodiments, when the first semiconductor layer 11' has a hexagonal pyramid shape, the light emitting element LD' and the light emitting pattern 10' may also have a hexagonal pyramid shape.

The active layer 12' may be provided and/or formed in a shape surrounding the outer peripheral (e.g., circumferential) surface of the first semiconductor layer 11' in the length L direction of the light emitting element LD. For example, the active layer 12' may be provided and/or formed in a shape surrounding the other area except the other end portion disposed at a lower side between both end portions of the first semiconductor layer 11' in the length L direction of the light emitting element LD'.

The second semiconductor layer 13' may be provided and/or formed in a shape surrounding the active layer 12' in the length L direction of the light emitting element LD', and include a semiconductor layer having a type different from that of the first semiconductor layer 11'. For example, the second semiconductor layer 13' may be formed of a semiconductor material different from the semiconductor material of the first semiconductor layer 11' or the second semiconductor layer 13' may be formed of a semiconductor material having material properties that are different from material properties of the semiconductor material of the first semiconductor layer 11'. In one or more embodiments, the second semiconductor layer 13' may include at least one p-type semiconductor layer.

In one or more embodiments of the present disclosure, the light emitting element LD' may include an additional electrode 15' surrounding at least one side of the second semiconductor layer 13'. The additional electrode 15' may be an ohmic contact electrode or a Schottky contact electrode, which is electrically connected to the second semiconductor layer 13', but the present disclosure is not limited thereto.

As described above, the light emitting element LD' may be configured in a hexagonal pyramid shape having both protruding end portions, and may include a light emitting pattern 10' having a core-shell structure including a first semiconductor layer 11' located at the center thereof, an active layer 12' surrounding at least one side of the first semiconductor layer 11', a second semiconductor layer 13' surrounding at least one side of the active layer 12', and an additional electrode 15' surrounding at least one side of the second semiconductor layer 13'. The first semiconductor layer 11' may be disposed at one end portion (or lower end portion) of the light emitting element LD' having the hexagonal pyramid shape, and the additional electrode 15' may be disposed at the other end portion (or upper end portion) of the light emitting element LD'.

In some embodiments, the light emitting element LD' may further include an insulative film 14' provided on the outer peripheral (e.g., circumferential) surface of the light emitting pattern 10' having the core-sell structure. The insulative film 14' may include a transparent insulating material.

Figure 5:
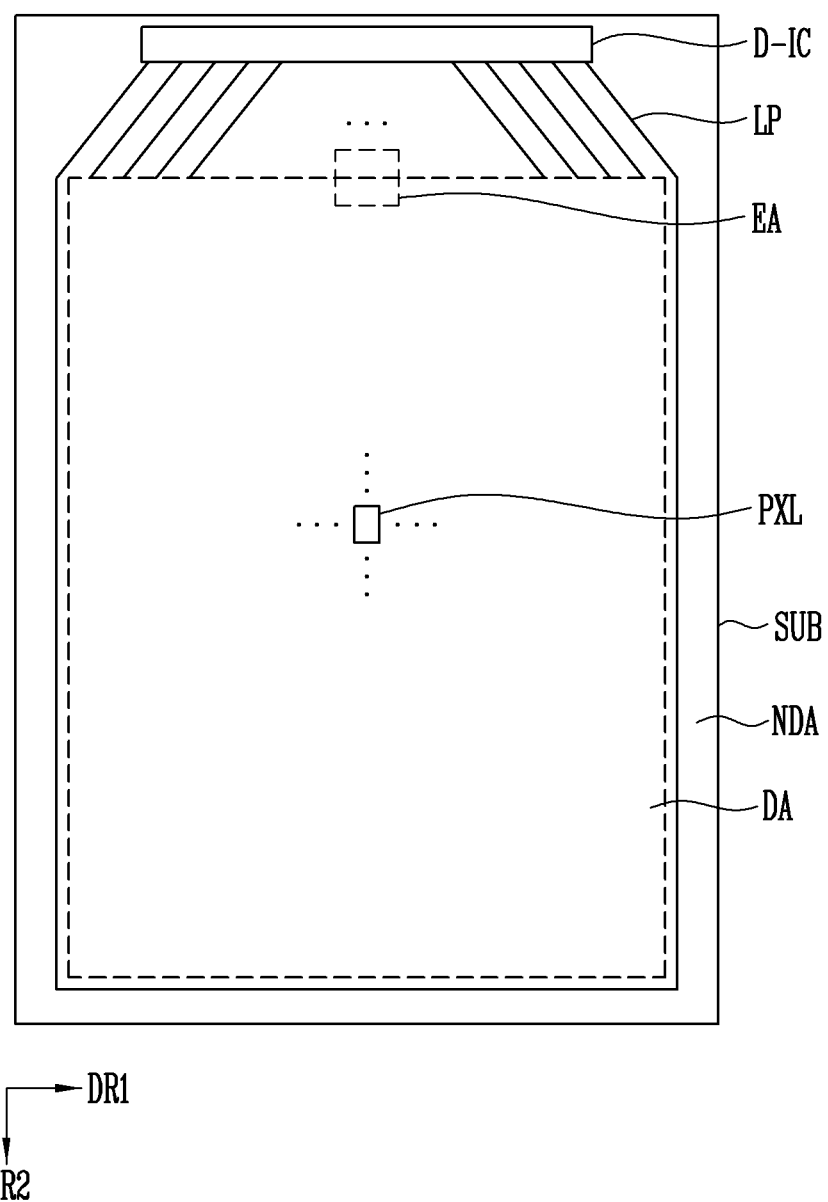
FIG. 5 illustrates a display device in accordance with one or more embodiments of the present disclosure, for example.

FIG. 5 illustrates a display device in accordance with one or more embodiments of the present disclosure, for example, FIG. 5 is a schematic plan view of a display device using, as a light emitting source, any one light emitting element from among the light emitting elements shown in FIGS. 1A, 1B, 2A, 2B, 3A, 3B, 4A, and 4B.

In FIG. 5, for convenience, a structure of the display device is briefly illustrated based on a display area in which an image is displayed. However, in some embodiments, at least one driver (e.g., a scan driver and a data driver) and/or a plurality of signal lines, which are not shown, may be further disposed in the display device.

Referring to FIGS. 1A, 1B, 2A, 2B, 3A, 3B, 4A, 4B, and 5, the display device in accordance with one or more embodiments of the present disclosure may include a substrate SUB, a plurality of pixels PXL on the substrate SUB, each pixel PXL including at least one light emitting element LD, a driver D-IC on the substrate SUB to drive the pixels PXL, and a line part LP to connect the pixels PXL and the driver D-IC.

The display device may be classified into a passive matrix type display device and an active matrix type display device according to a method of driving the light emitting element LD. For example, when the display device is implemented as the active matrix type display device, each of the pixels PXL may include a driving transistor for controlling an amount of current supplied to the light emitting element LD, a switching transistor for transferring a data signal to the driving transistor, and the like.

For example, the active matrix type display device in which light is selectively emitted for each pixel PXL may be more widely used from the viewpoint of resolution, contrast, and operation speed. However, the present disclosure is not limited thereto, and the passive matrix type display device in which light is emitted for each group of pixels PXL may also use components (e.g., first and second electrodes, and the like) for driving the light emitting element LD.

The substrate SUB may include a display area DA and a non-display area NDA.

In some embodiments, the display area DA may be disposed in a central area of the display device, and the non-display area NDA may be disposed in an edge area (or a peripheral area) of the display device to surround the display area DA. For example, the non-display area NDA may be located adjacent to the display area DA along one or more edges (or around a periphery) of the display area DA. However, the positions of the display area DA and the non-display area NDA are not limited thereto, and may be changed.

The display area DA may be an area in which the pixels PXL for displaying an image are provided. The non-display area NDA may be an area in which the driver D-IC for driving the pixels PXL and a portion of the line part LP which connects the pixels PXL and the driver D-IC are provided.

The display area DA may have various shapes. For example, the display area DA may be provided in a closed polygonal shape including linear sides. Also, the display area DA may be provided in a circular shape and/or an elliptical shape, including a curved side. For example, the display area DA may be provided in various shapes such as a semicircle or a semi-ellipse, including linear and curved sides.

The non-display area NDA may be provided at at least one side of the display area DA. In one or more embodiments of the present disclosure, the non-display area NDA may surround the periphery (e.g., circumference or edge) of the display area DA.

The line part LP connected to the pixels PXL and the driver D-IC which is connected to the line part LP and drives the pixels PXL may be provided in the non-display area NDA.

The line part LP may electrically connect the driver D-IC and the pixels PXL. The line part LP may be a fan-out line which provides a signal to each pixel PXL and is connected to signal lines, e.g., a scan line, a data line, an emission control line, and the like, which are connected to each pixel PXL.

The substrate SUB may include a transparent insulating material to enable light to be transmitted therethrough. The substrate SUB may be a rigid substrate or a flexible substrate.

One area on the substrate SUB may be provided as the display area DA such that the pixels PXL are disposed therein, and the other area on the substrate SUB may be provided as the non-display area NDA. For example, the substrate SUB may include the display area DA including pixel areas in which the respective pixels PXL are disposed and the non-display area NDA disposed at or along the periphery of the display area DA.

Each of the pixels PXL may be provided in the display area DA. In one or more embodiments of the present disclosure, the pixels PXL may be arranged in a stripe or pentile arrangement structure in the display area DA, but the present disclosure is not limited thereto.

Each pixel PXL may include at least one light emitting element LD driven by a corresponding scan signal and a corresponding data signal. The light emitting element LD may have a size small to a degree of nano scales to micro scales, and may be connected in parallel to light emitting elements disposed adjacent thereto. However, the present disclosure is not limited thereto. The light emitting element LD may constitute a light source of each pixel PXL.

Each pixel PXL may include at least one light source driven by a suitable signal (e.g., a set or predetermined signal, e.g., a scan signal and/or a data signal) and/or a suitable power source (e.g., a set or predetermined power source, e.g., a first driving power source and a second driving power source). For example, each pixel PXL may include the light emitting element LD illustrated in each of the embodiments shown in FIGS. 1A-4B, e.g., at least one micro light emitting element LD having a size small to a degree of nano scales to micro scales. However, in one or more embodiments of the present disclosure, the kind of the light emitting element LD which can be used as the light source of the pixel PXL is not limited thereto.

In one or more embodiments of the present disclosure, the color, kind, and/or number of the pixels PXL are not particularly limited. For example, the color of light emitted by each pixel PXL may be variously changed. For example, the color of light emitted by each pixel PXL may be red, blue, green, or white, depending on the pixel or the subpixel.

The driver D-IC may provide a suitable signal (a set or predetermined signal) and a suitable power source (e.g., a set or predetermined power source) to each pixel PXL through the line part LP, and accordingly, driving of the pixel PXL can be controlled.

The driver D-IC may include a scan driver for providing a scan signal to the pixels PXL through scan lines, an emission driver for providing an emission control signal to the pixels PXL through emission control lines, a data driver for providing a data signal to the pixels PXL through data lines, and a timing controller. The timing controller may control the scan driver, the emission driver, and the data driver.

FIGS. 6A-6E are circuit diagrams illustrating various embodiments of an electrical connection relationship between components included in one pixel shown in FIG. 5.

For example, FIGS. 6A-6E illustrate different embodiments of an electrical connection relationship between components included in the pixel PXL applicable to an active display device. However, the kinds (or types) of the components included in the pixel PXL to which one or more embodiments of the present disclosure are applicable are not limited thereto.

In FIGS. 6A-6E, the pixel PXL comprehensively includes not only components included in each of the pixels shown in FIG. 5 but also an area in which the components are provided. In some embodiments, each of the pixels PXL shown in FIGS. 6A-6E may be any one of the pixels PXL provided in the display device shown in FIG. 5, and the pixels PXL may have structures substantially identical or similar to one another.

Referring to FIGS. 1A-4B, 5, and 6A-6E, one pixel PXL (hereinafter, referred to as a 'pixel') may include a light emitting unit EMU which generates light with a luminance corresponding to a data signal. Also, the pixel PXL may selectively further include a pixel circuit 144 for driving the light emitting unit EMU.

In some embodiments, the light emitting unit EMU may include a plurality of light emitting elements LD connected in parallel between a first power line PL1 to which a voltage of a first driving power source VDD is applied and a second power line PL2 to which a voltage of a second driving power source VSS is applied. For example, the light emitting unit EMU may include a first electrode EU (or "first alignment electrode") connected to the first driving power source VDD via the pixel circuit 144 and the first power line PL1, a second electrode EL2 (or "second alignment electrode") connected to the second driving power source VSS through the second power line PL2, and a plurality of light emitting elements LD connected in parallel in the same direction between the first and second electrodes EL1 and EL2. In one or more embodiments of the present disclosure, the first electrode EL1 may be an anode electrode, and the second electrode EL2 may be a cathode electrode.

In one or more embodiments of the present disclosure, each of the light emitting elements LD included in the light emitting unit EMU may include one end portion connected to the first driving power source VDD through the first electrode EL1 and the other end portion connected to the second driving power source VSS through the second electrode EL2. The first driving power source VDD and the second driving power source VSS may have different potentials. For example, the first driving power source VDD may be set as a high-potential power source, and the second driving power source VSS may be set as a low-potential power source. The potential difference between the first and second driving power sources VDD and VSS may be set to be greater than or equal to a threshold voltage of the light emitting elements LD during an emission period of the pixel PXL.

As described above, the light emitting elements LD connected in parallel in the same direction (e.g., a forward direction) between the first electrode EU and the second electrode EL2, to which difference voltages are supplied, may form effective light sources, respectively. The effective light sources may constitute the light emitting unit EMU of the pixel PXL.

Each of the light emitting elements LD of the light emitting unit EMU may emit light with a luminance corresponding to a driving current supplied through a corresponding pixel circuit 144. For example, the pixel circuit 144 may supply, to the light emitting unit EMU, a driving current corresponding to a grayscale value of corresponding frame data during each frame period. The driving current supplied to the light emitting unit EMU may be divided to flow through the light emitting elements LD connected in the same direction (e.g., in parallel connection with each other). For example, the light emitting unit EMU can emit light with a luminance corresponding to the driving current while each light emitting element LD is emitting light with a luminance corresponding to a current flowing therethrough.

Figure 6A:
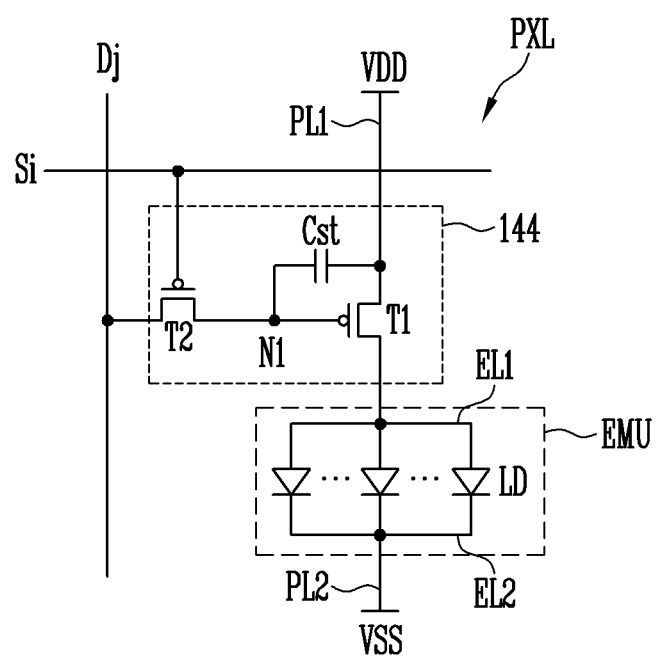
FIGS. 6A-6E are circuit diagrams illustrating various embodiments of an electrical connection relationship between components included in one pixel shown in FIG. 5.
Figure 6B:
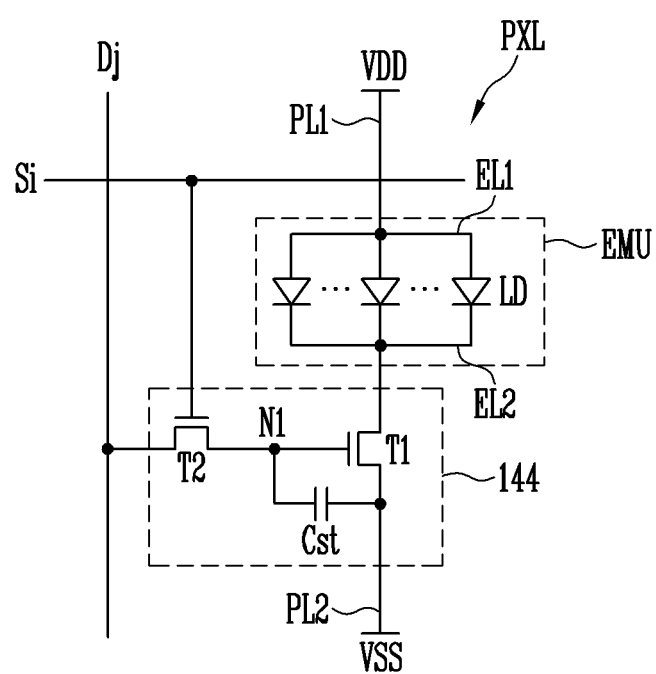
Figure 6C:
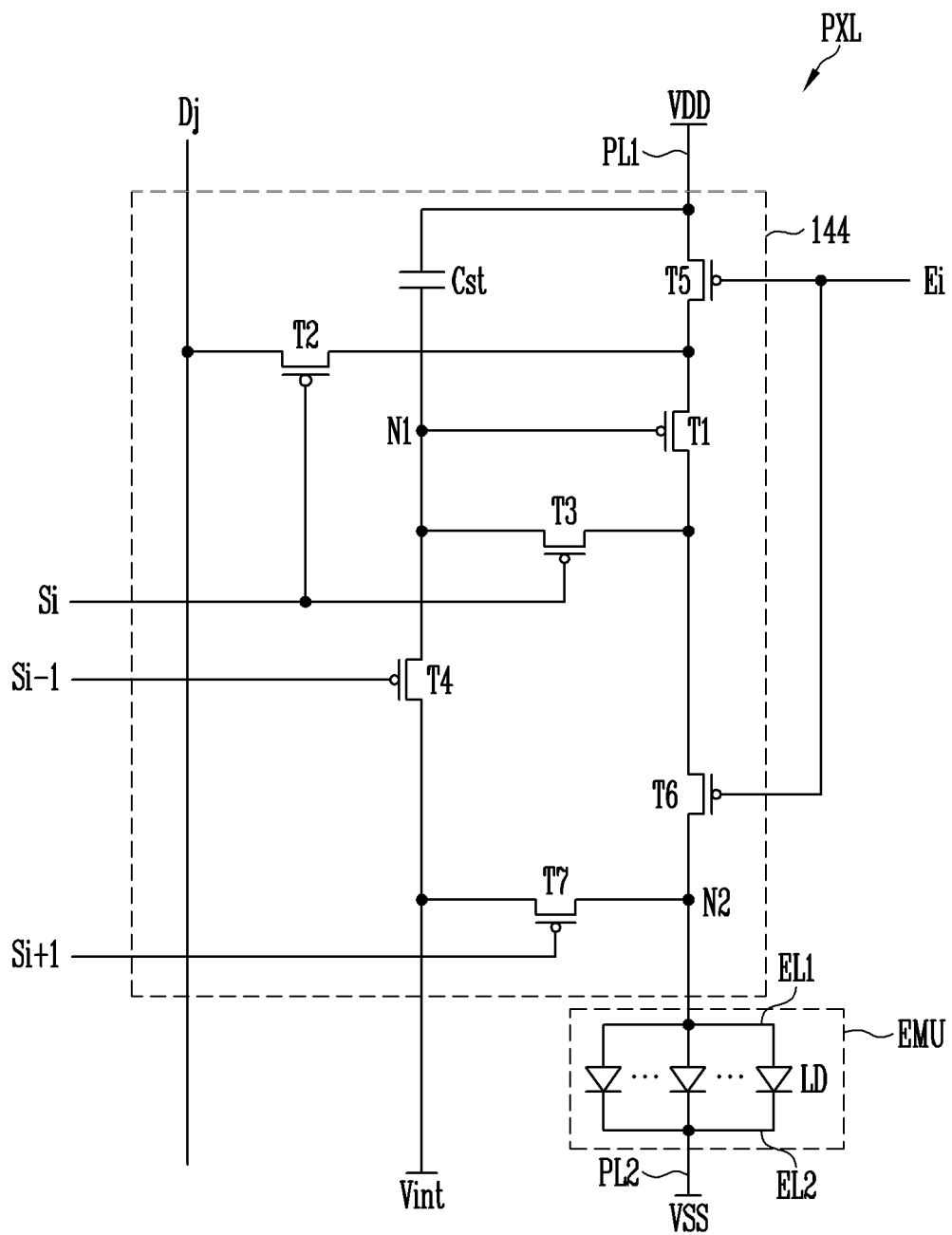
Figure 6D:
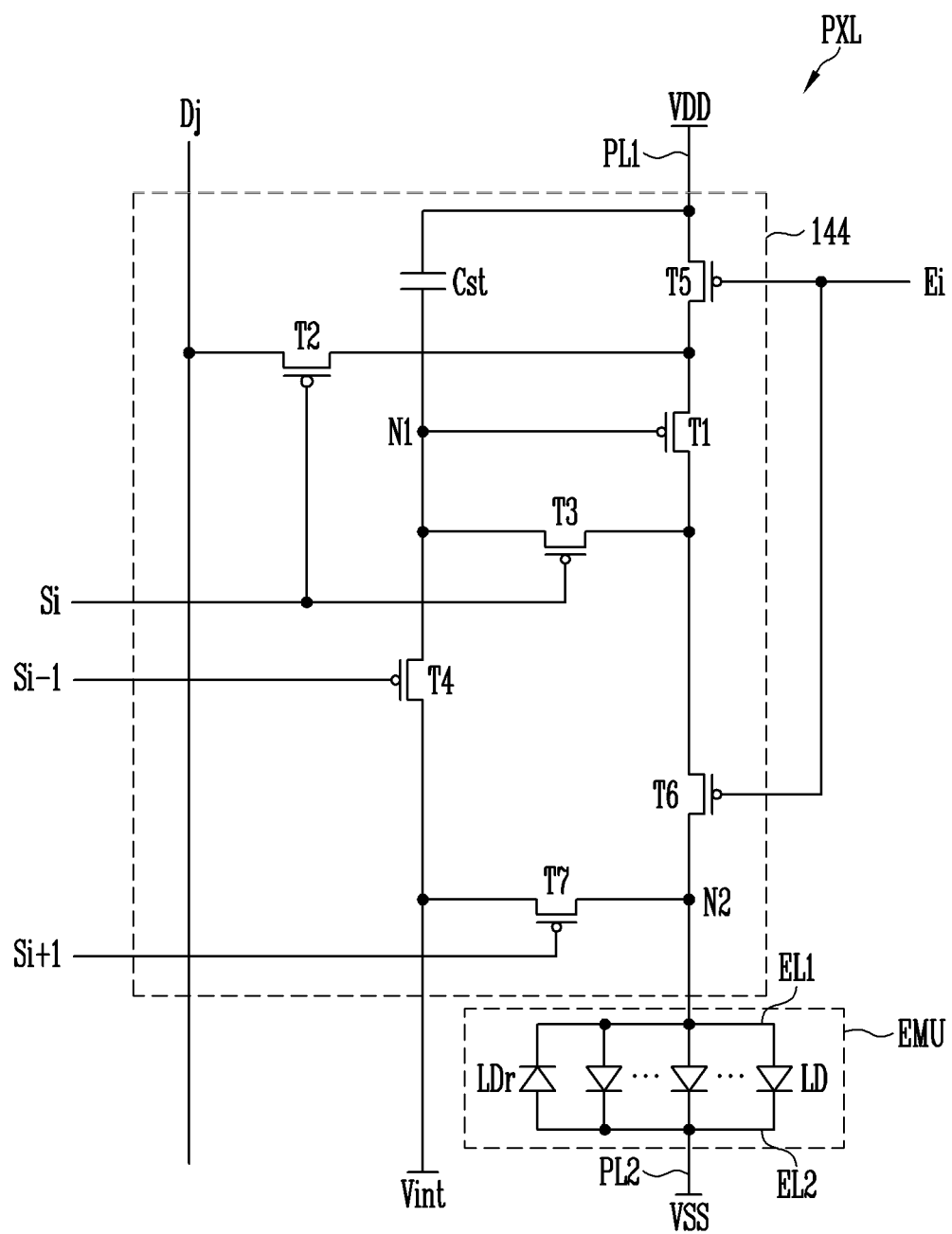
Figure 6E:
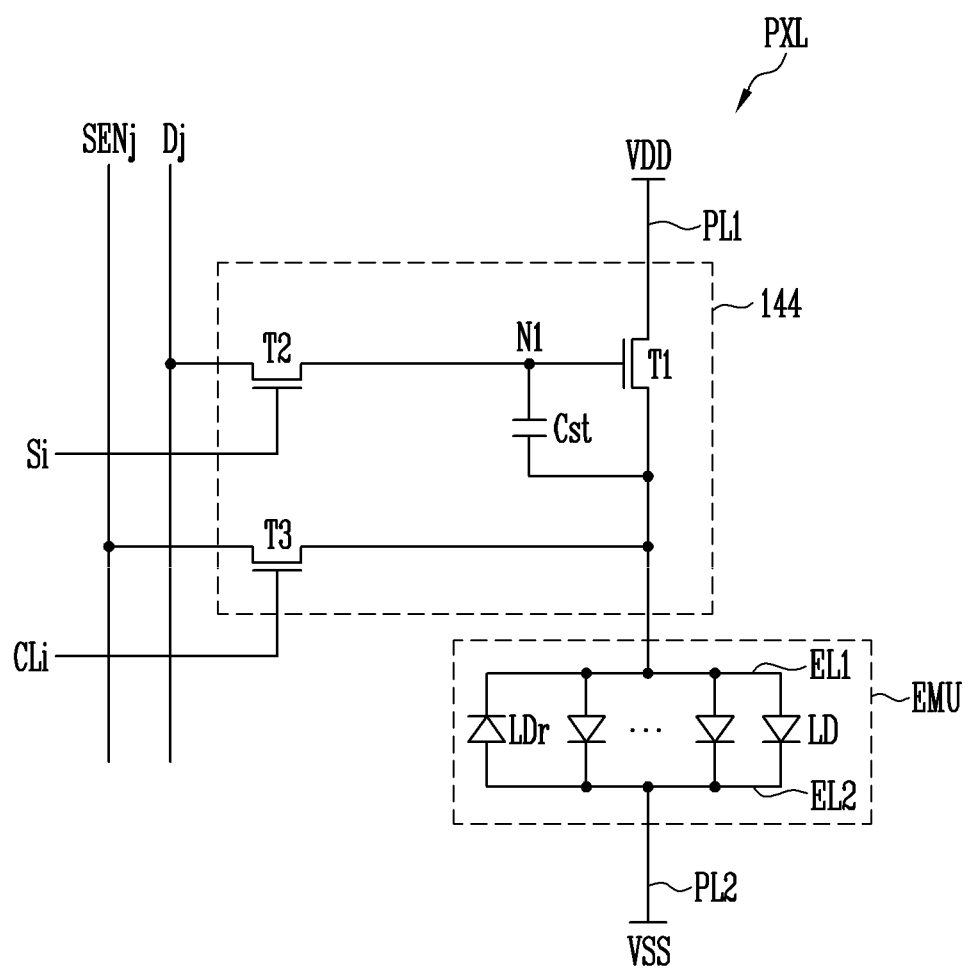

Meanwhile, although an embodiment in which the light emitting elements LD are connected in the same direction (e.g., in parallel connection with each other) between the first and second driving power sources VDD and VSS is illustrated in FIGS. 6A-6E, the present disclosure is not limited thereto. In some embodiments, the light emitting unit EMU may further include at least one ineffective light source in addition to the light emitting elements LD forming the respective effective light sources. For example, as shown in FIGS. 6D and 6E, at least one reverse light emitting element LDr may be further connected between the first and second electrodes EL1 and EL2 of the light emitting unit EMU. The reverse light emitting element LDr is connected in parallel together with the light emitting elements LD forming the effective light sources (e.g., the light emitting elements connected in the forward direction) between the first and second electrodes EL1 and EL2, and may be connected between the first and second electrodes EL1 and EL2 in a direction opposite to the direction (e.g., forward direction) in which the light emitting elements LD are connected. Although a driving voltage (e.g., a set or predetermined driving voltage, e.g., a forward driving voltage) is applied between the first and second electrodes EL1 and EL2, the reverse light emitting element LDr maintains an inactive state (e.g., a reversed biased state), and accordingly, substantially no current flows through the reverse light emitting element LDr.

The pixel circuit 144 may be connected to a scan line Si and a data line Dj of a corresponding pixel PXL. For example, when assuming that a pixel PXL is disposed on an ith (e.g., i is a natural number) row and a jth (e.g., j is a natural number) column of the display area DA, the pixel circuit 144 of the pixel PXL may be connected to an ith scan line Si and a jth data line Dj of the display area DA. In some embodiments, the pixel circuit 144 may include first and second transistors T1 and T2 and a storage capacitor Cst as shown in FIGS. 6A and 6B. However, the structure of the pixel circuit 144 is not limited to the embodiments shown in FIGS. 6A and 6B.

First, referring to FIG. 6A, the pixel circuit 144 may include first and second transistors T1 and T2 and a storage capacitor Cst.

A first terminal of the second transistor T2 (e.g., the switching transistor) may be connected to the data line Dj, and a second terminal of the second transistor T2 may be connected to a first node N1. The first terminal and the second terminal of the second transistor T2 are different terminals. For example, when the first terminal is a source electrode, the second terminal may be a drain terminal or vice versa. In one or more embodiments, a gate electrode of the second transistor T2 may be connected to the scan line Si.

The second transistor T2 is turned on when a scan signal having a voltage (e.g., a low voltage) at which the second transistor T2 can be turned on is applied to the gate electrode of the second transistor, to electrically connect the data line Dj and the first node N1. A data signal of a corresponding frame is supplied to the data line Dj. Accordingly, the data signal is transferred to the first node N1. The data signal transferred to the first node N1 is charged in the storage capacitor Cst.

A first terminal of the first transistor T1 (e.g., the driving transistor) may be connected to the first driving power source VDD, and a second terminal of the first transistor T1 may be electrically connected to a first electrode EL1 of each of the light emitting elements LD. For example, the second terminal of the first transistor T1 may be electrically connected to the first electrode EL1 of the light emitting unit EMU. In one or more embodiments, a gate electrode of the first transistor T1 may be connected to the first node N1. The first transistor T1 controls an amount of driving current supplied to the light emitting elements LD, corresponding to a voltage of the first node N1. For example, the first transistor T1 may control an amount of the driving current supplied to each of the light emitting elements LD of the light emitting unit EMU.

One electrode of the storage capacitor Cst may be connected to the first driving power source VDD, and the other electrode of the storage capacitor Cst may be connected to the first node N1. The storage capacitor Cst charges a voltage corresponding to the data signal supplied to the first node N1, and maintains the charged voltage until a data signal of a next frame is supplied.

In each of FIGS. 6A and 6B, the pixel circuit 144 is illustrated, which includes the second transistor T2 for transferring a data signal to the inside of the pixel PXL, the storage capacitor Cst for storing the data signal, and the first transistor T1 for supplying a driving current corresponding to the data signal to the light emitting elements LD of the light emitting unit EMU.

However, the present disclosure is not limited thereto, and the structure of the pixel circuit 144 may be variously modified. For example, the pixel circuit 144 may further include at least one transistor element such as a transistor element for compensating for a threshold voltage of the first transistor T1, a transistor element for initializing the first node N1, and/or a transistor element for controlling an emission time of the light emitting elements LD, or other circuit elements such as a boosting capacitor for boosting the voltage of the first node N1.

In one or more embodiments, although a case where all the transistors, e.g., the first and second transistors T1 and T2 included in the pixel circuit 144 are implemented with a P-type transistor is illustrated in FIG. 6A, the present disclosure is not limited thereto. For example, at least one of the first and second transistors T1 and T2 included in the pixel circuit 144 may be implemented with an N-type transistor.

Next, referring to FIGS. 1A-4A, 5, and 6B, the first and second transistors T1 and T2 may be implemented with an N-type transistor. A configuration or operation of the pixel circuit 144 shown in FIG. 6B is similar to that of the pixel circuit 144 shown in FIG. 6A, except that connection positions of some components (e.g., the storage capacitor Cst is connected between the first node N1 and the source electrode of the first transistor T1) are changed due to a change in transistor type. Therefore, this will be briefly described.

In one or more embodiments of the present disclosure, the pixel circuit 144 shown in FIG. 6B may include first and second transistors T1 and T2 implemented with N-type transistors and a storage capacitor Cst. When the first and second transistors T1 and T2 are implemented with N-type transistors, the light emitting unit EMU may be connected between the first driving power source VDD and the pixel circuit 144 so as to achieve the stability of the storage capacitor Cst which charges a voltage corresponding to a data signal supplied to a first node N1. However, the present disclosure is not limited thereto. In some embodiments, the light emitting unit EMU shown in FIG. 6B may be connected between the pixel circuit 144 and the second driving power source VSS. In one or more embodiments of the present disclosure, the configuration of the pixel circuit 144 is not limited to the embodiments shown in FIGS. 6A and 6B. For example, the pixel circuit 144 may be configured as illustrated in the embodiments shown in FIGS. 6C and 6D.

As shown in FIGS. 6C and 6D, the pixel circuit 144 may be connected to the scan line Si and the data line Dj of the pixel PXL. For example, when assuming that a pixel PXL is disposed on an ith row and a jth column of the display area DA, the pixel circuit 144 of the corresponding pixel PXL may be connected to an ith scan line Si and a jth data line Dj of the display area DA.

In some embodiments, the pixel circuit 144 may be further connected to at least another scan line. For example, a pixel PXL disposed on the ith row of the display area DA may be further connected to an (i−1)th scan line Si−1 (e.g., a previous scan line) and/or an (i+1)th scan line Si+1 (e.g., a next scan line). Also, in some embodiments, the pixel circuit 144 may be further connected to a third power source in addition to the first and second driving power sources VDD and VSS. For example, the pixel circuit 144 may also be connected to an initialization power source Vint.

The pixel circuit 144 may include first to seventh transistors T1 to T7 and a storage capacitor Cst.

One electrode, e.g., a source electrode of the first transistor T1 (e.g., a driving transistor) may be connected to the first driving power source VDD via the fifth transistor T5, and another electrode, e.g., a drain electrode of the first transistor T1 may be connected to one end portions of light emitting elements LD via the sixth transistor T6. For example, the drain electrode of the first transistor T1 may be electrically connected to the first electrode EL1 of each of the light emitting elements LD. In one or more embodiments, a gate electrode of the first transistor T1 may be connected to a first node N1. The first transistor T1 controls an amount of driving current flowing between the first driving power source VDD and the second driving power source VSS via the light emitting elements LD, corresponding to a voltage of the first node N1.

The second transistor T2 (e.g., the switching transistor) may be connected between the jth data line Dj connected to the pixel PXL and the source electrode of the first transistor T1. In one or more embodiments, a gate electrode of the second transistor T2 may be connected to the ith scan line Si connected to the pixel PXL. The second transistor T2 may be turned on when a scan signal having a gate-on voltage (e.g., a low voltage) is supplied to the ith scan line Si, to electrically connect the jth data line Dj to the source electrode of the first transistor T1. Therefore, when the second transistor T2 is turned on, a data signal supplied from the jth data line Dj is transferred to the source electrode of the first transistor T1.

The third transistor T3 may be connected between the drain electrode of the first transistor T1 and the first node N1. In one or more embodiments, a gate electrode of the third transistor T3 may be connected to the ith scan line Si. The third transistor T3 may be turned on when a scan signal having a gate-on voltage is supplied from the ith scan line Si, to electrically connect the drain electrode of the first transistor T1 and the first node N1 to each other.

The fourth transistor T4 may be connected between the first node N1 and an initialization power line to which the initialization power source Vint is applied. In one or more embodiments, a gate electrode of the fourth transistor T4 may be connected to a previous scan line, e.g., the (i−1)th scan line Si−1. The fourth transistor T4 may be turned on when a scan signal having a gate-on voltage is supplied to the (i−1)th scan line Si−1, to transfer a voltage of the initialization power source Vint to the first node N1. The initialization power source Vint may have a voltage equal to or smaller than the lowest voltage of the data signal.

The fifth transistor T5 may be connected between the first driving power source VDD and the first transistor T1 (e.g., the source electrode of the first transistor T1). In one or more embodiments, a gate electrode of the fifth transistor T5 may be connected to a corresponding emission control line, e.g., an ith emission control line Ei. The fifth transistor T5 may be turned off when an emission control signal having a gate-off voltage (e.g., high voltage) is supplied to the ith emission control line Ei, and may be turned on in other cases (e.g., when an emission control signal having a gate-on voltage (e.g., low voltage) is supplied to the ith emission control line Ei).

The sixth transistor T6 may be connected between the first transistor T1 and the one end portions of the light emitting elements LD. For example, the sixth transistor T6 may be connected between the drain electrode of the first transistor and the first electrode EL1 of each of the light emitting elements LD of the light emitting element EMU or the second node N2. In one or more embodiments, a gate electrode of the sixth transistor T6 may be connected to the ith emission control line Ei. The sixth transistor T6 may be turned off when an emission control signal having a gate-off voltage (e.g., high voltage) is supplied to the ith emission control line Ei, and may be turned on in other cases e.g., when an emission control signal having a gate-on voltage (e.g., low voltage) is supplied to the ith emission control line Ei).

The seventh transistor T7 may be connected between the one end portions of the light emitting elements LD (e.g., the first electrode EL1 of each of the light emitting elements LD of the light emitting element EMU) or the second node N2 and the initialization power line to which the initialization power source Vint is applied. In one or more embodiments, a gate electrode of the seventh transistor T7 may be connected to any one of the scan lines of a next stage, e.g., the (i+1)th scan line Si+1. The seventh transistor T7 may be turned on when a scan signal having a gate-on voltage (e.g., low voltage) is supplied to the (i+1)th scan line Si+1, to supply the voltage of the initialization power source Vint to the one end portions of the light emitting elements LD (e.g., the first electrode EL1 of each of the light emitting elements LD of the light emitting element EMU).

The storage capacitor Cst may be connected between the first driving power source VDD and the first node N1. The storage capacitor Cst may store a voltage corresponding to a data signal supplied to the first node N1 and a threshold voltage of the first transistor T1 in each frame period.

Although a case where all the transistors, e.g., the first to seventh transistors T1 to T7 included in the pixel circuit 144 are implemented with a P-type transistor is illustrated in FIGS. 6C and 6D, the present disclosure is not limited thereto. For example, at least one of the first to seventh transistors T1 to T7 may be replaced with an N-type transistor. In one or more embodiments, as shown in FIG. 6D, at least one reverse light emitting element LDr may be further connected between the first electrode EL1 and the second electrode EL2 of the light emitting unit EMU.

In one or more embodiments of the present disclosure, the configuration of the pixel circuit 144 is not limited to the embodiments shown in FIGS. 6A-6D. For example, the pixel circuit 144 may be configured as illustrated in the embodiment shown in FIG. 6E.

As shown in FIG. 6E, the pixel circuit 144 may be further connected to a control line CLi and a sensing line SENj. For example, the pixel circuit 144 of a pixel PXL disposed on an ith row and a jth column of the display area DA may be connected to an ith control line CLi and a jth sensing lien SENj of the display area DA. The pixel circuit 144 may further include a third transistor T3 in addition to the first and second transistors T1 and T2 shown in FIGS. 6A and 6B.

The third transistor T3 may be connected between the first transistor T1 and the sensing line SENj. For example, one electrode of the third transistor T3 may be connected to one electrode (e.g., a source electrode) of the first transistor T1 connected to the first electrode EL1 of the light emitting unit EMU, and the other electrode of the third transistor T3 may be connected to the sensing line SENj. In one or more embodiments, when the sensing line SENj is omitted, a gate electrode of the third transistor T3 may be connected to the data line Dj. In one or more embodiments, as shown in FIG. 6E, the storage capacitor Cst may be connected between the first node N1 and the source electrode of the first transistor T1).

In some embodiments, the gate electrode of the third transistor T3 may be connected to the control line CLi. In one or more embodiments, when the control line CLi is omitted, the gate electrode of the third transistor T3 may be connected to the scan line Si. The third transistor T3 may be turned on by a control signal having a gate-on voltage (e.g., a high level), which is supplied to the control line CLi during a sensing period (e.g., a set or predetermined sensing period), to electrically connect the sensing line SENj and the first transistor T1.

In some embodiments, the sensing period may be a period in which characteristic information (e.g., a threshold voltage of the first transistor T1, etc.) of each of the pixels PXL arranged in the display area DA may be determined. During the sensing period, a reference voltage (e.g., a set or predetermined reference voltage) at which the first transistor T1 can be turned on may be supplied to the first node N1 through the data line Dj and the second transistor T2, or the first transistor T1 may be turned on as each pixel PXL is connected to a current source or the like. In one or more embodiments, the first transistor T1 may be connected to the sensing line SENj as the third transistor T3 is turned on by a control signal having a gate-on voltage being supplied from the control line CLi at the gate electrode of the third transistor T3. Accordingly, characteristic information of each pixel PXL, including the threshold voltage of the first transistor T1, etc., can be extracted through the sensing line SENj. The extracted characteristic information may be used to convert image data such that a characteristic deviation between the pixels PXL may be compensated.

Although an embodiment in which all the first to third transistors T1 to T3 are N-type transistors is illustrated in FIG. 6E, the present disclosure is not limited thereto. For example, at least one of the first to third transistors T1 to T3 may be replaced with a P-type transistor. Also, although an embodiment in which the light emitting unit EMU is connected between the pixel circuit 144 and the second driving power source VSS is illustrated in FIG. 6E, the light emitting unit EMU may be connected between the first driving power source VDD and the pixel circuit 144. In one or more embodiments, as shown in FIG. 6E, at least one reverse light emitting element LDr may be further connected between the first electrode EL1 and the second electrode EL2 of the light emitting unit EMU.

Also, although an embodiment in which all the light emitting elements LD constituting each light emitting unit EMU are all connected in parallel is illustrated in FIGS. 6A-6E, the present disclosure is not limited thereto. In some embodiments, the light emitting unit EMU may be configured to include at least one serial stage including a plurality of light emitting elements LD connected in parallel to each other. For example, the light emitting unit EMU may be configured in a serial/parallel mixed structure. This will be described later with reference to FIGS. 7A and 7B.

The structure of a pixel PXL applicable to the present disclosure is not limited to the embodiments shown in FIGS. 6A-6E, and the corresponding pixel PXL may have various structures. In one or more embodiments of the present disclosure, each pixel PXL may be configured at the inside of a passive light emitting display device, etc. Therefore, the pixel circuit 144 may be omitted, and both end portions of light emitting elements LD included in the light emitting unit EMU may be directly connected to the scan lines Si−1, Si, and Si+1, the data line Dj, the first power line PL1 to which the first driving power source VDD is applied, a second power line PL2 to which the second driving power source VSS is applied, and/or a control line (e.g., a set or predetermined control line CLi).

Figure 7A:
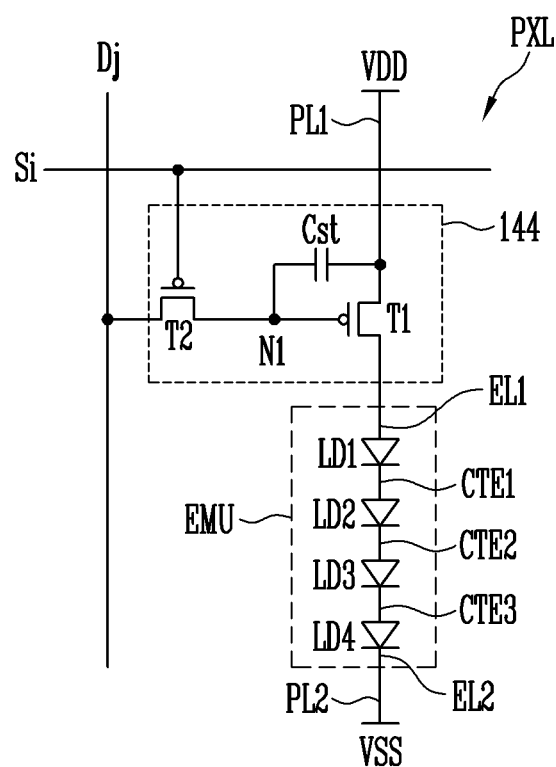
FIGS. 7A and 7B are circuit diagrams illustrating other embodiments of the electrical connection relationship between the components included in the one pixel shown in FIG. 5.
Figure 7B:
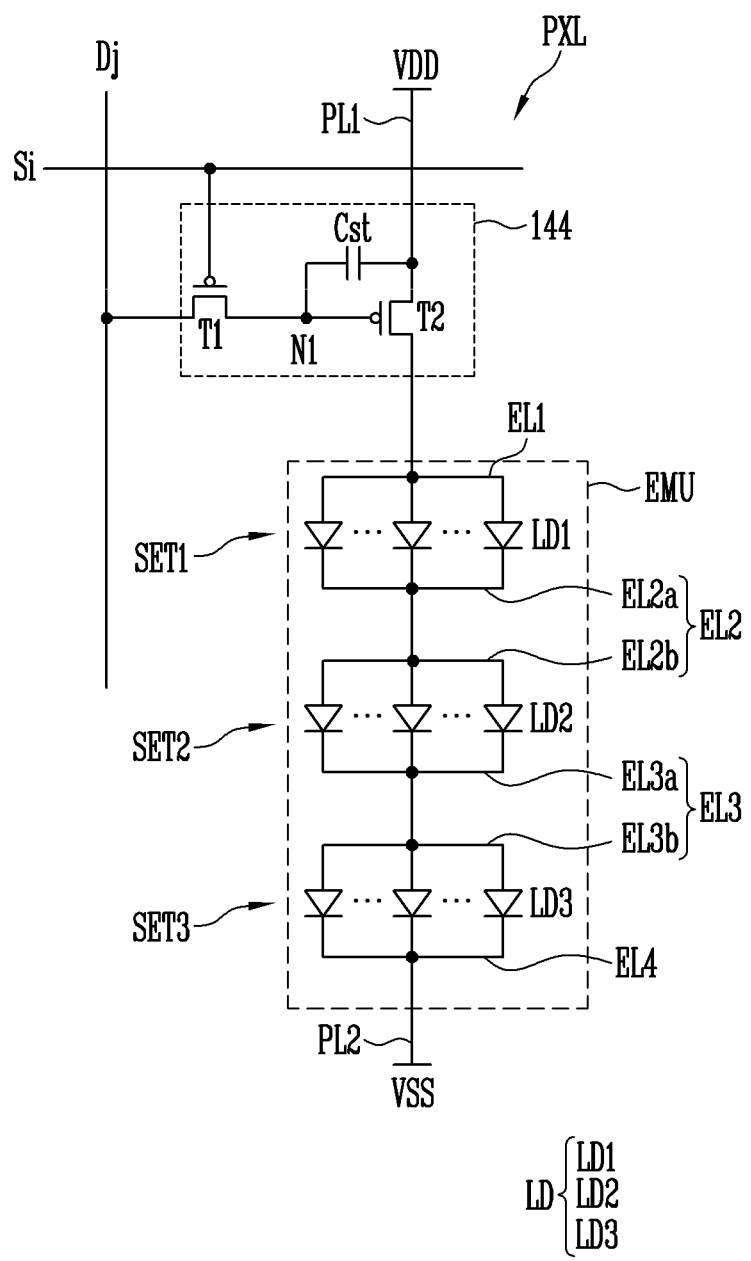

FIGS. 7A and 7B are circuit diagrams illustrating other embodiments of the electrical connection relationship between the components included in the one pixel shown in FIG. 5. In FIGS. 7A and 7B, the light emitting unit EMU of each pixel PXL may be configured to include a plurality of serial stages continuously connected to each other. In description of the embodiments shown in FIGS. 7A and 7B, detailed descriptions of components, e.g., the pixel circuit 144 similar or identical to those of the embodiments shown in FIGS. 6A-6E may not be repeated to avoid redundancy.

First, referring to FIG. 7A, the light emitting unit EMU may include a plurality of light emitting elements connected in series to each other. For example, the light emitting unit EMU may include a first light emitting element LD1, a second light emitting element LD2, a third light emitting element LD3, and a fourth light emitting element LD4, which are connected in series in a forward direction between the first driving power source VDD and the second driving power source VSS. In one or more embodiments, when at least one light emitting element from among the first to fourth light emitting elements LD1 to LD4 is arbitrarily designated or when the first to fourth light emitting elements LD1 to LD4 are inclusively designated, the light emitting element or the light emitting elements are referred to as a light emitting element LD or light emitting elements LD.

One end portion (e.g., a second semiconductor layer) of the first light emitting element LD1 may be connected to the first driving power source VDD through a first electrode EL1 of the light emitting unit EMU, and the other end portion (e.g., a first semiconductor layer) of the first light emitting element LD1 may be connected to one end portion (e.g., a second semiconductor layer) of the second light emitting element LD2 through a first intermediate electrode CTE1 connected between first and second serial stages.

The one end portion of the second light emitting element LD2 may be connected to the first intermediate electrode CTE1, and the other end portion (e.g., a first semiconductor layer) of the second light emitting element LD2 may be connected to one end portion (e.g., a second semiconductor layer) of the third light emitting element LD3 through a second intermediate electrode CTE2 connected between the second serial stage and a third serial stage.

The one end portion of the third light emitting element LD3 may be connected to the second intermediate electrode CTE2, and the other end portion (e.g., a first semiconductor layer) of the third light emitting element LD3 may be connected to one end portion (e.g., a second semiconductor layer) of the fourth light emitting element LD4 through a third intermediate electrode CTE3 connected between the third serial stage and a fourth serial stage.

The one end portion of the fourth light emitting element LD4 may be connected to the third intermediate electrode CTE3, and the other end portion (e.g., a first semiconductor layer) of the fourth light emitting element LD4 may be connected to the second driving power source VSS through a second electrode EL2 of the light emitting unit EMU.

As described above, the first to fourth light emitting elements LD1 to LD4 may be connected in series between the first and second electrodes EL1 and EL2 of the light emitting unit EMU of the pixel PXL.

In a light emitting unit EMU having a structure in which light emitting elements LD are connected in series, a voltage applied between the first and second electrodes EL1 and EL2 may be increased, and the magnitude of a driving current flowing through the light emitting unit EMU may be decreased, as compare with a light emitting unit EMU having a structure in which light emitting elements LD are connected in parallel. Thus, when the light emitting unit EMU of each pixel PXL is configured in a serial structure, power consumption of the display device can be reduced.

In some embodiments, at least one serial stage may be provided in a form including a plurality of light emitting elements connected in parallel to each other. Therefore, the light emitting unit EMU of each pixel may be configured in a series/parallel mixed structure. For example, the light emitting unit EMU may be configured as shown in FIG. 7B.

Next, referring to FIG. 7B, the light emitting unit of the pixel PXL may include a plurality of serial stages sequentially connected between the first and second driving power sources VDD and VSS. In one or more embodiments, each of the serial stages may include one or more light emitting elements LD connected in a forward direction between two electrodes constituting an electrode pair of the corresponding serial stage. For example, the light emitting unit EMU may include first to third serial stages SET1 to SET3 sequentially connected between the first and second driving power sources VDD and VSS. Each of the first to third serial stages SET1 to SET3 may include two electrodes EU and EL2a, EL2b and EL3a, or EL3b and EL4 constituting an electrode pair of the corresponding serial stage, and a plurality of light emitting elements LD connected in parallel in the forward direction, e.g., the same direction between the two electrodes EU and EL2a, EL2b and EL3a, or EL3b and EL4.

The first serial stage SET1 may include a first electrode EL1 and a 2ath intermediate electrode EL2a from among the electrodes EL1 and EL2a, EL2b and EL3a, and EL3b and EL4 constituting the electrode pairs included in the light emitting unit EMU, and may include at least one first light emitting element LD1 connected between the first electrode EL1 and the 2ath intermediate electrode EL2a. For example, the first serial stage SET1 may include a first electrode EL1 connected to the first driving power source VDD via the pixel circuit 144, a 2ath electrode EL2a connected to the second driving power source VSS (e.g., via the second serial stage SET2 and the third serial stage SET3), and a plurality of first light emitting elements LD1 connected between the first electrode EU and the 2ath electrode EL2a. One end portion (e.g., a second semiconductor layer) of each first light emitting elements LD1 may be electrically connected to the first electrode EL1 of the first serial stage SET1, and the other end portion (e.g., a first semiconductor layer) of the first light emitting element LD1 may be electrically connected to the 2ath electrode EL2a of the first serial stage SET1. The first light emitting elements LD1 may be connected in parallel with each other between the first electrode EL1 and the 2ath electrode EL2a of the first serial stage SET1, and may be connected in the same direction (e.g., the forward direction) between the first electrode EL1 and the 2ath electrode EL2a. In some embodiments, at least one reverse light emitting element (see LDr shown in FIG. 6D) may be further connected to the first serial stage SET1. The reverse light emitting element LDr may be connected in parallel together with the first light emitting elements LD1 constituting effective light sources (e.g., the light emitting elements connected in the forward direction) between the first electrode EL1 and the 2ath electrode EL2a, and may be connected in a direction opposite to that of the first light emitting elements LD1 are connected between the first electrode EL1 and the 2ath electrode EL2a. Although a driving voltage (e.g., a set or predetermined driving voltage, e.g., a driving voltage in the reverse direction) is applied between the first electrode EL1 and the 2ath electrode EL2a, the reverse light emitting element LDr maintains the inactive state (e.g., reverse biased state), and accordingly, substantially no current flows through the reverse light emitting element LDr.

The second serial stage SET2 may include a 2bth electrode EL2b and a 3ath electrode EL3a from among the electrodes EL1 and EL2a, EL2b and EL3a, and EL3b and EL4 constituting the electrode pairs included in the light emitting unit EMU, and may include at least one second light emitting element LD2 connected between the 2bth electrode EL2b and the 3ath electrode EL3a. For example, the second serial stage SET2 may include a 2bth electrode EL2b connected to the first driving power source VDD via the pixel circuit 144 and the first serial stage SET1, a 3ath electrode EL3a connected to the second driving power source VSS via the third serial stage SET3, and a plurality of second light emitting elements LD2 connected in parallel with each other between the 2bth electrode EL2b and the 3ath electrode EL3a. One end portion (e.g., a second semiconductor layer) of each of the second light emitting elements LD2 may be electrically connected to the 2bth electrode EL2b of the second serial state SET2, and the other end portion (e.g., a first semiconductor layer) of the second light emitting element LD2 may be electrically connected to the 3ath electrode EL3a of the second serial stage SET2. The second light emitting elements LD2 may be connected in parallel with each other between the 2bth electrode EL2b and the 3ath electrode EL3a of the second serial stage SET2, and may be connected in the same direction (e.g., the forward direction) between the first and second driving power sources VDD and VSS through the 2bth electrode EL2b and the 3ath electrode EL3a. In some embodiments, at least one reverse light emitting element (see LDr shown in FIG. 6D) may be further connected between the 2bth electrode EL2b and the 3ath electrode EL3a. The reverse light emitting element LDr may be connected in parallel together with the second light emitting elements LD2 constituting effective light sources between the 2bth electrode EL2b and the 3ath electrode EL3a, and may be connected in a direction opposite to that of the second light emitting elements LD2 between the 2bth electrode EL2b and the 3ath electrode EL3a.

In one or more embodiments of the present disclosure, the 2ath electrode EL2a of the first serial stage SET1 and the 2bth electrode EL2b of the second serial stage SET2 may be integrally provided to be connected to each other. For example, the 2ath electrode EL2a of the first serial stage SET1 and the 2bth electrode EL2b of the second serial stage SET2 may constitute a second electrode EL2 which electrically connects the first serial stage SET1 and the second serial stage SET2. As described above, when the 2ath electrode EL2a of the first serial stage SET1 and the 2bth electrode EL2b of the second serial stage SET2 are integrally provided, the 2ath electrode EL2a and the 2bth electrode EL2b may be different areas of the second electrode EL2.

The third serial stage SET3 may include a 3bth electrode EL3b and a fourth electrode EL4 from among the electrodes EL1 and EL2a, EL2b and EL3a, and EL3b and EL4 constituting the electrode pairs included in the light emitting unit EMU, and may include at least one third light emitting element LD3 connected between the 3bth electrode EL3b and the fourth electrode EL4. For example, the third serial stage SET3 may include a 3bth electrode EL3b connected to the first driving power source VDD via the pixel circuit 144 and previous serial stages, e.g., first and second serial stages SET1 and SET2, a fourth electrode EL4 connected to the second driving power source VSS, and a plurality of third light emitting elements LD3 connected in parallel with each other between the 3bth electrode EL3b and the fourth electrode EL4. One end portion (e.g., a second semiconductor layer) of each of the third light emitting elements LD3 may be electrically connected to 3bth electrode EL3b of the third serial state SET3, and the other end portion (e.g., a first semiconductor layer) of the third light emitting element LD3 may be electrically connected to the fourth electrode EL4 of the third serial stage SET3. The third light emitting elements LD3 may be connected in parallel with each other between the 3bth electrode EL3b and the fourth electrode EL4 of the third serial stage SET3, and may be connected in the same direction (e.g., the forward direction) between the first and second driving power sources VDD and VSS through the 3bth electrode EL3b and the fourth electrode EL4. In some embodiments, at least one reverse light emitting element (see LDr shown in FIG. 6D) may be further connected between the 3bth electrode EL3b and the fourth electrode EL4. The reverse light emitting element LDr is connected in parallel together with the third light emitting elements LD3 constituting effective light sources between the 3bth electrode EL3b and the fourth electrode EL4, and may be connected in a direction opposite to that of the third light emitting elements LD3 between the 3bth electrode EL3b and the fourth electrode EL4.

In one or more embodiments of the present disclosure, the 3ath electrode EL3a of the second serial stage SET2 and the 3bth electrode EL3b of the third serial stage SET3 may be integrally provided to be connected to each other. For example, the 3ath electrode EL3a of the second serial stage SET2 and the 3bth electrode EL3b of the third serial stage SET3 may constitute a third electrode CE3 which electrically connects the second serial stage SET2 and the third serial stage SET3. As described above, when the 3ath electrode EL3a of the second serial stage SET2 and the 3bth electrode EL3b of the third serial stage SET3 are integrally provided, the 3ath electrode EL3a and the 3bth electrode EL3b may be different areas of the third electrode EL3.

In the above-described embodiment, the first electrode EL1 of the first serial stage SET1 may be an anode electrode of a light emitting unit EMU of each pixel PXL, and the second electrode EL2 of the third serial stage SET3 may be a cathode electrode of the light emitting unit EMU.

As described above, the light emitting unit EMU of the pixel PXL, which includes the light emitting elements LD connected in a serial/parallel mixed structure, may control driving current/voltage conditions suitable for specifications of a product to which the light emitting unit EMU is applied.

For example, the light emitting unit EMU of the pixel PXL, which includes the light emitting elements LD connected in the serial/parallel mixed structure, may decrease a driving current, as compared with the light emitting unit EMU including the light emitting elements LD connected in parallel. In one or more embodiments, the light emitting unit EMU of the pixel PXL, which includes the light emitting elements LD connected in the serial/parallel mixed structure, may decrease a driving voltage applied to both ends of the light emitting unit EMU, as compared with the light emitting unit EMU including the light emitting elements LD all connected in series (e.g., as shown in FIG. 7A). In one or more embodiments, when all the light emitting elements LD are connected in series and when at least one of the light emitting elements LD connected in series is not completely connected in the forward direction (or when the reverse light emitting element LDr is included), a path through which the driving current flows may be blocked in the pixel PXL, which may cause a dark spot defect. On the other hand, when the light emitting elements LD are connected in the serial/parallel mixed structure (as shown in FIG. 7B), a driving current can flow through another light emitting element LD of each serial stage (e.g., first to third serial states SET1-SET3), even when some of the light emitting elements LD are not connected in the forward direction in the corresponding serial stage (or when the reverse light emitting element LDr is included) or when a defect occurs in some of the light emitting elements LD. Accordingly, a defect (e.g., a dark spot defect) of the pixels PXL can be prevented or minimized.

Figure 8:
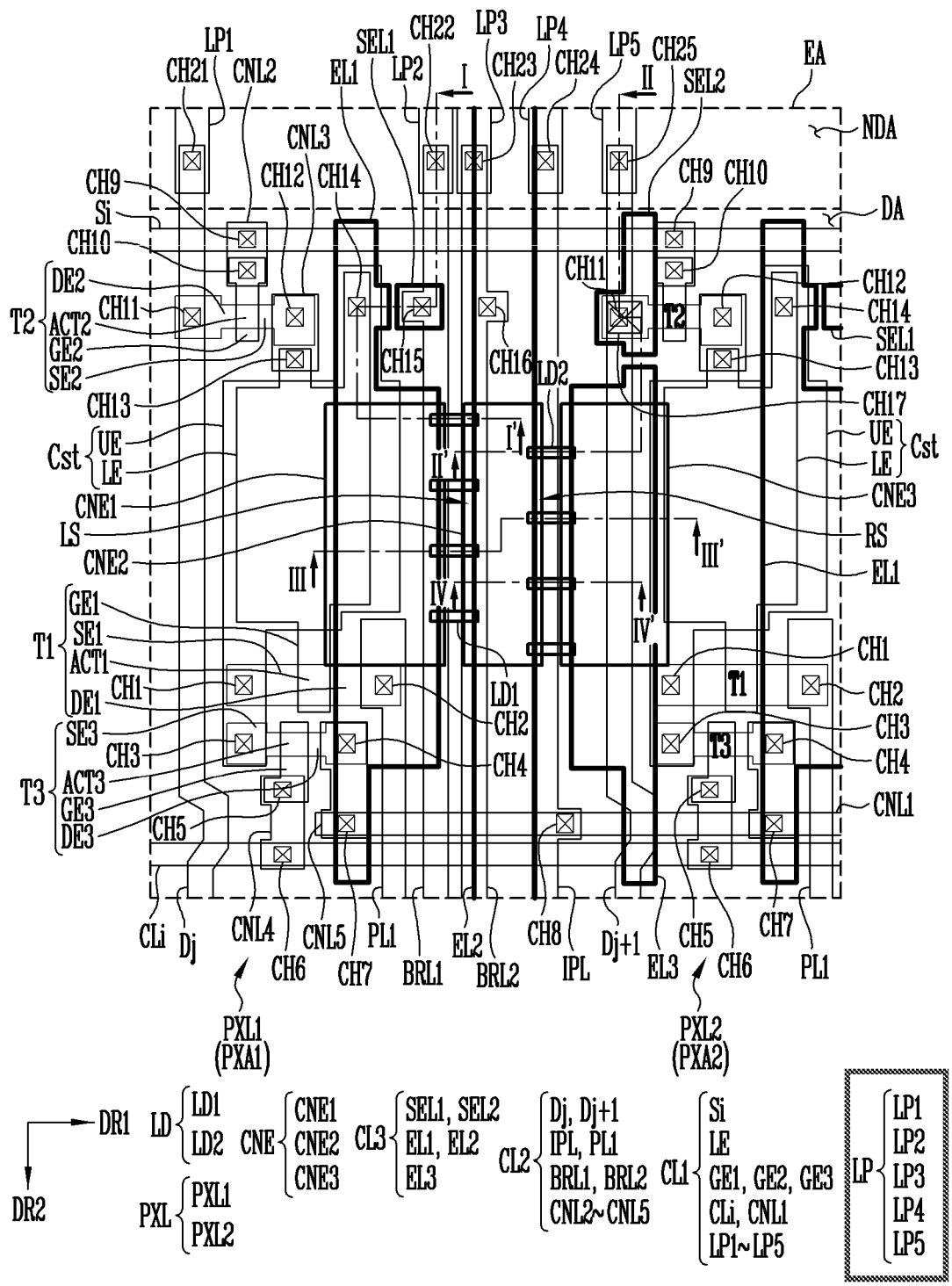
FIG. 8 is an enlarged plan view of area EA shown in FIG. 5.
Figure 9:
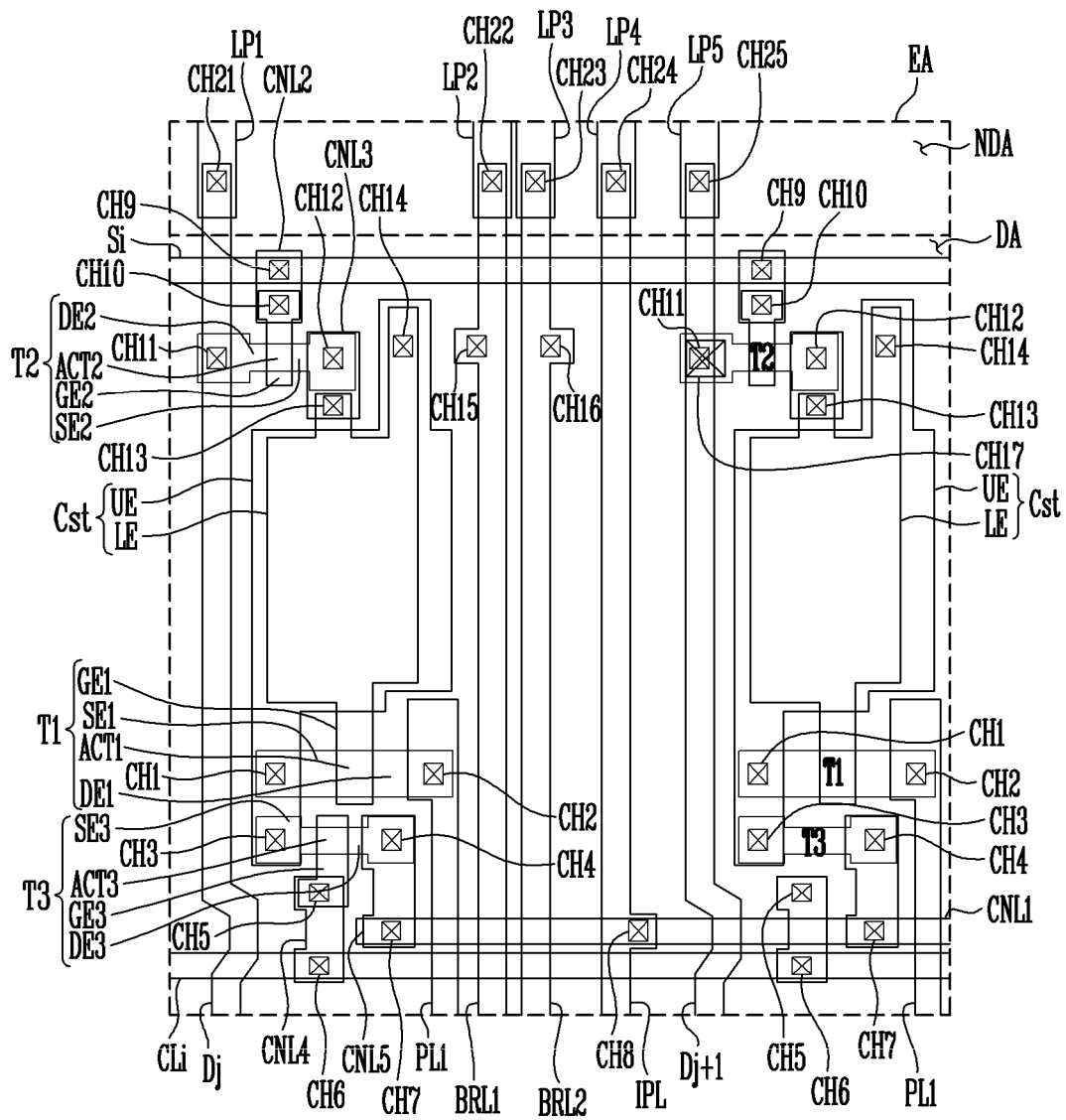
FIG. 9 is a plan view schematically illustrating an example of a pixel circuit layer included in the display device shown in FIG. 8.
Figure 10:
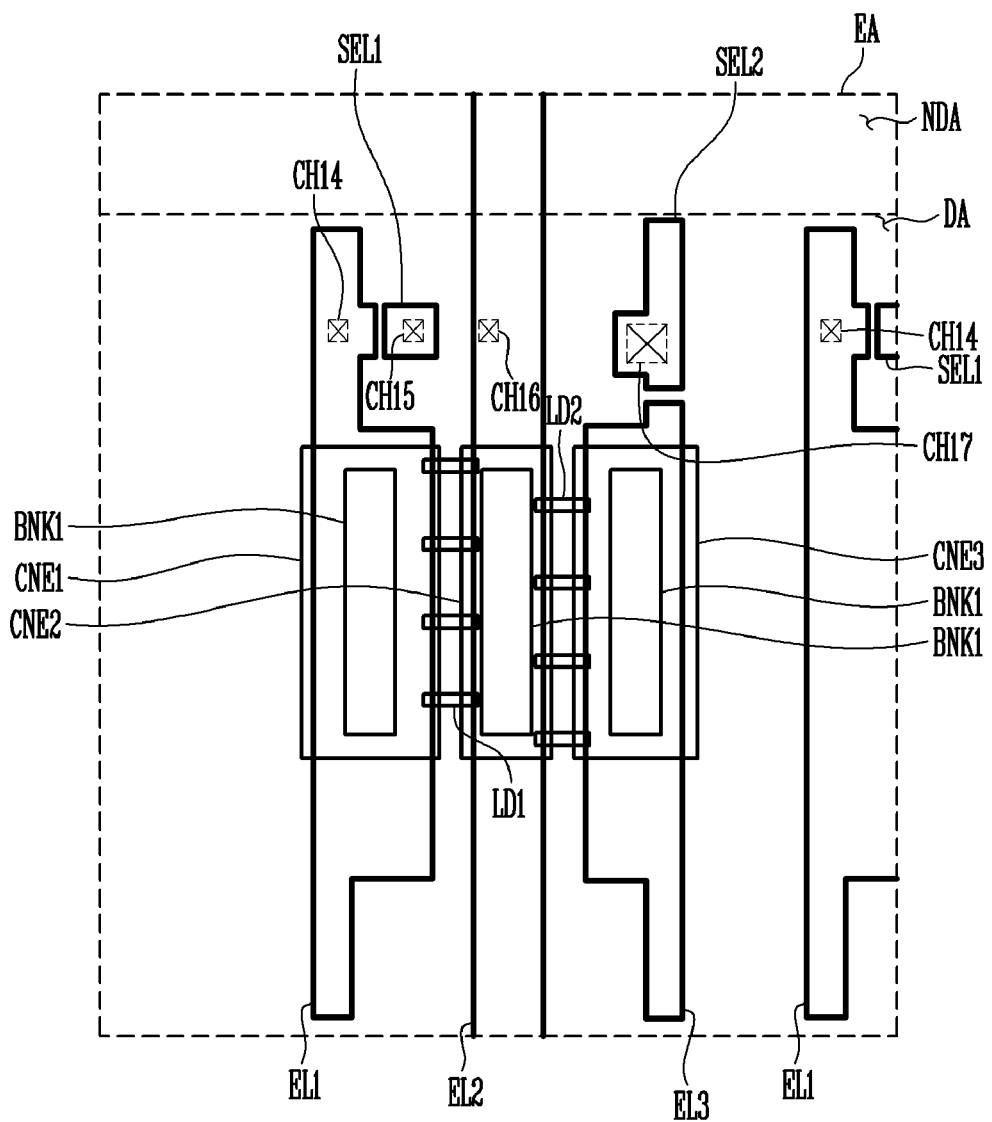
FIG. 10 is a plan view schematically illustrating an example of a display element layer included in the display device shown in FIG. 8.
Figure 11:
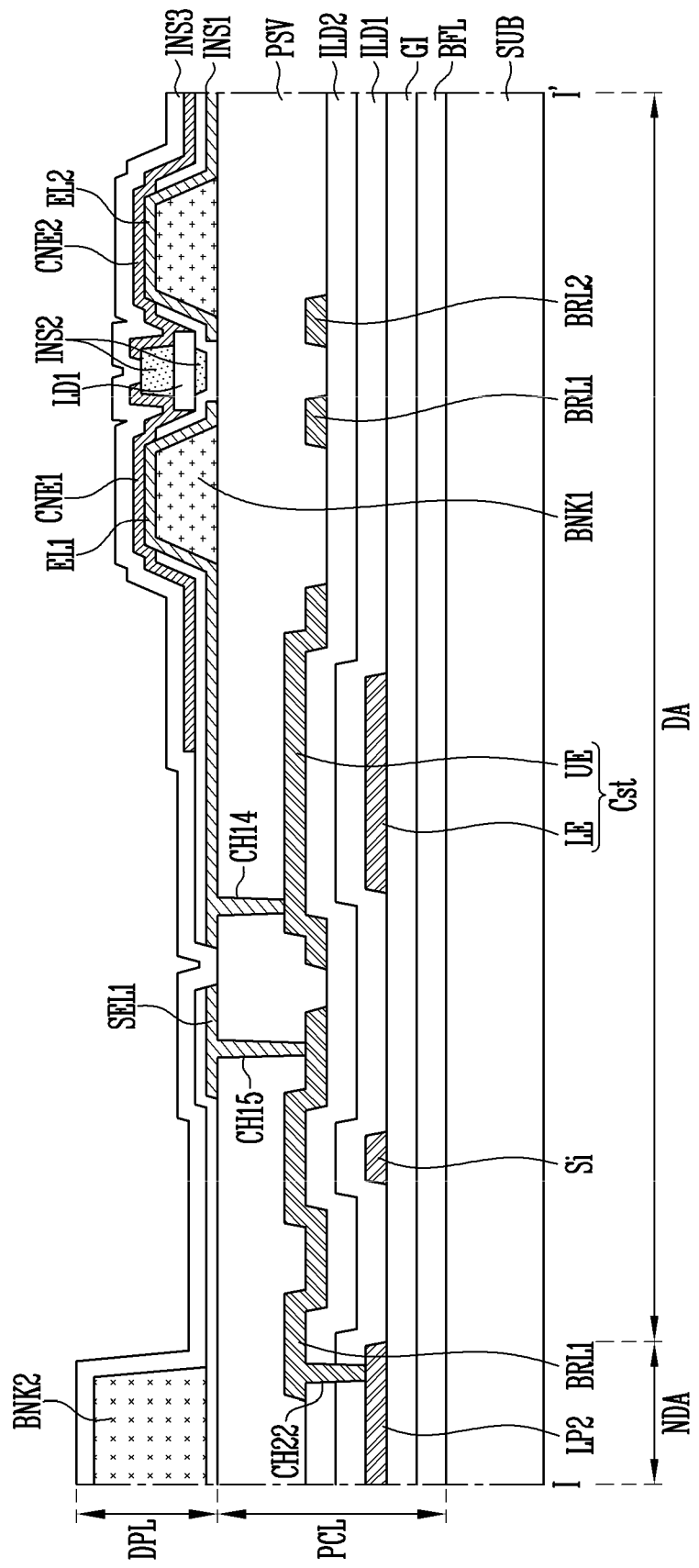
FIG. 11 is a sectional view taken along the line I-I' shown in FIG. 8.
Figure 12:
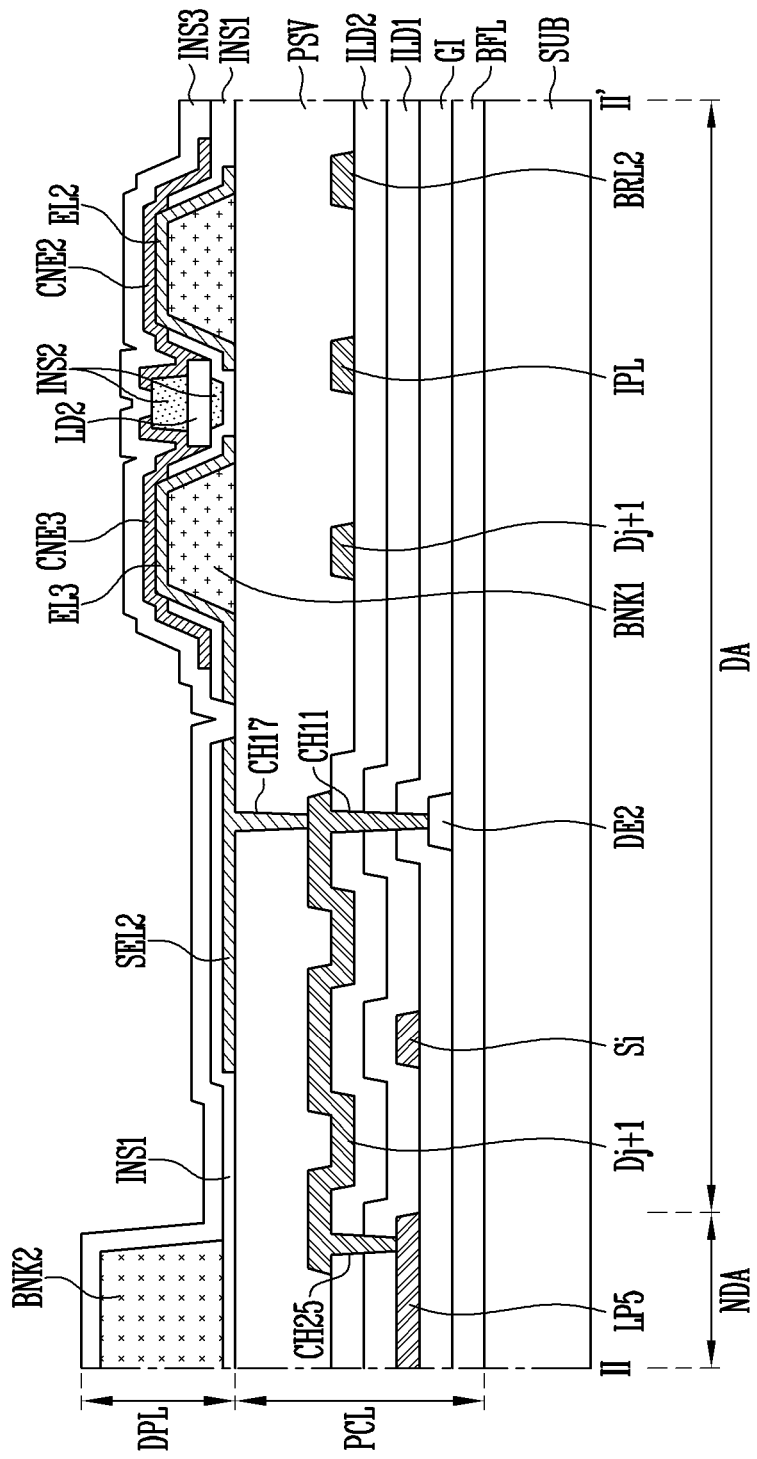
FIG. 12 is a sectional view taken along the line II-II' shown in FIG. 8.
Figure 13:
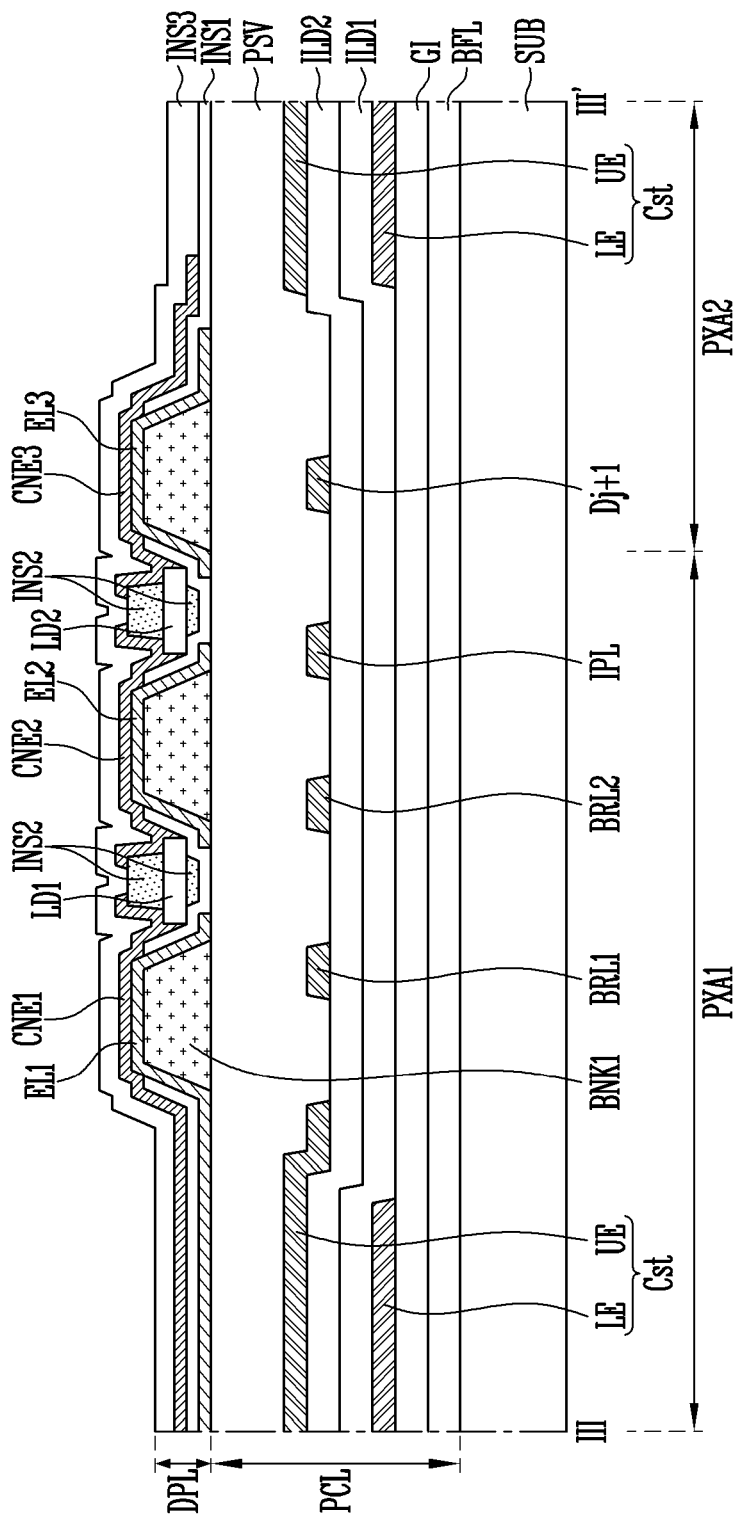
FIG. 13 is a sectional view taken along the line III-III' shown in FIG. 8.
Figure 14A:
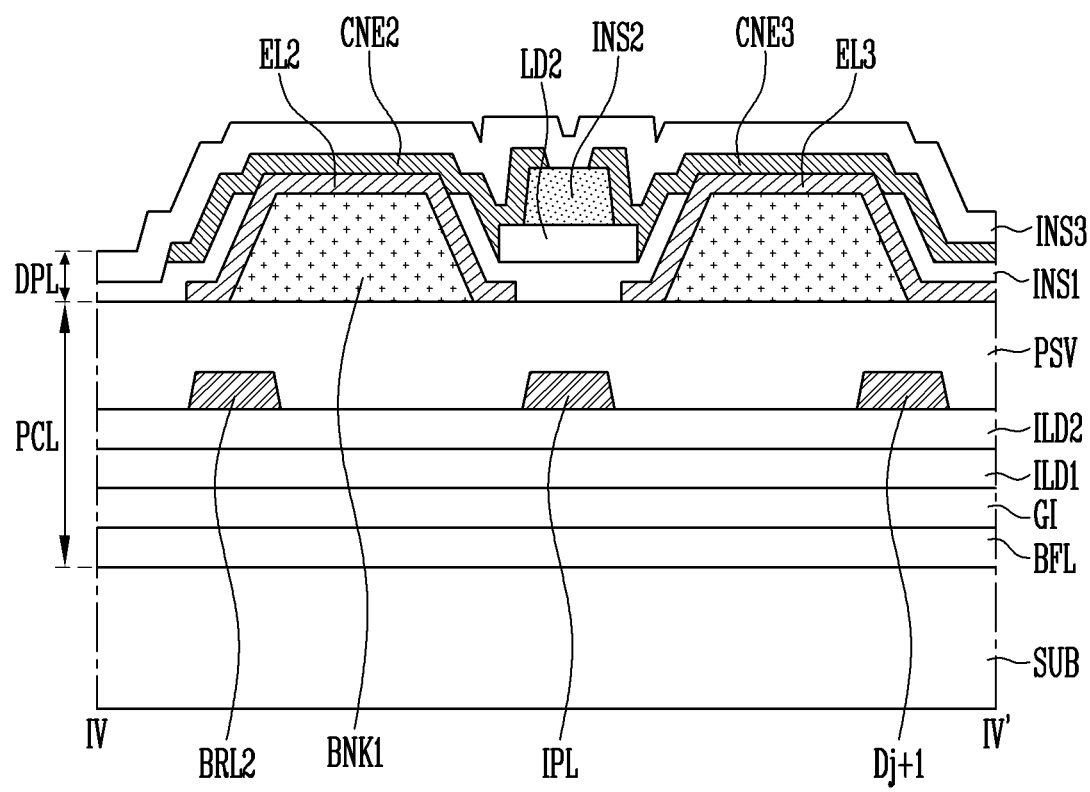
FIGS. 14A and 14B are sectional views taken along the line IV-IV' shown in FIG. 8.
Figure 14B:
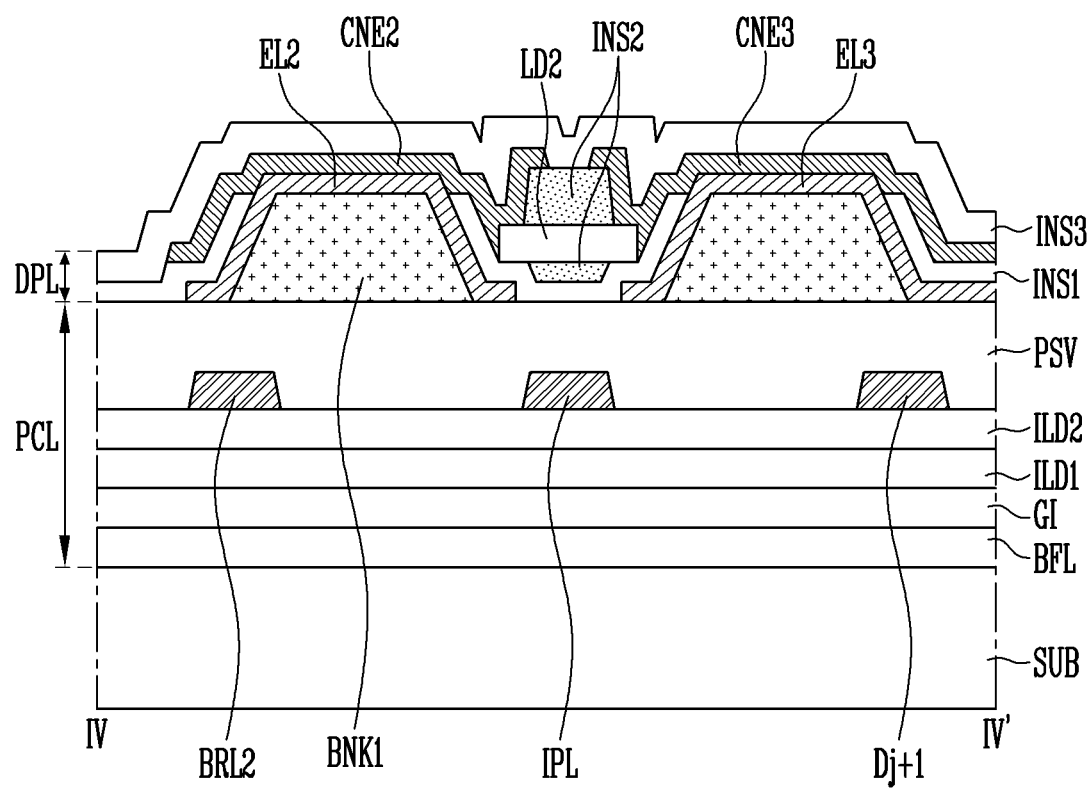
Figure 15:
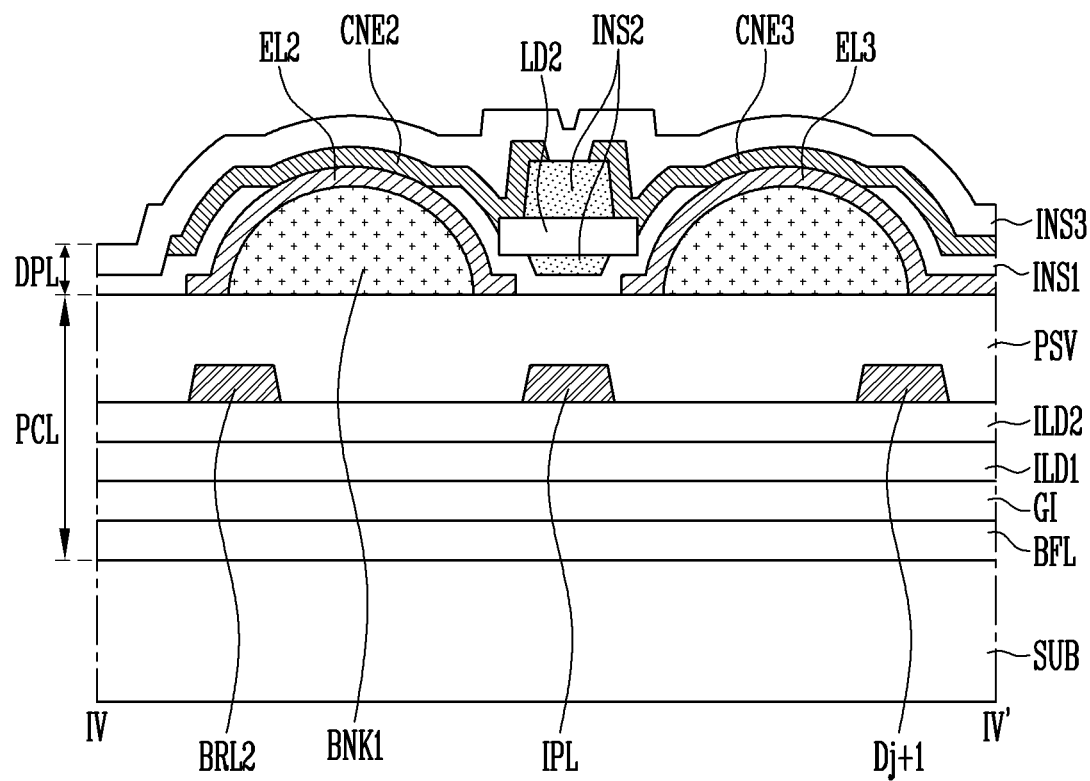
FIG. 15 illustrates another embodiment of a first bank pattern shown in FIG. 14B, and is a sectional view corresponding to the line IV-IV' shown in FIG. 8.
Figure 16:
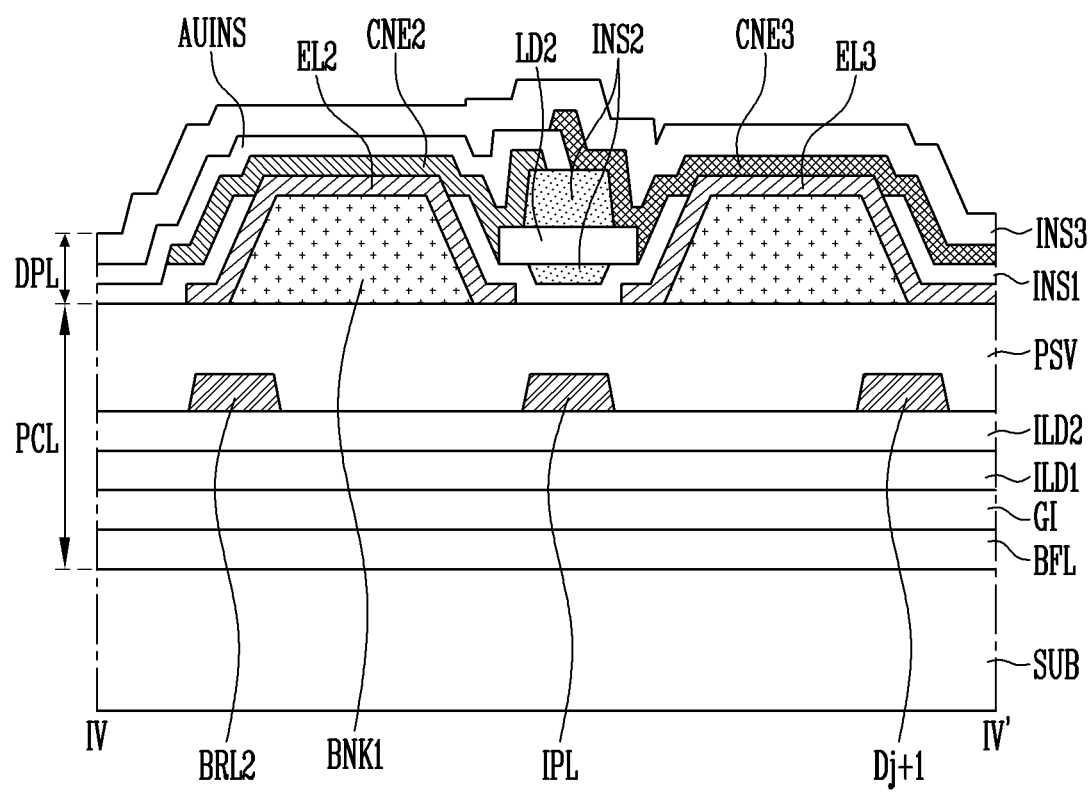
FIG. 16 illustrates another embodiment of the display element layer shown in FIG. 14B, and is a sectional view corresponding to the line IV-IV' shown in FIG. 8.
Figure 17A:
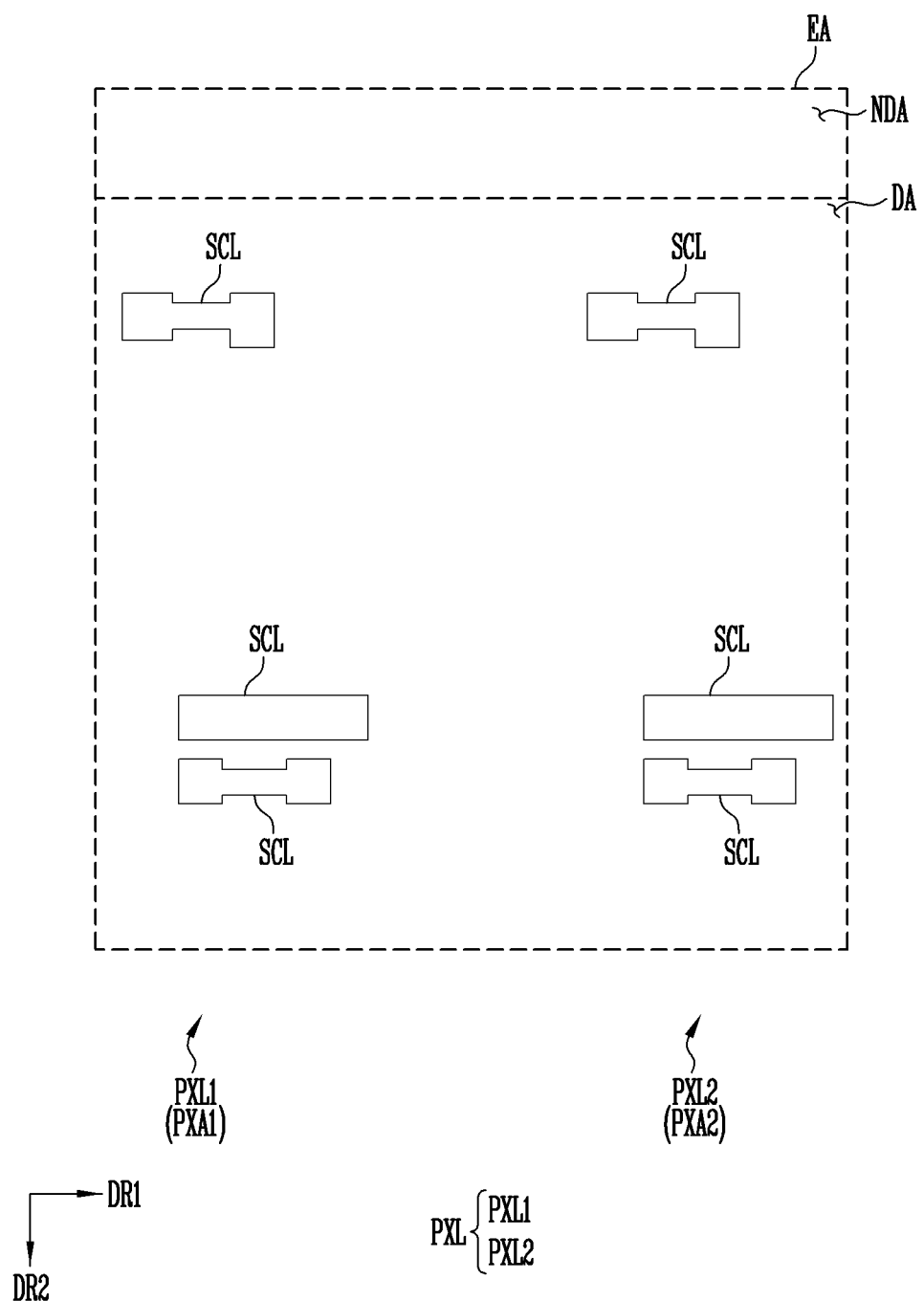
FIGS. 17A-17H are schematic plan views sequentially illustrating a method of fabricating the display device shown in FIG. 8.
Figure 17B:
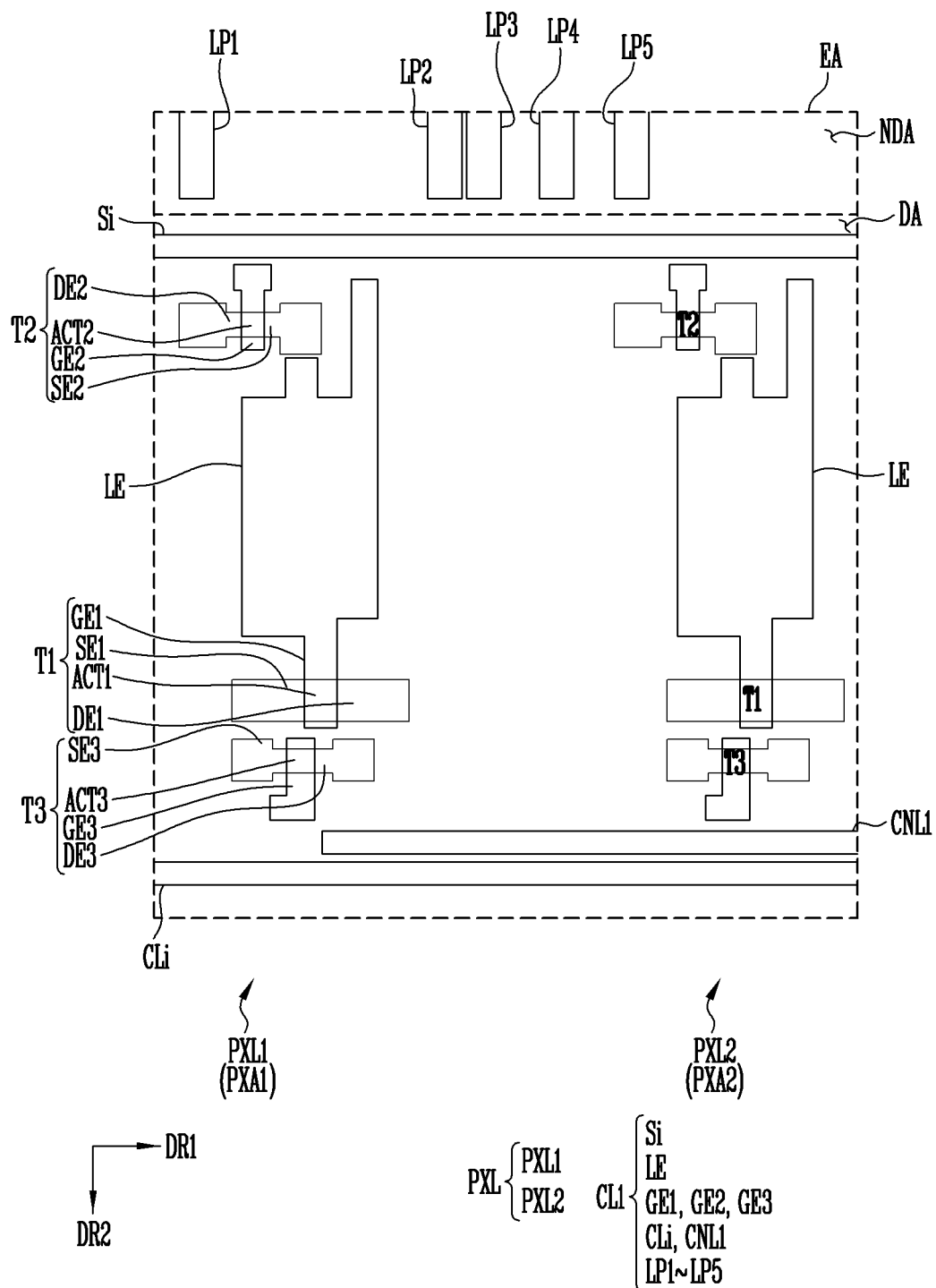
Figure 17C:
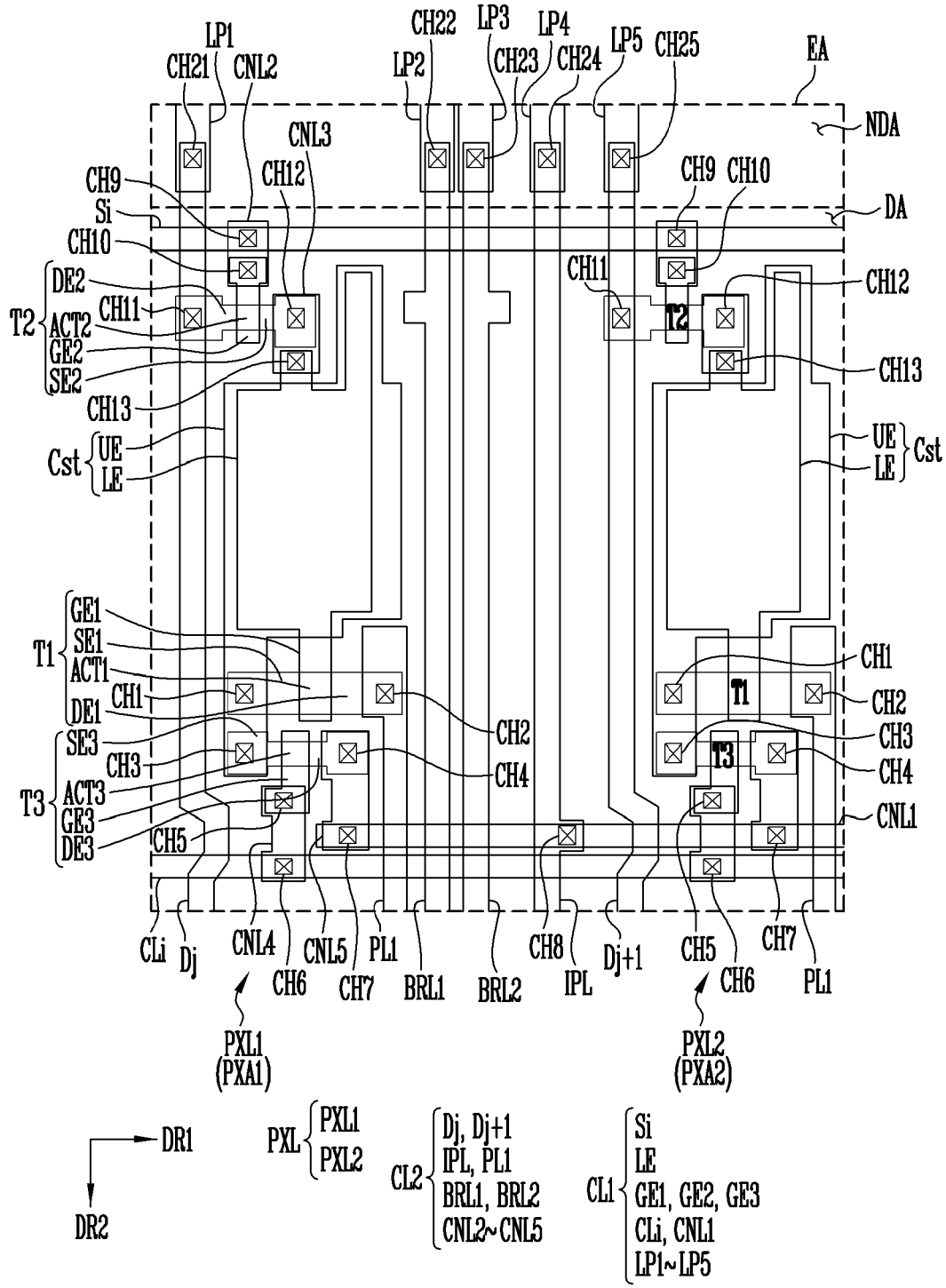
Figure 17D:
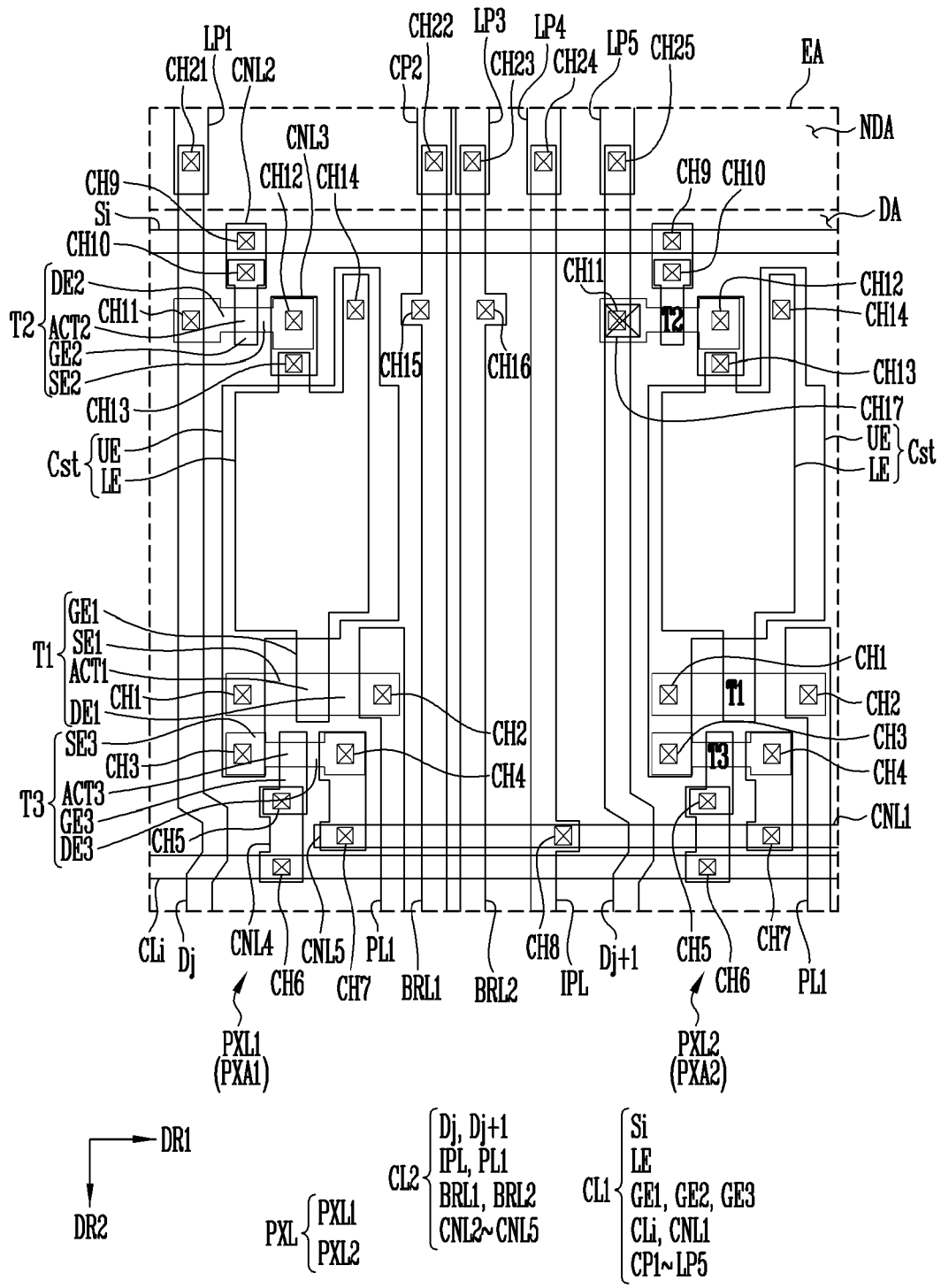
Figure 17E:
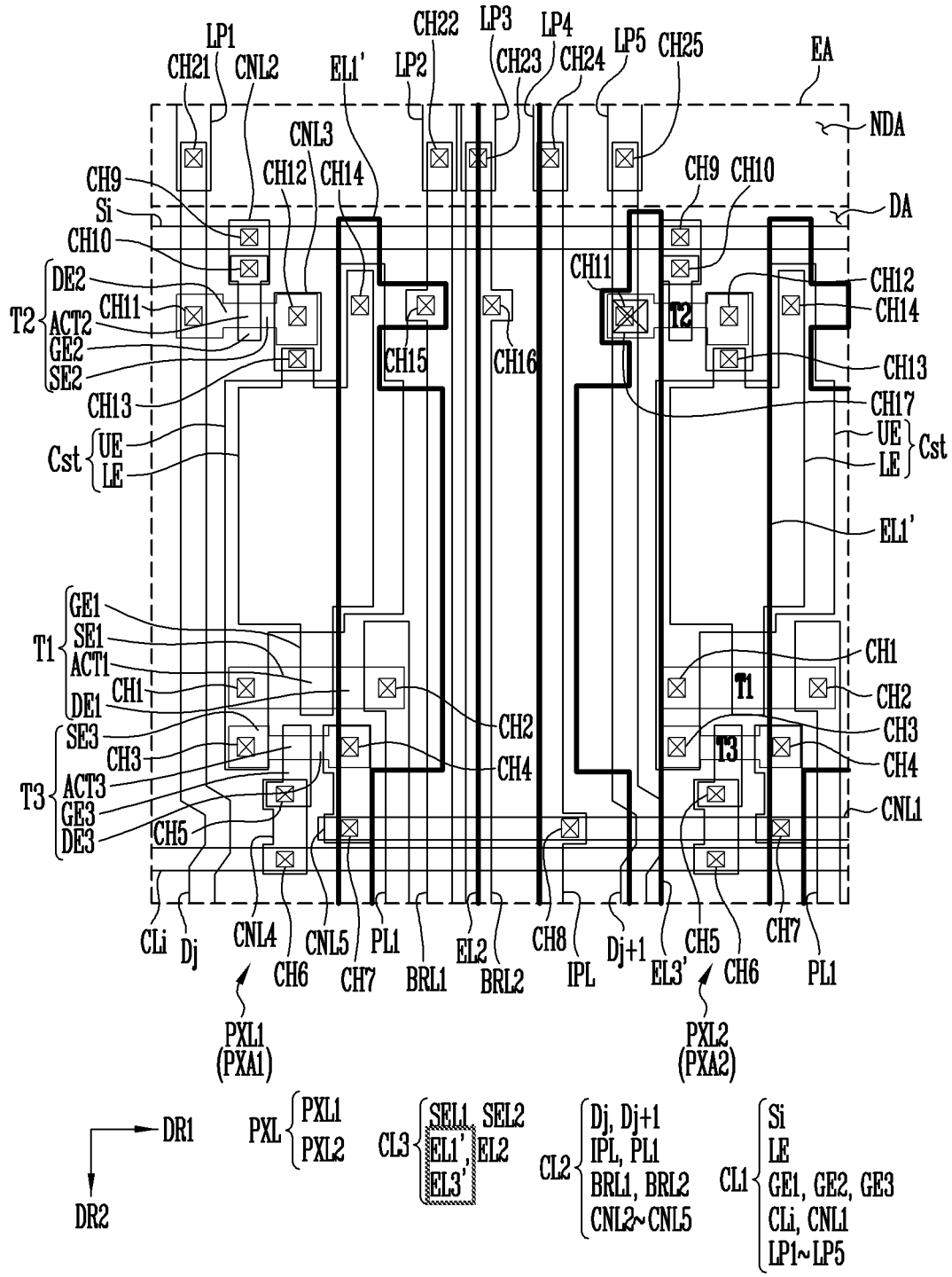
Figure 17F:
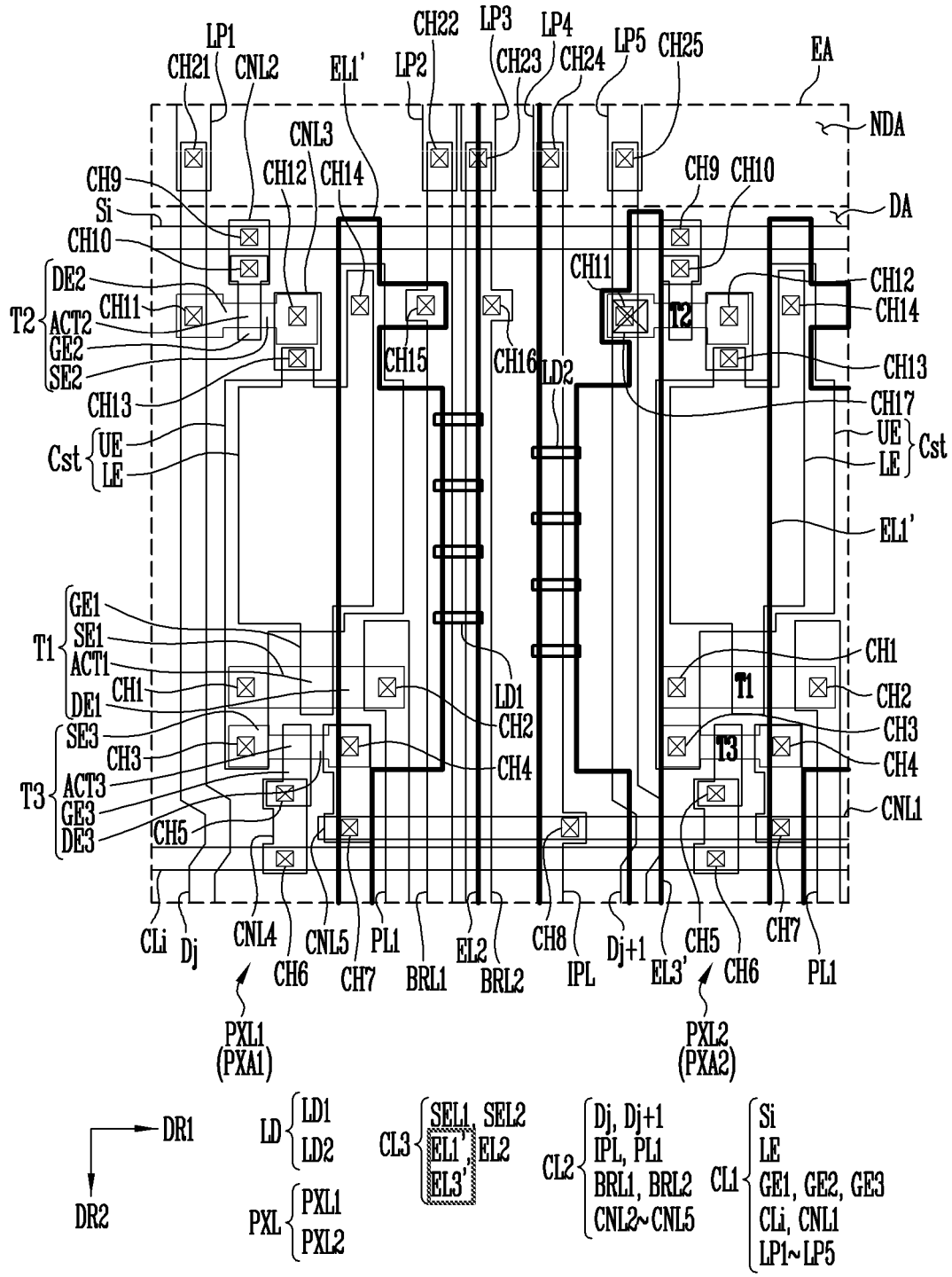
Figure 17G:
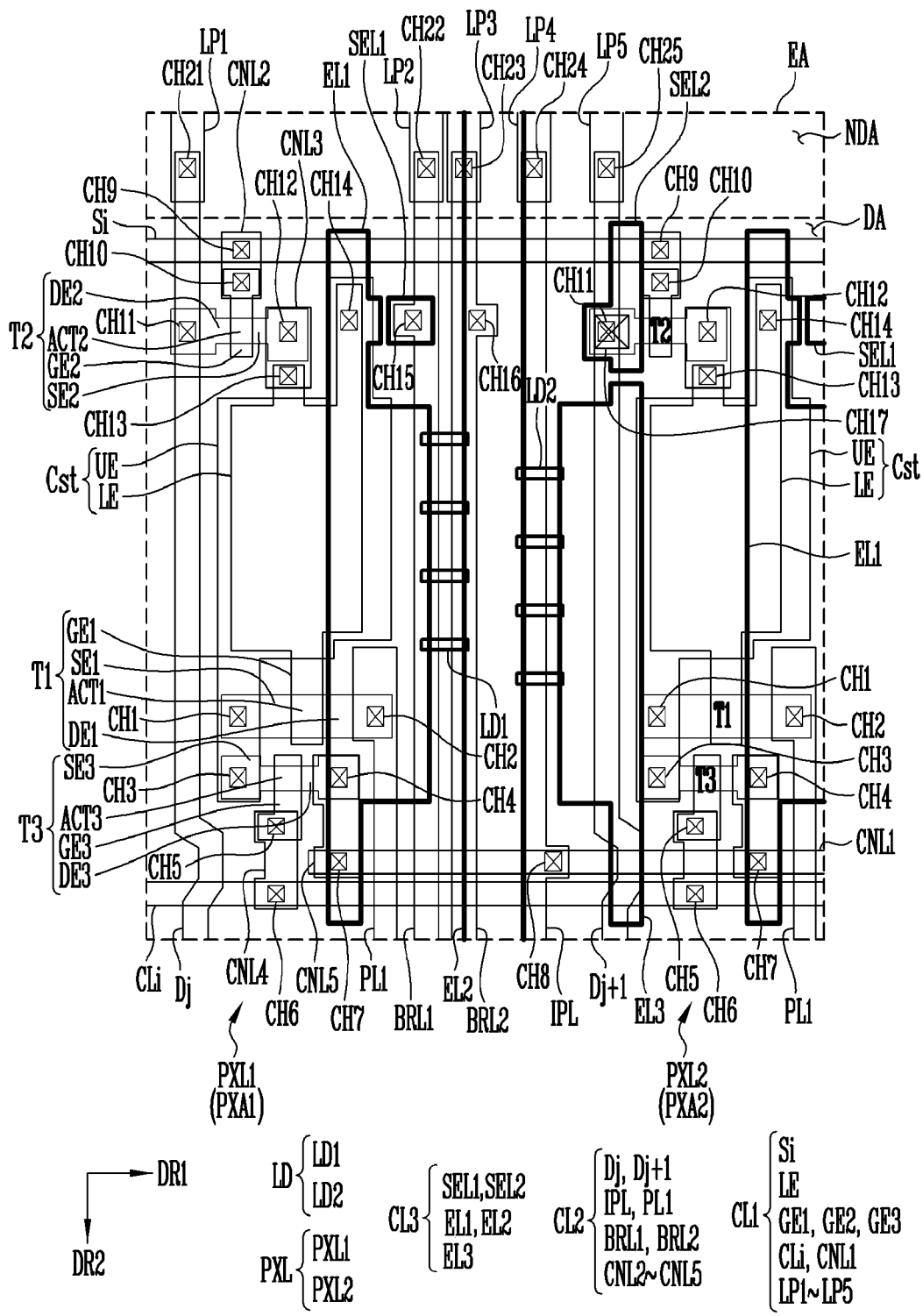
Figure 17H:
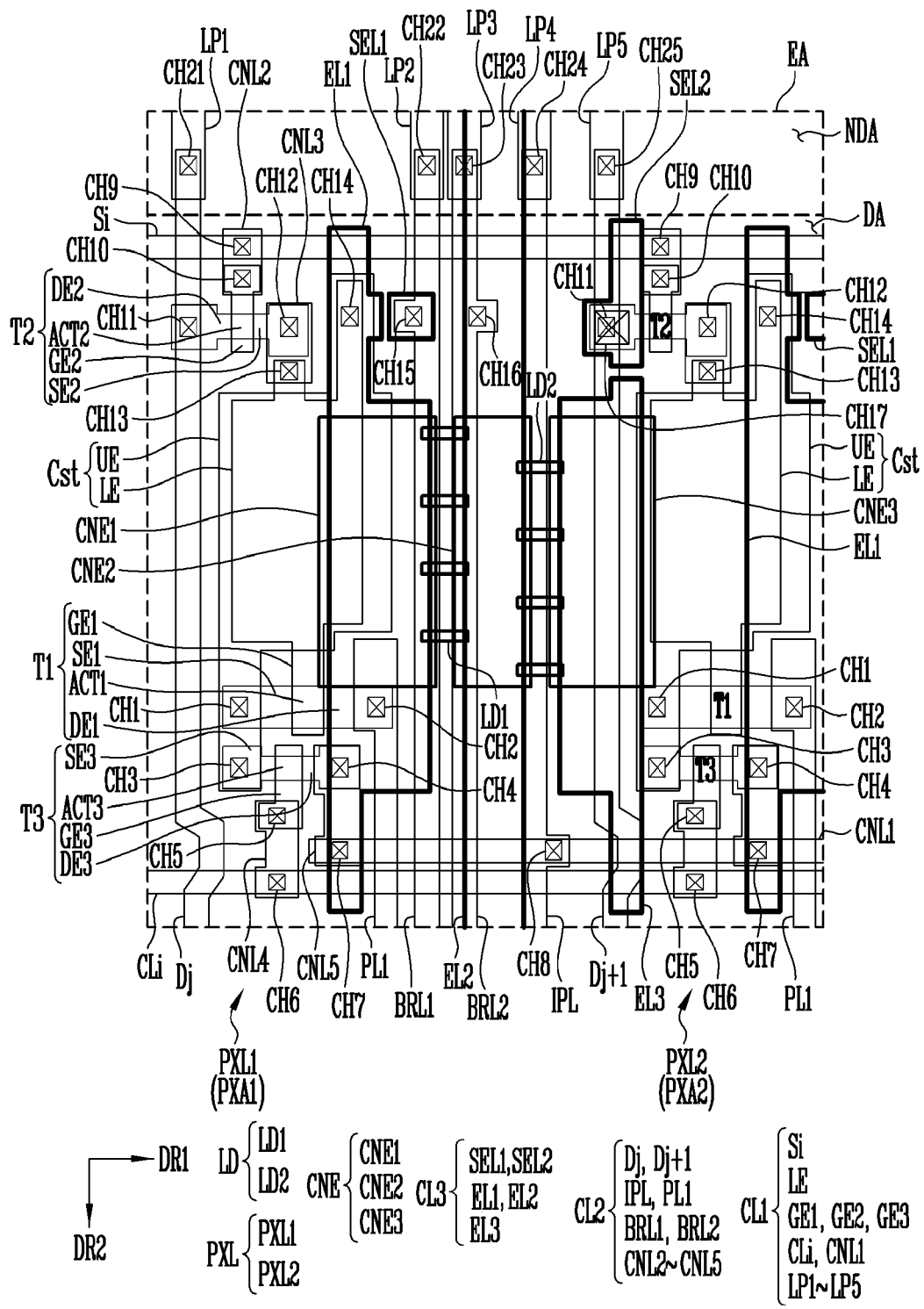

FIG. 8 is an enlarged plan view of area EA shown in FIG. 5. FIG. 9 is a plan view schematically illustrating an example of a pixel circuit layer included in the display device shown in FIG. 8. FIG. 10 is a plan view schematically illustrating an example of a display element layer included in the display device shown in FIG. 8. FIG. 11 is a sectional view taken along the line I-I' shown in FIG. 8. FIG. 12 is a sectional view taken along the line II-II' shown in FIG. 8. FIG. 13 is a sectional view taken along the line III-III' shown in FIG. 8. FIGS. 14A and 14B are sectional views taken along the line IV-IV' shown in FIG. 8. FIG. 15 illustrates another embodiment of a first bank pattern shown in FIG. 14B, and is a sectional view corresponding to the line IV-IV' shown in FIG. 8. FIG. 16 illustrates another embodiment of the display element layer shown in FIG. 14B, and is a sectional view corresponding to the line IV-IV' shown in FIG. 8.

Each of first and second pixels shown in FIG. 8 may be any one of the pixels respectively shown in FIGS. 6A-6E, 7A, and 7C. For example, each of the first and second pixels shown in FIG. 8 may be the pixel shown in FIG. 6E.

For convenience of description, based on two pixels PXL1 and PXL2 disposed in the crossing areas of a jth pixel column, a (j+1)th pixel column, and an ith pixel row in the area EA, a scan line Si, a control line CLi, data lines Dj and Dj+1, a power line PL1, and an initialization power line IPL, which are connected to the two pixels PXL1 and PXL2, are illustrated in FIG. 8. The ith pixel row may be a first pixel row.

In FIG. 8, for convenience of description, from among the lines provided to the two pixels PXL1 and PXL2, a data line on a jth column from among the data lines Dj and Dj+1 to which a data signal is applied may be referred to as a "jth data line Dj," a data line on a (j+1)th column from among the data lines Dj and Dj+1 may be referred to as a "(j+1)th data line Dj+1," a scan line on a first row may be referred to as a "scan line Si," a control line on the first row may be referred to as a "control line CLi," and a power line to which the first driving power source VDD is applied may be referred to as a "first power line PL1."

In FIGS. 8-16, the structure of the one pixel PXL is simplified and illustrated, such as a case where each electrode is illustrated as a single electrode layer and a case where each insulating layer is illustrated as a single insulating layer. However, the present disclosure is not limited thereto.

In one or more embodiments of the present disclosure, the term "being formed and/or provided in the same layer" may mean being formed in the same process, and the term "being formed and/or provided in different layers" may mean being formed in different processes.

Referring to FIGS. 1A-5, 6E, and 8-16, the display device in accordance with the embodiments of the present disclosure may include a substrate SUB, a line part LP, and a plurality of pixels PXL.

The substrate SUB may include a transparent insulating material to enable light to be transmitted therethrough. The substrate SUB may be a rigid substrate or a flexible substrate.

The rigid substrate may include, for example, one of a glass substrate, a quartz substrate, a glass ceramic substrate, and a crystalline glass substrate. The flexible substrate may be one of a film substrate and a plastic substrate, which include a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

However, the material constituting the substrate SUB may be variously changed, and may include a Fiber Reinforced Plastic (FRP), etc. The material applied to the substrate SUB may have resistance (or heat resistance) against high processing temperature in a fabricating process of the display device.

The substrate SUB may include a display area DA including at least one pixel area PXA1 and PXA2 in which the pixel PXL is disposed and a non-display area NDA disposed along the periphery of the display area DA.

The line part LP which connects each pixel PXL and the driver D-IC may be located in the non-display area NDA. The line part LP may include a plurality of lines. Each of the lines included in the line part LP may be connected to signal lines connected to each pixel PXL. The signal lines may include data lines Dj and Dj+1 to which a data signal is applied, a scan line Si to which a scan signal is applied, a control line CLi to which a control signal is applied, an initialization power line IPL to which the initialization power source voltage Vint is applied, a first power line PL1 to which the voltage of the first driving power source VDD is applied, and the like.

A buffer layer BFL, a pixel circuit layer PCL, and a display element layer DPL may be provided and/or formed on the substrate SUB.

The pixel circuit layer PCL may include a plurality insulating layers and a plurality of conductive layers. In one or more embodiments of the present disclosure, the insulating layers may include, for example, the buffer layer BFL, a gate insulating layer GI, first and second interlayer insulating layers ILD1 and ILD2, and a passivation layer PSV, which are sequentially stacked on the substrate SUB. The conductive layers may be provided and/or formed between the insulating layers. The conductive layers may include, for example, a first conductive layer CL1 provided on the gate insulating layer GI and a second conductive layer CL2 provided on the second interlayer insulating layer ILD2.

The pixels PXL may be arranged in a matrix form and/or a stripe form along a plurality of pixel rows extending in a first direction DR1 and a plurality of pixel columns extending in a second direction DR2 crossing the first direction DR1 in the display area DA, but the present disclosure is not limited thereto. In some embodiments, the pixels PXL may be provided in various arrangement forms in the display area DA of the substrate SUB.

The pixels PXL may include a first pixel PXL1 and a second pixel PXL2. In the following embodiment, when at least one of the first pixel PXL1 and the second pixel PXL2 is arbitrarily designated or when the first and second pixels PXL1 and PXL2 are inclusively designated, the pixel or the pixels are referred to as a "pixel PXL" or "pixels PXL."

The first pixel PXL1 may be a pixel disposed in a crossing area of the first pixel row and the jth pixel column, and the second pixel PXL2 may be a pixel disposed in a crossing area of the first pixel row and the (j+1)th pixel column. Each of the first and second pixels PXL1 and PXL2 may be a red pixel, a green pixel, or a blue pixel, but the present disclosure is not limited thereto. In one or more embodiments of the present disclosure, the first and second pixels PXL1 and PXL2 may be pixels PXL which are located in the display area DA and are disposed adjacent (e.g., most adjacent or closest) to the non-display area NDA. The first and second pixels PXL1 and PXL2 may be first pixels PXL connected to the line part LP disposed in the non-display area NDA along a column direction, e.g., the second direction DR2.

In the display area DA of the substrate SUB, the area in which the first pixel PXL1 is disposed may be a first pixel area PXA1, and the area in which the second pixel PXL2 is disposed may be a second pixel area PXA2.

The first pixel PXL may be electrically connected to each of a scan line Si, a control line CLi, a jth data line Dj, and a first power line PL1, which are located in the first pixel area PXA1. The second pixel PXL2 may be electrically connected to each of the scan line Si, the control line CLi, a (j+1)th data line Dj+1, and a first power line PL1, which are located in the second pixel area PXA2. Each of the first and second pixels PXL1 and PXL2 may be electrically connected to an initialization power line IPL. The initialization power line IPL may be the same component as the sensing line SEN described with reference to FIG. 6E.

The scan line Si may extend in the first direction DR1 on the substrate SUB, and may be commonly provided to the first and second pixels PXL1 and PXL2. A scan signal may be applied to the scan line Si. In one or more embodiments of the present disclosure, the scan line Si may be one conductive layer from among the conductive layers included in the pixel circuit layer PCL. For example, the scan line Si may correspond to the first conductive layer CL1 provided and/or formed on the gate insulating layer GI (as shown in FIG. 11).

The first conductive layer CL1 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu). The first conductive layer CL1 may have a single- or multi-layered structure.

The gate insulating layer GI may be an inorganic insulating layer including an inorganic material. For example, the gate insulating layer GI may include at least one of silicon oxide (SiOx), silicon nitride (SiNx), silicon oxynitride (SiON), and metal oxide such as aluminum oxide (AlOx). The gate insulating layer GI may be provided in a single layer, but be provided in a multi-layer including at least two layers. When the gate insulating layer GI is provided in the multi-layer, the layers may be formed of the same material or may be formed of different materials. However, the present disclosure is not limited thereto. In some embodiments, the gate insulating layer GI may be an organic insulating layer including an organic material.

The control line CLi may extend in the same direction as the scan line Si, and may be commonly provided to the first and second pixels PXL1 and PXL2. A control signal having a gate-on voltage (e.g., a high level) may be applied to the control line CLi during a sensing period (e.g., a set or predetermined sensing period). In one or more embodiments of the present disclosure, the control line CLi may correspond to the first conductive layer CL1 provided and/or formed on the gate insulating layer GI.

The jth data line Dj and the (j+1)th data line Dj+1 may extend in the second direction DR2 crossing the first direction DR1. A corresponding data signal may be applied to each of the jth data line Dj and the (j+1)th data line Dj+1. In one or more embodiments of the present disclosure, the jth data line Dj and the (j+1)th data line Dj+1 may be one conductive layer from among the conductive layers included in the pixel circuit layer PCL (e.g., as shown in FIG. 12). For example, the jth data line Dj and the (j+1)th data line Dj+1 may correspond to the second conductive layer CL2 provided on the second interlayer insulating layer ILD2.

Similar to the first conductive layer CL1, the second conductive layer CL2 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu). The second conductive layer CL2 may have a single or multi-layered structure.

Each of the first and second interlayer insulating layers ILD1 and ILD2 may be an inorganic insulating layer including an inorganic material. For example, the first and second interlayer insulating layers ILD1 and ILD2 may include at least one of silicon oxide (SiOx), silicon nitride (SiNx), silicon oxynitride (SiON), and metal oxide such as aluminum oxide (AlOx). Each of the first and second interlayer insulating layers ILD1 and ILD2 may be provided in a single layer or a multi-layer. In some embodiments, one of the first and second interlayer insulating layers ILD1 and ILD2 may be an inorganic insulating layer including an inorganic material, and the other one of the first and second interlayer insulating layers ILD1 and ILD2 may be an organic insulating layer including an organic material.

The jth data line Dj may be connected to a first line LP1 included in the line part LP. The first line LP1 may be provided and/or formed on the gate insulating layer GI of the non-display area NDA. In one or more embodiments of the present disclosure, the first line LP1 may correspond to the first conductive layer CL1 provided on the gate insulating layer GI. The jth data line Dj may be connected to the first line LP1 through a twenty-first contact hole CH21 sequentially penetrating the first and second interlayer insulating layers ILD1 and ILD2.

The (j+1)th data line Dj+1 may be connected to a fifth line LP5 included in the line part LP. The fifth line LP5 may be provided and/or formed on the gate insulating layer GI of the non-display area NDA. Similar to the first line LP1, the fifth line LP5 may correspond to the first conductive layer CL1 provided on the gate insulating layer GI. The (j+1)th data line Dj+1 may be connected to the fifth line LP5 through a twenty-fifth contact hole CH25 sequentially penetrating the first and second interlayer insulating layers ILD1 and ILD2 (e.g., as shown in FIG. 12).

The first power line PL1 may extend in the same direction as a corresponding one of the data lines Dj and Dj+1 in each of the first pixel area PXA1 and the second pixel area PXA2. The first power line PL1 may be a component provided in the same layer as the corresponding one of the data lines Dj and Dj+1. For example, the first power line PL1 may correspond to the second conductive layer CL2 provided on the second interlayer insulating layer ILD2.

The first power line PL1 disposed in the first pixel area PXA1 may be disposed to be spaced from the jth data line Dj, and the first power line PL1 disposed in the second pixel area PXA2 may be disposed to be spaced from the (j+1)th data line Dj+1. The voltage of the first driving power source VDD may be applied to the first power line PL1. The first power line PL1 may be the same as the first power line PL1 described with reference to FIGS. 6A-7B.

Although not directly shown in the drawings, the first power line PL1 may be connected to one line from among the lines included in the line part LP disposed in the non-display area NDA. The one line may be the first conductive line CL1 provided and/or formed in a layer different from that of the first power line PL1.

The initialization power line IPL may extend in the second direction DR2, and may be disposed between the first pixel area PXA1 and the second pixel area PXA2. The initialization power line IPL may be electrically connected to each of the first and second pixels PXL1 and PXL2 through a first connection line CNL1. The voltage of the initialization power source Vint may be applied to the initialization power line IPL. In one or more embodiments of the present disclosure, the initialization power line IPL may correspond to the second conductive layer CL2 provided and/or formed on the second interlayer insulating layer ILD2. The initialization power line IPL may be connected to the first connection line CNL1 through an eighth contact hole CH8 sequentially penetrating the first and second interlayer insulating layers ILD1 and ILD2.

The first connection line CNL1 may extend in the first direction DR1, and may be commonly provided to the first and second pixels PXL1 and PXL2. One end of the first connection line CNL1 may be connected to a fifth connection line CNL5 located in the first pixel area PXA1, and the other end of the first connection line CNL1 may be connected to a fifth connection line CNL5 located in the second pixel area PXA2. The fifth connection line CNL5 located in the first pixel area PXA1 may be connected to the first connection line CNL1 through a seventh contact hole CH7 sequentially penetrating the first and second interlayer insulating layers ILD1 and ILD2. The fifth connection line CNL5 located in the second pixel area PXA2 may be connected to the first connection line CNL1 through a seventh contact hole CH7 sequentially penetrating the first and second interlayer insulating layers ILD1 and ILD2.

The initialization power line IPL may be connected to a fourth line LP4 included in the line part LP. The fourth line LP4 may be provided and/or formed on the gate insulating layer GI of the non-display area NDA. Like the first and fifth lines LP1 and LP5, the fourth line LP4 may correspond to the first conductive layer CL1. The initialization power line IPL may be connected to the fourth line PL4 through a twenty-fourth contact hole CH24 sequentially penetrating the first and second interlayer insulating layers ILD1 and ILD2.

The first and second pixels PXL1 and PXL2 may have structures substantially similar or identical to each other. Hereinafter, for convenience, the first pixel PXL1 in the first and second pixels PXL1 and PXL2 will be representatively described, and a detailed description of the second pixel PXL2 may not be repeated.

The substrate SUB, the pixel circuit layer PCL, and the display element layer DPL may be disposed in the first pixel area PXA1 in which the first pixel PXL1 is provided.

For convenience, the pixel circuit layer PCL will be first described, and the display element layer DPL will be then described.

The pixel circuit layer PCL may include a buffer layer BFL, a pixel circuit 144 provided on the buffer layer BFL, and a passivation layer PSV provided over the pixel circuit 144.

The buffer layer BFL may be disposed on the substrate SUB, and may prevent (or protect from) an impurity, etc. from being diffused into the pixel circuit 144. The buffer layer BFL may be an inorganic insulating layer including an inorganic material. For example, the buffer layer BFL may include at least one of silicon nitride (SiNx), silicon oxide (SiOx), silicon oxynitride (SiON), and metal oxide such as aluminum oxide (AlOx). The buffer layer BFL may be provided in a single layer, or in a multi-layer including at least two layers. When the buffer layer BFL is provided in the multi-layer, the layers may be formed of the same material or may be formed of different materials. The buffer layer BFL may be omitted according to the material and process conditions of the substrate SUB.

The pixel circuit 144 may include first to third transistors T1 to T3 and a storage capacitor Cst, which are provided on the buffer layer BFL.

In one or more embodiments of the present disclosure, the first transistor T1 may be the first transistor T1 of the pixel circuit 144 described with reference to FIGS. 6A-6E, the second transistor T2 may be the second transistor T2 of the pixel circuit 144 described with reference to FIGS. 6A-6E, and the third transistor T3 may be the third transistor T3 of the pixel circuit 144 described with reference to FIGS. 6A-6E.

The first transistor T1 (e.g., the driving transistor) may include a first gate electrode GE1, a first active pattern ACT1, a first source electrode SE1, and a first drain electrode DE1.

The first gate electrode GE1 may be connected to a second source electrode SE2 of the second transistor T2 through a third connection line CNL3. The first gate electrode GE1 may be provided and/or formed on the gate insulating layer GI. In one or more embodiments of the present disclosure, the first gate electrode GE1 may correspond to the first conductive layer CL1 provided on the gate insulating layer GI, and may be provided in the same layer as the scan line Si, and may include the same material as the scan line Si.

The third connection line CNL3 may correspond to the second conductive layer CL2 provided and/or formed on the second interlayer insulating layer ILD2. The third connection line CNL3 may be provided in the same layer as the initialization power line IPL, the jth data line Dj, and the first power line PL1, and may include the same material as the initialization power line IPL, the jth data line Dj, and the first power line PL1.

One end of the third connection line CNL3 may be connected to the first gate electrode GE1 through a thirteenth contact hole CH13 sequentially penetrating the first and second interlayer insulating layers ILD1 and ILD2. The other end of the third connection line CNL3 may be connected to the second source electrode SE2 through a twelfth contact hole CH12 sequentially penetrating the first and second interlayer insulating layers ILD1 and ILD2.

Each of the first active pattern ACT1, the first source electrode SE1, and the first drain electrode DE1 may be a semiconductor pattern made of poly-silicon, amorphous silicon, oxide semiconductor, etc. The first active pattern ACT1, the first source electrode SE1, and the first drain electrode DE1 may be formed of a semiconductor layer undoped or doped with an impurity. For example, the first source electrode SE1 and the first drain electrode DE1 may be formed of a semiconductor layer doped with the impurity, and the first active pattern ACT1 may be formed of a semiconductor layer undoped with the impurity. For example, an n-type impurity may be used as the impurity.

The first active pattern ACT1, the first source electrode SE1, and the first drain electrode DE1 may be provided and/or formed on the buffer layer BFL.

The first active pattern ACT1 is a region overlapping with the first gate electrode GE1, and may be a channel region of the first transistor T1. When the first active pattern ACT1 is formed long, the channel region of the first transistor T1 may be formed long. As such, the driving range of a gate voltage (or gate signal) applied to the first transistor T1 may be widened, and therefore, the grayscale level of light (or beam) emitted from a light emitting element LD can be finely controlled.

The first source electrode SE1 may be connected to (or in contact with) one end of the first active pattern ACT1. Also, the first source electrode SE1 may be connected to a third source electrode SE3 of the third transistor T3 through an upper electrode UE.

The upper electrode UE may be one electrode constituting the storage capacitor Cst. In one or more embodiments of the present disclosure, the upper electrode UE may correspond to the second conductive layer CL2 provided and/or formed on the second interlayer insulating layer ILD2. The upper electrode UE may be connected to the first source electrode SE1 through a first contact hole CH1 sequentially penetrating the first and second interlayer insulating layers ILD1 and ILD2 and the gate insulating layer GI. Also, the upper electrode UE may be connected to the third source electrode SE3 through a third contact hole CH3 sequentially penetrating the first and second interlayer insulating layers ILD1 and ILD2 and the gate insulating layer GI.

Although a case where the upper electrode UE are provided and/or formed on the second interlayer insulating layer ILD2 has been described in the above-described embodiment, the present disclosure is not limited thereto. In some embodiments, the upper electrode UE may be provided and/or formed on the first interlayer insulating layer ILD1.

The first drain electrode DE1 may be connected to (or in contact with) the other end of the first active pattern ACT1. Also, the first drain electrode DE1 may be connected to the first power line PL1 through a second contact hole CH2 sequentially penetrating the first and second interlayer insulating layers ILD1 and ILD2 and the gate insulating layer GI. Accordingly, the voltage of the first driving power source VDD may be applied to the first drain electrode DE1.

Although not directly shown in the drawings, a bottom metal layer may be disposed on the bottom of the first transistor T1 having the above-described configuration. The bottom metal layer may be provided and/or formed between the substrate SUB and the buffer layer BFL, and may be located to overlap with the first transistor T1. The bottom metal layer may constitute one electrode of the first transistor T1.

The second transistor T2 (e.g., the switching transistor) may include a second gate electrode GE2, a second active pattern ACT2, the second source electrode SE2, and a second drain electrode DE2.

The second gate electrode GE2 may be connected to the scan line Si through a second connection line CNL2. The second gate electrode GE2 may be provided and/or formed on the gate insulating layer GI. In one or more embodiments of the present disclosure, the second gate electrode GE2 may correspond to the first conductive layer CL1 provided on the gate insulating layer GI, may be provided in the same layer as the first gate electrode GE1, and may include the same material as the first gate electrode GE1.

The second connection line CNL2 may correspond to the second conductive layer CL2 provided and/or formed on the second interlayer insulating layer ILD2. One end of the second connection line CNL2 may be connected to the scan line Si through a ninth contact hole CH9 sequentially penetrating the first and second interlayer insulating layers ILD1 and ILD2. The other end of the second connection line CNL2 may be connected to the second gate electrode GE2 through a tenth contact hole CH10 sequentially penetrating the first and second interlayer insulating layers ILD1 and ILD2.

Although a case where the second gate electrode GE2 is non-integrally provided with the scan line Si to be connected to the scan line Si through a separate connection means, e.g., the second connection line CNL2 has been described in the above-described embodiment, the present disclosure is not limited thereto. In some embodiments, the second gate electrode GE2 may be integrally provided with the scan line Si. The second gate electrode GE2 may be provided as a portion of the scan line Si or may be provided in a shape protruding from the scan line Si.

Each of the second active pattern ACT2, the second source electrode SE2, and the second drain electrode DE2 may be a semiconductor pattern made of poly-silicon, amorphous silicon, oxide semiconductor, etc. The second active pattern ACT2, the second source electrode SE2, and the second drain electrode DE2 may be formed of a semiconductor layer undoped or doped with an impurity. For example, the second source electrode SE2 and the second drain electrode DE2 may be formed of a semiconductor layer doped with an impurity, and the second active pattern ACT2 may be formed of a semiconductor layer undoped with an impurity. For example, an n-type impurity may be used as an impurity for the semiconductor layer.

The second active pattern ACT2, the second source electrode SE2, and the second drain electrode DE2 may be provided and/or formed on the buffer layer BFL.

The second active pattern ACT2 is a region overlapping with the second gate electrode GE2, and may be a channel region of the second transistor T2.

The second source electrode SE2 may be connected to (or in contact with) one end of the second active pattern ACT2. Also, the second source electrode SE2 may be connected to the first gate electrode GE1 through the third connection line CNL3.

The second drain electrode DE2 may be connected to (or in contact with) the other end of the second active pattern ACT2. Also, the second drain electrode DE2 may be connected to the jth data line Dj through an eleventh contact hole CH11 sequentially penetrating the first and second interlayer insulating layers ILD1 and ILD2 and the gate insulating layer GI. Accordingly, a data signal (or data voltage) applied to the jth data line Dj may be transferred to the second drain electrode DE2.

The third transistor T3 may include a third gate electrode GE3, a third active pattern ACT3, a third source electrode SE3, and a third drain electrode DE3.

The third gate electrode GE3 may be connected to the control line CLi through a fourth connection line CNL4. The third gate electrode GE3 may be provided and/or formed on the gate insulating layer GI. In one or more embodiments of the present disclosure, the third gate electrode GE3 may correspond to the first conductive layer CL1 provided on the gate insulating layer GI, may be provided in the same layer as the scan line Si and the first and second gate electrodes GE1 and GE2, and may include the same material as the scan line Si and the first and second gate electrodes GE1 and GE2.

The fourth connection line CNL4 may correspond to the second conductive layer CL2 provided and/or formed on the second interlayer insulating layer ILD2. One end of the fourth connection line CNL4 may be connected to the third gate electrode GE3 through a fifth contact hole CH5 sequentially penetrating the first and second interlayer insulating layers ILD1 and ILD2. The other end of the fourth connection line CNL4 may be connected to the control line CLi through a sixth contact hole CH6 sequentially penetrating the first and second interlayer insulating layers ILD1 and ILD2.

Although a case where the third gate electrode GE3 is non-integrally provided with the control line CLi to be connected to the control line CLi through a separate connection means, e.g., the fourth connection line CNL4 has been described in the above-described embodiment, the present disclosure is not limited thereto. In some embodiments, the third gate electrode GE3 may be integrally provided with the control line CLi. The third gate electrode GE3 may be provided as a portion of the control line CLi or may be provided in a shape protruding from the control line CLi.

Each of the third active pattern ACT3, the third source electrode SE3, and the third drain electrode DE3 may be a semiconductor pattern made of poly-silicon, amorphous silicon, oxide semiconductor, etc. The third active pattern ACT3, the third source electrode SE3, and the third drain electrode DE3 may be formed of a semiconductor layer undoped or doped with an impurity. For example, the third source electrode SE3 and the third drain electrode DE3 may be formed of a semiconductor layer doped with an impurity, and the third active pattern ACT3 may be formed of a semiconductor layer undoped with an impurity. For example, an n-type impurity may be used as the impurity.

The third active pattern ACT3, the third source electrode SE3, and the third drain electrode DE3 may be provided and/or formed on the buffer layer BFL.

The third active pattern ACT3 is a region overlapping with the third gate electrode GE3, and may be a channel region of the third transistor T3.

The third source electrode SE3 may be connected to (or in contact with) one end of the third active pattern. Also, the third source electrode SE3 may be connected to the first source electrode SE1 through the upper electrode UE and the first and third contact holes CH1 and CH3.

The third drain electrode DE3 may be connected to (or in contact with) the other end of the third active pattern ACT3. Also, the third drain electrode DE3 may be connected to the first connection line CNL1 through the fifth connection line CNL5.

The fifth connection line CNL5 may correspond to the second conductive layer CL2 provided and/or formed on the second interlayer insulating layer ILD2. One end of the fifth connection line CNL5 may be connected to the third drain electrode DE3 through a fourth contact hole CH4 sequentially penetrating the first and second insulating layers ILD1 and ILD2 and the gate insulating layer GI. The other end of the fifth connection line CNL5 may be connected to the first connection line CNL1 through the seventh contact hole CH7 sequentially penetrating the first and second interlayer insulating layers ILD1 and ILD2. As described above, the first connection line CNL1 is connected to the initialization power line IPL through the eighth contact hole CH8, and therefore, the third drain electrode DE3 and the initialization power line IPL may be connected to each other through the first and fifth connection lines CNL1 and CNL5.

The storage capacitor Cst may include a lower electrode LE and the upper electrode UE.

The lower electrode LE may be integrally provided with the first gate electrode GE1. When the lower electrode LE is integrally provided with the first gate electrode GE1, the lower electrode LE may be regarded as one region of the first gate electrode GE1.

The upper electrode UE may be disposed to overlap with the lower electrode LE, and have an area greater than that of the lower electrode LE. A portion of the upper electrode UE may extend in the second direction DR2, and overlap with each of the first and third source electrodes SE1 and SE3. The upper electrode UE may be connected to the first source electrode SE1 through the first contact hole CH1, and be connected to the third source electrode SE3 through the third contact hole CH3. When a bottom metal layer is provided, the upper electrode UE may be connected to the bottom metal layer through a contact hole sequentially penetrating the first and second interlayer insulating layers ILD1 and ILD2, the gate insulating layer GI, and the buffer layer BFL.

A first bridge line BRL1 and a second bridge line BRL2 may be further disposed in the first pixel area PXA1.

The first bridge line BRL1 and the second bridge line BRL2 may be provided and/or formed on the second interlayer insulating layer ILD. In one or more embodiments of the present disclosure, the first and second bridge lines BRL1 and BRL2 may correspond to the second conductive layer CL2. The first and second bridge lines BRL1 and BRL2 may extend in the same direction (e.g., second direction DR2) as the jth data line Dj, and may be disposed to be spaced from each other.

Each of the first and second bridge lines BRL1 and BRL2 may be connected to a corresponding line in the line part LP located in the non-display area NDA of the substrate SUB. For example, the first bridge line BRL1 may be connected to a second line LP2 located in the non-display area NDA, and the second bridge line BRL2 may be connected to a third line LP3 located in the non-display area NDA.

The second and third lines LP2 and LP3 may correspond to the first conductive layer CL1 provided and/or formed on the gate insulating layer GI of the non-display area NDA. The second line LP2 may be connected to the first bridge line BRL1 through a twenty-second contact hole CH22 sequentially penetrating the first and second interlayer insulating layers ILD1 and ILD2. Accordingly, a signal (e.g., a set or predetermined signal or voltage) applied to the second line LP2 may be transferred to the first bridge line BRL1 through the twenty-second contact hole CH22. In one or more embodiments of the present disclosure, the second line LP2 may serve as an alignment signal supply line for supplying an alignment signal (or alignment voltage) to the first bridge line BRL1 when light emitting elements LD are aligned in the first pixel area PXA1.

In one or more embodiments, the third line LP3 may be connected to the second bridge line BRL2 through a twenty-third contact hole CH23 sequentially penetrating the first and second interlayer insulating layers ILD1 and ILD2. Accordingly, a signal (e.g., a set or predetermined signal or voltage) applied to the third line LP3 may be transferred to the second bridge line BRL2 through the twenty-third contact hole CH23. In one or more embodiments of the present disclosure, the third line LP3 may serve as an alignment signal supply line for supplying an alignment signal (or alignment voltage) to the second bridge line BRL2 when light emitting elements LD are aligned in the first pixel area PXA1.

In one or more embodiments of the present disclosure, the first bridge line BRL1 may be connected to a partial component, e.g., a first sub-electrode SEL1 of the display element layer DPL through a fifteenth contact hole CH15 penetrating the passivation layer PSV (e.g., as shown in FIG. 11). The first sub-electrode SEL1 may maintain a state in which the first sub-electrode SEL1 is connected to a first electrode EL1 when light emitting elements LD are aligned in the first pixel area PXA1, and then a portion of the first sub-electrode SEL1 may be removed in a process after the alignment of the light emitting elements LD, so that the first sub-electrode SEL1 is spaced from the first electrode EU. The first bridge line BRL1 may transfer an alignment signal (e.g., a set or predetermined alignment signal or alignment voltage) to the first electrode EU through the fifteenth contact hole CH15 and the first sub-electrode SEL1 when the light emitting elements LD are aligned in the first pixel area PXA1, so that the first electrode EL1 serves as a first alignment electrode (or first alignment line).

After the light emitting elements LD are aligned, the first bridge line BRL1 may be electrically separated from the first sub-electrode SEL1 to become a floating state. However, the present disclosure is not limited thereto. In some embodiments, after the light emitting elements LD are aligned, signals (e.g., set or predetermined signals) desired for driving of the first pixel PXL1 may be applied to the first bridge line BRL1.

In one or more embodiments of the present disclosure, the second bridge line BRL2 may be connected to a partial component, e.g., a second electrode EL2 of the display element layer DPL through a sixteenth contact hole CH16 penetrating the passivation layer PSV. The second bridge line BRL2 may transfer an alignment signal (e.g., a set or predetermined alignment signal or alignment voltage) to the second electrode EL2 when the light emitting elements LD are aligned in the first pixel area PXA1, so that the second electrode EL2 serves as a second alignment electrode (or second alignment line).

After the light emitting elements LD are aligned in the first pixel area PXA1, the voltage of the second driving power source VSS, which drives the light emitting elements LD, may be applied to the second bridge line BRL2. For example, the second bridge line BRL2 may be the same component as the second power line PL2 described with reference to FIGS. 6A-7B.

In one or more embodiments of the present disclosure, the (j+1)th data line Dj+1 disposed to be spaced from the second bridge line BRL2 may be connected to a partial component, e.g., a second sub-electrode SEL2 of the display element layer DPL through a seventeenth contact hole CH17 penetrating the passivation layer PSV (e.g., as shown in FIG. 12). The second sub-electrode SEL2 may maintain a state in which the second sub-electrode SEL2 is connected to a third electrode EL3 when light emitting elements LD are aligned in the first pixel area PXA1, and then a portion of the second sub-electrode SEL2 may be removed in a process after the alignment of the light emitting elements LD, so that the second sub-electrode SEL2 is spaced from the third electrode EL3. The (j+1)th data line Dj+1 may transfer an alignment signal (e.g., a set or predetermined alignment signal or alignment voltage) to the third electrode EL3 through the seventeenth contact hole CH17 and the second sub-electrode SEL2 when the light emitting elements LD are aligned in the first pixel area PXA1, so that the third electrode EL3 serves as a third alignment electrode (or third alignment line). The alignment signal may be transmitted to the (j+1)th data line Dj+1 through the fifth line LP5 disposed in the non-display area NDA.

After the light emitting elements LD are aligned, a data signal may be applied to the (j+1)th data line Dj+1, and the third electrode EL3 may be in a floating state.

The passivation layer PSV may be provided and/or formed over components corresponding to the second conductive layer CL2, e.g., the jth data line Dj, the (j+1)th data line Dj+1, the initialization power line IPL, the first power line PL1, the second to fifth connection lines CNL2 to CNL5, the upper electrode UE, and the first and second bridge lines BRL1 and BRL2.

The passivation layer PSV may be provided in a form including an organic insulating layer, an inorganic insulating layer, or the organic insulating layer disposed on the inorganic insulating layer. The inorganic insulating layer may include at least one of silicon oxide (SiOx), silicon nitride (SiNx), silicon oxynitride (SiON), and metal oxide such as aluminum oxide (AlOx). The organic insulating layer may include an organic insulating material which enables light to be transmitted therethrough. For example, the organic insulating layer may include at least one of photoresist, polyacrylates resin, epoxy resin, phenolic resin, polyamides resin, polyimides resin, unsaturated polyesters resin, polyphenylene ethers resin, poly-phenylene sulfides resin, and benzocyclobutenes resin.

Next, the display element layer DPL of the first pixel PXL1 will be described.

The display element layer DPL may include first and second bank patterns BNK1 and BNK2, first to third electrodes EL1 to EL3, first and second sub-electrodes SEL1 and SEL2, light emitting elements LD, and a contact electrode CNE (e.g., CNE1, CNE2, CNE3).

The first bank pattern BNK1 may be located in a light emitting area in which light is emitted in the first pixel area PXA1. The first bank pattern BNK1 may be a supporting member which supports each of the first to third electrodes EL1 to EL3 to change a surface profile of each of the first to third electrodes EL1 to EL3 such that lights emitted from the light emitting elements LD further advance in an image display direction of the display device.

The first bank pattern BNK1 may be provided and/or formed between the passivation layer PSV and each electrode (e.g., EU, EL2, EL3) in the light emitting area of the first pixel area PXA1. For example, the first bank pattern BNK1 may be provided and/or formed between each of the passivation layer PSV and the first electrode EL1, between the passivation layer PSV and the second electrode EL2, and between the passivation layer PSV and the third electrode EL3.

The first bank pattern BNK1 may include an inorganic insulating layer made of an inorganic material or an organic insulating layer made of an organic material. In some embodiments, the first bank pattern BNK1 may include an organic insulating layer provided in a single layer and/or an inorganic insulating layer provided in a single layer, but the present disclosure is not limited thereto. In some embodiments, the first bank pattern BNK1 may be provided in the form of a multi-layer in which at least one organic insulating layer and at least one inorganic insulating layer are stacked. However, the material of the first bank pattern BNK1 is not limited to the above-described embodiments. In some embodiments, the first bank pattern BNK1 may include a conductive material.

The first bank pattern BNK1 may have a section having a trapezoidal shape which is narrowed as approaching the top thereof from one surface of the passivation layer PSV, but the present disclosure is not limited thereto. In some embodiments, as shown in FIG. 15, the first bank pattern BNK1 may include a curved surface having a section provided in a semi-elliptical shape, a semicircular shape (or hemispherical shape) or the like, which is narrowed as approaching the top thereof from the one surface of the passivation layer PSV. When viewed on a section, the shape of the first bank pattern BNK1 is not limited to the above-described embodiments, and may be variously changed in a range where the efficiency of the light emitted from each of the light emitting elements LD can be improved. Adjacent first bank patterns BNK1 may be disposed on the same plane of the passivation layer PSV, and have the same height (or thickness).

The first bank pattern BNK1 may have a bar shape extending along one direction, e.g., the second direction DR2 (e.g., vertical direction) when viewed on a plane. However, the present disclosure is not limited thereto, and the first bank pattern BNK1 may be provided in various shapes.

The second bank pattern BNK2 may surround (or may be located) at least one side of a peripheral area of the first pixel area PXA1 (e.g., as shown in FIG. 13). The peripheral area may include a non-light emitting area in which no light is emitted.

The second bank pattern BNK2 is a structure which defines (or partitions) light emitting areas of the first pixel PXL1 and pixels PXL adjacent thereto, and may be, for example, a pixel defining layer. The second bank pattern BNK2 may include at least one light blocking material and/or at least one reflective material, to prevent (or protect from) a light leakage defect in which light (or beam of light) may be leaked between each pixel PXL and pixels PXL adjacent thereto. For example, the second bank pattern BNK2 may act as a light blocking layer to prevent (or protect from) a leakage of light between two adjacent pixels PXL. In some embodiments, a reflective material layer may be formed over the second bank pattern BNK2 so as to further improve the efficiency of light emitted from the first pixel PXL1. The second bank pattern BNK2 may be provided and/or formed in a layer different from that of the first bank pattern BNK1, but the present disclosure is not limited thereto. In some embodiments, the second bank pattern BNK2 may be provided and/or formed in the same layer as the first bank pattern BNK1. In one or more embodiments of the present disclosure, the second bank pattern BNK2 may be formed in a layer different from that of the first bank pattern BNK1, and may be located on a first insulating layer INS1.

Each of the first to third electrodes EL1 to EL3 may be provided in the first pixel area PXA1, and may extend in one direction, e.g., the second direction DR2. The first to third electrodes EL1 to EL3 may be provided at the same surface, and may be disposed to be spaced from each other.

When viewed on a plane, the first electrode EL1, the second electrode EL2, and the third electrode EL3 may be sequentially arranged along the first direction DR1. The first electrode EL1 and the second electrode EL2 may be spaced from each other at a certain distance, and the second electrode EL2 and the third electrode EL3 may be spaced from each other at a certain distance. In the first pixel area PXA1, the distance between the first electrode EL1 and the second electrode EL2 and the distance between the second electrode EL2 and the third electrode EL3 may be the same. However, the present disclosure is not limited thereto. In some embodiments, the distance between the first electrode EL1 and the second electrode EL2 and the distance between the second electrode EL2 and the third electrode EL3 may be different from each other.

Each of the first to third electrodes EL1 to EL3 may be provided and/or formed over the first bank pattern BNK1 to have a surface profile corresponding to the shape of the first bank pattern BNK1. For example, each of the first to third electrodes EL1 to EL3 may include a protrusion part corresponding to the first bank pattern BNK1 and a flat part or a substantially flat (e.g., planarized or substantially planarized) part corresponding to the passivation layer PSV. Each of the first to third electrodes EL1 to EL3 may be made of a material having a constant reflexibility to allow light emitted from each of the light emitting elements LD to advance in the image display direction of the display device.

Each of the first to third electrodes EL1 to EL3 may be made of a conductive material having a constant reflexibility. The conductive material may include an opaque metal that may be suitable for reflecting lights emitted from the light emitting elements LD in the image display direction of the display device. The opaque metal may include, for example, a metal such as Ag, Mg, Al, Pt, Pd, Au, Ni, Nd, Ir, Cr, Ti, or any alloy thereof. In some embodiments, each of the first to third electrodes EL1 to EL3 may include a transparent conductive material. The transparent conductive material may include a conductive oxide such as indium tin oxide (ITO), indium zinc oxide (IZO), zinc oxide (ZnO), or indium tin zinc oxide (ITZO), a conductive polymer such as PEDOT, and the like. When each of the first to third electrodes EL1 to EL3 includes the transparent conductive material, a separate conductive layer may be additionally included, which is made of an opaque metal for reflecting lights emitted from the light emitting elements LD in the image display direction of the display device. However, the material of each of the first to third electrodes EL1 to EL3 is not limited to the above-described materials.

Also, each of the first to third electrodes EL1 to EL3 may be provided and/or formed in a single layer, but the present disclosure is not limited thereto. In some embodiments, each of the first to third electrodes EL1 to EL3 may be provided and/or formed in a multi-layer in which two or more materials from among metals, alloys, conductive oxides, and conductive polymers are stacked. Each of the first to third electrodes EL1 to EL3 may be provided in a multi-layer including at least two layers so as to reduce or minimize distortion caused by a signal delay when a signal (or a voltage) is transferred to both end portions of each of the light emitting elements LD. For example, each of the first to third electrodes EL1 to EL3 may be provided in a multi-layer in which indium tin oxide (ITO)/silver (Ag)/indium tin oxide (ITO) are sequentially stacked.

As described above, because each of the first to third electrodes EL1 to EL3 has a surface profile corresponding to the shape of the first bank BNK1 disposed on the bottom thereof, light emitted from each of the light emitting elements LD may be reflected by each of the first to third electrodes EL1 to EL3 to be further advance in the image display direction of the display device. Therefore, the efficiency of light emitted from each of the light emitting elements LD can be further improved (e.g., the light emission efficiency of the light emitting elements LD may be improved).

Each of the first bank pattern BNK1 and the first to third electrodes EL1 to EL3 may serve as a reflective member which allows lights emitted from the light emitting elements LD to advance in the image display direction of the display device, thereby improving the light emission efficiency of the light emitting elements LD.

In one or more embodiment of the present disclosure, the first electrode EU may be disposed to overlap with each of the first bridge line BRL1 and the upper electrode UE. The first electrode EU may be connected to the upper electrode UE through a fourteenth contact hole CH14 penetrating the passivation layer PSV (e.g., as shown in FIG. 11). The second electrode EL2 may be disposed to overlap with the second bridge line BRL2. The second electrode EL2 may be connected to the second bridge line BRL2 through the sixteenth contact hole CH16 (e.g., as shown in FIG. 10). The third electrode EL3 may be disposed to overlap with the (j+1)th data line Dj+1 (e.g., as shown in FIG. 12).

The first and second sub-electrodes SEL1 and SEL2 may be provided in the same layer as the first to third electrodes EL1 to EL3, and may include the same material as the first to third electrodes EU to EL3. For example, the first and second sub-electrodes SEL1 and SEL2 may correspond to a third conductive layer CL3 disposed on the passivation layer PSV.

The first sub-electrode SEL1 may be located between the first electrode EL1 and the second electrode EL2 (e.g., as shown in FIG. 10), and may be disposed to overlap with the first bridge line BRL1. The first sub-electrode SEL1 may be connected to the first bridge line BRL1 through the fifteenth contact hole CH15 (e.g., as shown in FIG. 11). In one or more embodiments of the present disclosure, the first sub-electrode SEL1 may be provided in a form in which the first sub-electrode SEL1 is connected to the first electrode EL1 before the light emitting elements LD are aligned in the first pixel area PXA1. For example, before the light emitting elements LD are aligned, the first sub-electrode SEL1 and the first electrode EL1 may be connected to each other. After the light emitting elements LD are aligned, the first sub-electrode SEL1 and the first electrode EL1 may be spaced from each other to be in a state in which the first sub-electrode SEL1 and the first electrode EL1 are electrically and/or physically separated from each other.

The second sub-electrode SEL2 may be spaced from the third electrode EL3, and may be disposed to overlap with the (j+1)th data line Dj+1. The second sub-electrode SEL2 may be connected to the (j+1)th data line Dj+1 through the seventeenth contact hole CH17 penetrating the passivation layer PSV (e.g., as shown in FIG. 12). In one or more embodiments of the present disclosure, the second sub-electrode SEL2 may be provided in a form in which the second sub-electrode SEL2 is connected to the third electrode EL3 before the light emitting elements LD are aligned in the first pixel area PXA1. For example, before the light emitting elements LD are aligned, the second sub-electrode SEL2 and the third electrode EL3 may be connected to each other. After the light emitting elements LD are aligned, the second sub-electrode SEL2 and the third electrode EL3 may be spaced from each other to be in a state in which the second sub-electrode SEL2 and the third electrode EL3 are electrically and/or physically separated from each other.

Before the light emitting elements LD are aligned in the first pixel area PXA1, the first electrode EL1 may receive an alignment signal (e.g., a set or predetermined alignment signal or alignment voltage) transferred from the first bridge line BRL1 and the first sub-electrode SEL1 to serve as a first alignment electrode (or first alignment line). After the light emitting elements LD are aligned in the first pixel area PXA1, the first electrode EL1 may be electrically separated from the first sub-electrode SEL1, and may be connected to the upper electrode UE through the fourteenth contact hole CH14 to serve as a driving electrode for driving the light emitting elements LD (e.g., as shown in FIG. 11).

Before the light emitting elements LD are aligned in the first pixel area PXA1, the second electrode EL2 may receive an alignment signal (e.g., a set or predetermined alignment signal or alignment voltage) transferred from the second bridge line BRL2 to serve as a second alignment electrode (or second alignment line). After the light emitting elements LD are aligned in the first pixel area PXA1, the second electrode EL2 may serve as a driving electrode for driving the light emitting elements LD.

Before the light emitting elements LD are aligned in the first pixel area PXA1, the third electrode EL3 may receive an alignment signal (e.g., a set or predetermined alignment signal or alignment voltage) transferred from the (j+1)th data line Dj+1 and the second sub-electrode SEL2 to serve as a third alignment electrode (or third alignment line) (e.g., as shown in FIG. 12). After the light emitting elements LD are aligned in the first pixel area PXA1, the third electrode EL3 may be electrically separated from the second sub-electrode SEL2, and may serve as a reflective member which reflects light emitted from each of the light emitting elements LD to in the image display direction of the display device.

The first to third alignment signals may be signals having a voltage difference and/or a phase difference to a degree to which the light emitting elements LD can be aligned between the first to third electrodes EL1 to EL3. At least some of the first to third alignment signals may be AC signals, but the present disclosure is not limited thereto.

When a corresponding alignment signal (or alignment voltage) is applied to each of the first to third electrodes EL1 to EL3, an electric field may be formed between each of the first electrode EL1 and the second electrode EL2 and between the second electrode EL2 and the third electrode EL3. The light emitting elements LD may be aligned and/or provided in the first pixel area PXA1 by the electric field formed between the two adjacent electrodes (e.g., the first electrode EL1 and the second electrode EL2 or the second electrode EL2 and the third electrode EL3).

In one or more embodiments of the present disclosure, when light emitting elements LD are aligned in the first pixel area PXA1, the alignment signal (or alignment voltage) applied to each of the first to third electrodes EL1 to EL3 is controlled, or a magnetic field is formed, so that the light emitting elements LD supplied in the first pixel area PXA1 can be aligned to be relatively biased.

In one or more embodiments of the present disclosure, the first electrode EL1 may be an anode electrode, and the second electrode EL2 may be a cathode electrode.

Each of the light emitting elements LD may be a light emitting element having a micro size, e.g., a size substantially small to a degree of nano scales to micro scales, which is fabricated using a material having an inorganic crystalline structure. For example, each of the light emitting elements LD may be a micro light emitting element fabricated through an etching process or a micro light emitting element fabricated through a growth process.

At least two or a few tens of light emitting elements LD may be aligned and/or provided in the first pixel area PXA1, but the number of the light emitting elements LD is not limited thereto. In some embodiments, the number of the light emitting elements LD aligned and/or provided in the first pixel area PXA1 may be variously changed.

Each of the light emitting elements LD may be disposed between two electrodes adjacent in the first direction DR1. The light emitting elements LD may include first light emitting elements LD1 disposed between the first electrode EL1 and one side (e.g., a left side (LS)) of the second electrode EL2 and second light emitting elements LD2 disposed between the other side (e.g., a right side (RS)) of the second electrode EL2 and the third electrode EL3. In one or more embodiments, when one of the first and second light emitting elements LD1 and LD2 is arbitrarily designated or when the first and second light emitting elements LD1 and LD2 are inclusively designated, the light emitting element or the light emitting elements are referred to as a light emitting element LD or light emitting elements LD.

In one or more embodiments of the present disclosure, each of the light emitting elements LD may emit any one of colored light (e.g., red, green, blue, etc.) and/or white light. Each of the light emitting elements LD may be aligned between two adjacent electrodes such that its length L direction is parallel to the first direction DR1. The light emitting elements LD may be provided in a form in which they are dispersed in a solution, to be injected into the first pixel area PXA1.

In one or more embodiments of the present disclosure, the light emitting elements LD may be injected into the first pixel area PXA1 through an inkjet printing process, a slit coating process, or various other processes. For example, the light emitting elements LD may be mixed with a volatile solvent to be supplied to the first pixel area PXA1 through an inkjet printing process or a slit coating process. When a corresponding alignment signal (or alignment voltage) is applied to each of the first to third electrodes EL1 to EL3 located in the first pixel area PXA1, an electric field may be formed between two adjacent electrodes from among the first to third electrodes EL1 to EL3. Therefore, light emitting elements LD may be aligned between each of the first electrode EL1 and the one side LS of the second electrode EL2 and between the other side RS of the second electrode EL2 and the third electrode EL3.

After the light emitting elements LD are aligned, the solvent is volatilized or removed through another process, so that the light emitting elements LD can be finally aligned and/or provided in the first pixel area PXA1.

The above-described light emitting elements LD may be provided and/or formed on the first insulating layer INS1 in the first pixel area PXA1.

The first insulating layer INS1 may be formed and/or provided on the bottom of each of the light emitting elements LD, which is aligned and/or provided between two adjacent electrodes (e.g., EL1 and EL2 and/or EL2 and EL3) in the first pixel area PXA1. The first insulating layer INS1 is filled in a space between each of the light emitting elements LD and the passivation layer PSV, to stably support the light emitting elements LD and prevent (or protect from) separation of the light emitting elements LD from the passivation layer PSV.

The first insulating layer INS1 may include an inorganic insulating layer made of an inorganic material or an organic insulating layer made of an organic material. In one or more embodiments of the present disclosure, the first insulating layer INS1 may be configured as an inorganic insulating layer to protect (or prevent from) the light emitting elements LD from the pixel circuit layer PCL of each pixel PXL, but the present disclosure is not limited thereto. In some embodiments, the first insulating layer INS1 may be configured as an organic insulating layer suitable for planarizing a supporting surface of the light emitting elements LD.

Also, the first insulating layer INS1 may expose one area of each of the first to third electrodes EU to EL3 and may cover the other area except the one area. A contact electrode CNE (e.g., CNE1, CNE2, CNE3) may be provided and/or formed on the exposed one area of each of the first to third electrodes EU to EL3.

A second insulating layer INS2 may be provided and/or formed over the light emitting elements LD. The second insulating layer INS2 may be provided and/or formed over each of the light emitting elements LD to cover a partial upper surface of each of the light emitting elements LD, and expose both end portions of each of the light emitting elements LD to the outside. The second insulating layer INS2 may be formed as an independent pattern on the first pixel area PXA1, but the present disclosure is not limited thereto. In some embodiments, the second insulating layer INS2 may be provided and/or formed between the light emitting elements LD and the first insulating layer INS1.

The second insulating layer INS2 may be configured in a single layer or a multi-layer, and may include an inorganic insulating layer including at least one inorganic material or an organic insulating layer including at least one organic material. The second insulating layer INS2 may allow each of the light emitting elements aligned in the first pixel area PXA1 to be further fixed. For example, the second insulating layer INS2 may provide further stability to the light emitting elements. In one or more embodiments of the present disclosure the second insulating layer INS2 may include an inorganic insulating layer suitable for protecting the active layer 12 of each of the light emitting elements LD from external oxygen, moisture, and the like. However, the present disclosure is not limited thereto. The second insulating layer INS2 may include an organic insulating layer including an organic material according to design conditions of the display device to which the light emitting elements LD are applied.

In one or more embodiments of the present disclosure, after light emitting elements LD are completely aligned in the first pixel area PXA1, the second insulating layer INS2 is formed over the light emitting elements LD, so that the light emitting elements LD can be prevented (or protected) from being separated from the position at which the light emitting elements LD are aligned. For example, as shown in FIG. 14B, when a gap (or space) exists between the first insulating layer INS1 and the light emitting elements LD before the second insulating layer INS2 is formed, the gap may be filled with the second insulating layer INS2 in the process of forming the second insulating layer INS2. For example, the light emitting elements LD may be configured with an organic insulating layer to fill the gap between the first insulating layer INS1 and the light emitting elements LD.

In one or more embodiments of the present disclosure, the second insulating layer INS2 may be formed over each of light emitting elements LD such that the active layer 12 of the light emitting elements LD can be prevented (or protected) from being in contact with an external conductive material. The second insulating layer INS2 may cover only a partial surface of each of the light emitting elements LD, and may expose both end portions of each of the light emitting elements LD to the outside.

The contact electrode CNE (e.g., CNE1, CNE2, CNE3) may be disposed on each of the first to third electrodes EL1 to EL3. The contact electrode CNE may be a component which more stably connects each of the first to third electrodes EL1 to EL3 and light emitting elements LD corresponding thereto electrically to each other.

The contact electrode CNE may include a first contact electrode CNE1 disposed on the first electrode EL1, a second contact electrode CNE2 disposed on the second electrode EL2, and a third contact electrode CNE3 disposed on the third electrode EL3. The first to third contact electrodes CNE1 to CNE3 may be made of various transparent conductive materials. For example, the first to third contact electrodes CNE1 to CNE3 may include at least one of various transparent conductive materials including ITO, IZO, and ITZO, and may be implemented substantially transparent or translucent to satisfy a suitable transmittance (e.g., a set or predetermined transmittance). However, the material of the first to third contact electrodes CNE1 to CNE3 is not limited to the above-described embodiments. In some embodiments, the first to third contact electrodes CNE1 to CNE3 may be made of various opaque conductive materials.

The first contact electrode CNE1, the second contact electrode CNE2, and the third contact electrode CNE3 may be disposed to be spaced from each other at the same plane. The first contact electrode CNE1, the second contact electrode CNE2, and the third contact electrode CNE3 may be provided in the same layer, and may include the same material. However, the present disclosure is not limited thereto. In some embodiments, the first to third contact electrodes CNE1 to CNE3 may be provided in different layers, and may include different materials.

In one or more embodiments of the present disclosure, the first contact electrode CNE1 may be provided on the first electrode EL1, to overlap with the first electrode EL1. The first contact electrode CNE1 may be directly disposed on the one area of the first electrode EL1, which is exposed by the first insulating layer INS1, to be connected to the first electrode EL1. Also, the first contact electrode CNE1 may be directly provided on one of both end portions of each of the first light emitting elements LD1, to overlap with the one end portion of each of the first light emitting elements LD1. The first contact electrode CNE1 may stably connect the first electrode EL1 and one of both the end portions of each of the first light emitting elements LD1 electrically to each other.

The second contact electrode CNE2 may be provided on the second electrode EL2, to overlap with the second electrode EL2. The second contact electrode CNE2 may be directly disposed on the one area of the second electrode EL2, which is exposed by the first insulating layer INS1, to electrically and/or physically connect to the second electrode EL2. Also, the second contact electrode CNE2 may be directly provided on the other one of the both end portions of each of the first light emitting elements LD1, to overlap with the other end portion of each of the first light emitting elements LD1. Also, the second contact electrode CNE2 may be directly provided on one of both end portions of each of the second light emitting elements LD2, to overlap with the one end portion of each of the second light emitting elements LD2.

The second contact electrode CNE2 may stably connect the other one of the both end portions of each of the first light emitting elements LD1 and one of the both end portions of each of the second light emitting elements LD2 electrically to each other. In one or more embodiments of the present disclosure, the second contact electrode CNE2 may be provided in the same layer as the first contact electrode CNE1, and may include the same material.

The first contact electrode CNE1 and the second contact electrode CNE2 may be disposed to be spaced from each other. For example, the first contact electrode CNE1 and the second contact electrode CNE2 may be disposed on the second insulating layer INS2 of each of the first light emitting elements LD1 to be spaced apart from each other at a certain distance. The first contact electrode CNE1 and the second contact electrode CNE2 may be provided in the same layer. However, the present disclosure is not limited thereto. In some embodiments, the first and second contact electrodes CNE1 and CNE2 may be provided in different layers. When the first contact electrode CNE1 and the second contact electrode CNE2 are provided in different layers, a separate insulating layer may be provided between the first contact electrode CNE1 and the second contact electrode CNE2.

The third contact electrode CNE3 may be provided on the third electrode EL3, to overlap with the third electrode EL3. The third contact electrode CNE3 may be directly disposed on the one area of the third electrode EL3, which is exposed by the first insulating layer INS1, to be connected to the third electrode EL3. Also, the third contact electrode CNE3 may overlap with the other one of the both end portions of each of the second light emitting elements LD2. The third contact electrode CNE3 may stably connect the third electrode EL3 and the other end portion of each of the second light emitting elements LD2 electrically to each other.

The second contact electrode CNE2 and the third contact electrode CNE3 may be disposed to be spaced from each other. For example, the second contact electrode CNE2 and the third contact electrode CNE3 may be disposed on the second insulating layer INS2 of each of the second light emitting elements LD2 to be spaced from each other at a certain distance.

The second contact electrode CNE2 and the third contact electrode CNE3 may be provided in the same layer, but the present disclosure is not limited thereto. In some embodiments, the second contact electrode CNE2 and the third contact electrode CNE3 may be provided in different layers. For example, as shown in FIG. 16, the second contact electrode CNE2 may be provided on the second insulating layer INS2, and may be covered by an auxiliary insulating layer AUINS. In one or more embodiments, the third contact electrode CNE3 may be provided on the auxiliary insulating layer AUINS, and the auxiliary insulating layer AUINS may be covered by a third insulating layer INS3. The auxiliary insulating layer AUINS may be an inorganic insulating layer including an inorganic material or an organic insulating layer including an organic material.

The third insulating layer INS3 may be provided and/or formed over the first to third contact electrodes CNE1 to CNE3. The third insulating layer INS3 may be an inorganic insulating layer including an inorganic material or an organic insulating layer including an organic material. For example, the third insulating layer INS3 may have a structure in which at least one inorganic insulating layer and at least one organic insulating layer are alternately stacked. The third insulating layer INS3 may entirely cover the display element layer DPL to block (or protect from) moisture, humidity or the like from the outside from being introduced to the display element layer DPL including the light emitting elements LD.

In accordance with the above-described embodiment, before the light emitting elements LD are aligned in the first pixel area PXA1, the first electrode EL1 may be connected to the first sub-electrode SEL1, and the third electrode EL3 may be connected to the second sub-electrode SEL2.

When the light emitting elements LD are aligned in the first pixel area PXA1, a first alignment signal (or a first alignment voltage) may be applied to the first bridge line BRL1 through the second line LP2 located in the non-display area NDA (e.g., as shown in FIG. 11), a second alignment signal (or a second alignment voltage) may be applied to the second bridge line BRL2 through the third line LP3 located in the non-display area NDA, and a third alignment signal (or a third alignment voltage) may be applied to the (j+1)th data line Dj+1 through the fourth line LP4 located in the non-display area NDA.

The first alignment signal (or a first alignment voltage) applied to the first bridge line BRL1 may be transferred to the first electrode EL1 via the first sub-electrode SEL1 (e.g., as shown in FIG. 11). The second alignment signal (or a second alignment voltage) applied to the second bridge line BRL2 may be transferred to the second electrode EL2. The third alignment signal (or a third alignment voltage) applied to the (j+1)th data line Dj+1 may be transferred to the third electrode EL3 via the second sub-electrode SEL2 (e.g., as shown in FIG. 12).

As described above, when a corresponding alignment signal (or an alignment voltage) is transferred to each of the first to third electrodes EL1 to EL3, an electric field may be formed between the first to third electrodes EU to EL3. When light emitting elements LD are injected in a state in which the electric field is formed between the first to third electrodes EL1 to EL3, the light emitting elements LD may be aligned between the first electrode EL1 and the one side LS of the second electrode EL2 and between the other side RS of the second electrode EL2 and the third electrode EL3.

As described above, in the display device in accordance with embodiments of the present disclosure, a corresponding alignment signal (or an alignment voltage) is transferred to each of the first to third electrodes EU to EL3 by using components (e.g., the second to fourth lines LP2, LP3, and LP4) constituting the first conductive layer CL1 provided on the gate insulating layer GI and components (e.g., the first and second bridge lines BRL1 and BRL2 and the (j+1)th data line Dj+1) constituting the second conductive layer CL2 provided on the second interlayer insulating layer ILD2, so that the light emitting elements LD can be aligned. The light emitting elements LD may be aligned in the first pixel area PXA1 by using only the first conductive layer CL1 and the second conductive layer CL2, without any separate conductive layer for transferring an alignment signal (or an alignment voltage) to each of the first to third electrode EL1 to EL3 so as to align the light emitting elements LD, e.g., the third conductive layer located between the second conductive layer CL2 and the passivation layer PSV. Accordingly, a process of forming the third conductive layer, a process of connecting each of the first to third electrodes EL1 to EL3 to the third conductive layer, and the like may be omitted. For example, in the display device in accordance with the above-described embodiment, a fabricating process of the display device may be simplified.

Further, in accordance with the above-described embodiment, overlapping between conductive layers provided on the substrate SUB is minimized or reduced by omitting the third conductive layer, so that a parasitic capacitor which may be formed between the overlapping conductive layers can be minimized or reduced.

In one or more embodiments, when the third conductive layer is omitted, which has a thickness relatively thicker than those of the first and second conductive layers CL1 and CL2, the flatness of the passivation layer PSV provided over the third conductive layer may be further improved. The light output and positions of some components, e.g., the light emitting elements LD of the display element layer DPL, which are provided on the passivation layer PSV, may be controlled.

FIGS. 17A-17H are schematic plan views sequentially illustrating a method of fabricating the display device shown in FIG. 8. FIGS. 18A-18L are sectional views sequentially illustrating a method of fabricating the display device shown in FIG. 12.

Hereinafter, the pixel in accordance with the embodiment of the present disclosure, which is shown in FIGS. 8 and 12, will be sequentially described according to the method in conjunction with FIGS. 17A-17H and 18A-18L.

In FIGS. 17A-17H and 18A-18L, portions different from those of the above-described embodiments will be mainly described to avoid redundancy. Portions not particularly described in this embodiment follow those of the above-described embodiment. In one or more embodiments, components similar and/or identical to those of the above-described embodiment are designated by like reference numerals.

Referring to FIGS. 1A-5, 6E, 8-17A, and 18A, a semiconductor layer SCL is formed on a buffer layer BFL on a substrate SUB.

The semiconductor layer SCL may be a semiconductor pattern made of poly-silicon, amorphous silicon, an oxide semiconductor, etc.

Referring to FIGS. 1A-5, 6E, 8-16, 17B, 18A, and 18B, a gate insulating layer GI is formed over the semiconductor layer SCL.

Subsequently, a first conductive layer CL1 is formed on the gate insulating layer GI. The first conductive layer CL1 may include first to fifth lines LP1 to LP5 of a non-display area NDA, and a scan line Si, a control line CLi, first to third gate electrodes GE1 to GE3, and a first connection line CNL1 of a display area DA.

One area of the semiconductor layer SCL, which overlaps with the first gate electrode GE1, may become a first active pattern ACT1. Both side portions of the first active pattern ACT1, which do not overlap with the first gate electrode GE1, may become a first source electrode SE1 and a first drain electrode DE1. The first active pattern ACT1, the first gate electrode GE1, the first source electrode SE1, and the first drain electrode DE1 may constitute a first transistor T1.

One area of the semiconductor layer SCL, which overlaps with the second gate electrode GE2, may become a second active pattern ACT2. Both side portions of the second active pattern ACT2, which do not overlap with the second gate electrode GE2, may become a second source electrode SE2 and a second drain electrode DE2. The second active pattern ACT2, the second gate electrode GE2, the second source electrode SE2, and the second drain electrode DE2 may constitute a second transistor T2.

One area of the semiconductor layer SCL, which overlaps with the third gate electrode GE3, may become a third active pattern ACT3. Both side portions of the third active pattern ACT3, which do not overlap with the third gate electrode GE3, may become a third source electrode SE3 and a third drain electrode DE3. The third active pattern ACT3, the third gate electrode GE3, the third source electrode SE3, and the third drain electrode DE3 may constitute a third transistor T3.

Referring to FIGS. 1A-5, 6E, 8-16, and 18A-18C, first and second interlayer insulating layers ILD1 and ILD2 including a plurality of contact holes and a gate insulating layer GI including a plurality of contact holes are formed by sequentially stacking a first insulating material layer and a second insulating material layer on the first conductive layer CL1 and then performing a process using a mask. Some of the contact holes included in the first and second interlayer insulating layers ILD1 and ILD2 may be located to corresponding to the contact holes included in the gate insulating layer GI.

The first and second interlayer insulating layers ILD1 and ILD2 in the non-display area NDA may include a twenty-first contact hole CH21 exposing a portion of the first line LP1, a twenty-second contact hole CH22 exposing a portion of the second line LP2, a twenty-third contact hole CH23 exposing a portion of the third line LP3, a twenty-fourth contact hole CH24 exposing a portion of the fourth line LP4, and a twenty-fifth contact hole CH25 exposing a portion of the fifth line LP5 (e.g., as shown in FIG. 17C-17H).

The gate insulating layer GI in first and second pixel areas PXA1 and PXA2 may include a first contact hole CH1 exposing a portion of the first source electrode SE1, a second contact hole CH2 exposing a portion of the first drain electrode DE1, a third contact hole CH3 exposing a portion of the third source electrode SE3, a fourth contact hole CH4 exposing a portion of the third drain electrode DE3, an eleventh contact hole CH11 exposing a portion of the second drain electrode DE2, and a twelfth contact hole CH12 exposing a portion of the second source electrode SE2 (e.g., as shown in FIG. 17C-17H).

The first and second interlayer insulating layers ILD1 and ILD2 in the first and second pixel areas PXA1 and PXA2 may include first to fourth contact holes CH1 to CH4 and eleventh and twelfth contact holes CH11 and CH12, which correspond to the first to fourth contact holes CH1 to CH4 and the eleventh and twelfth contact holes CH11 and CH12, which are included in the gate insulating layer GI.

Also, the first and second interlayer insulating layers ILD1 and ILD2 in the first and second pixel areas PXA1 and PXA2 may include a fifth contact hole CH5 exposing a portion of the third gate electrode GE3, a sixth contact hole CH6 exposing a portion of the control line CLi, a seventh contact hole CH7 exposing a portion of the first connection line CNL1, an eighth contact hole CH8 exposing another portion of the first connection line CNL1, a ninth contact hole CH9 exposing a portion of the scan line Si, a tenth contact hole CH10 exposing a portion of the second gate electrode GE2, and a thirteenth contact hole CH13 exposing a portion of the first gate electrode GE1 (e.g., as shown in FIG. 17C-17H).

Referring to FIGS. 1A-5, 6E, 8-16, 17C, and 18A-18D, a second conductive layer CL2 is formed on the second interlayer insulating layer ILD2.

The second conductive layer CL2 may include data lines Dj and Dj+1, an initialization power line IPL, a first power line PL1, first and second bridge lines BRL1 and BRL2, and second to fifth connection lines CNL2 to CNL5.

A jth data line Dj in the data lines Dj and Dj+1 may be connected to the second drain electrode DE2 located in the first pixel area PXA1 through the eleventh contact hole CH11. Also, the jth data line Dj may be connected to the first line LP1 of the non-display area NDA through the twenty-first contact hole CH21 (e.g., as shown in FIG. 17C-17H).

Figure 18A:
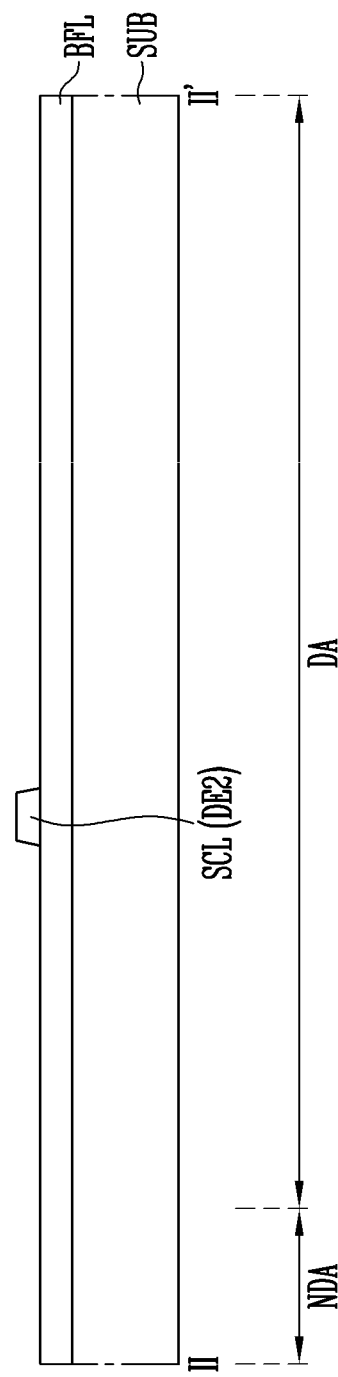
Figure 18B:
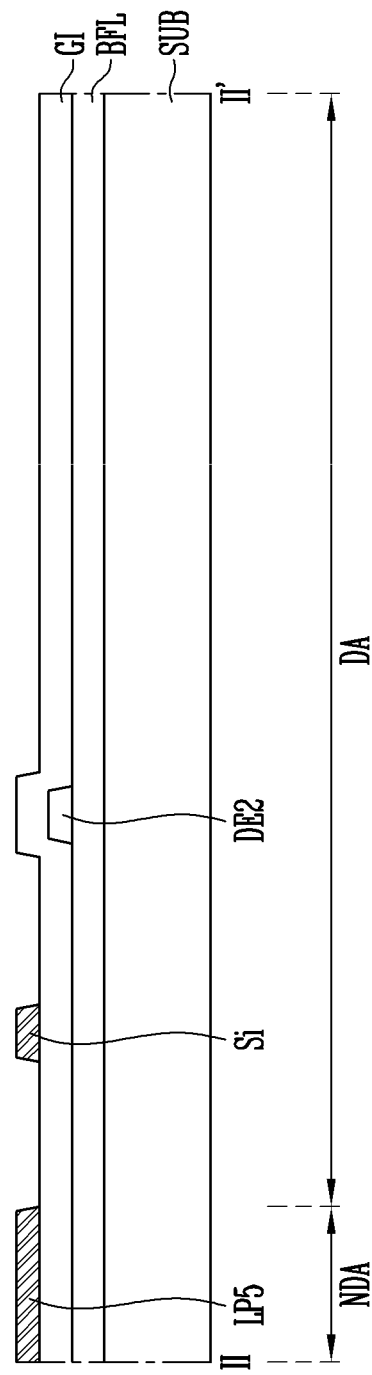
Figure 18D:
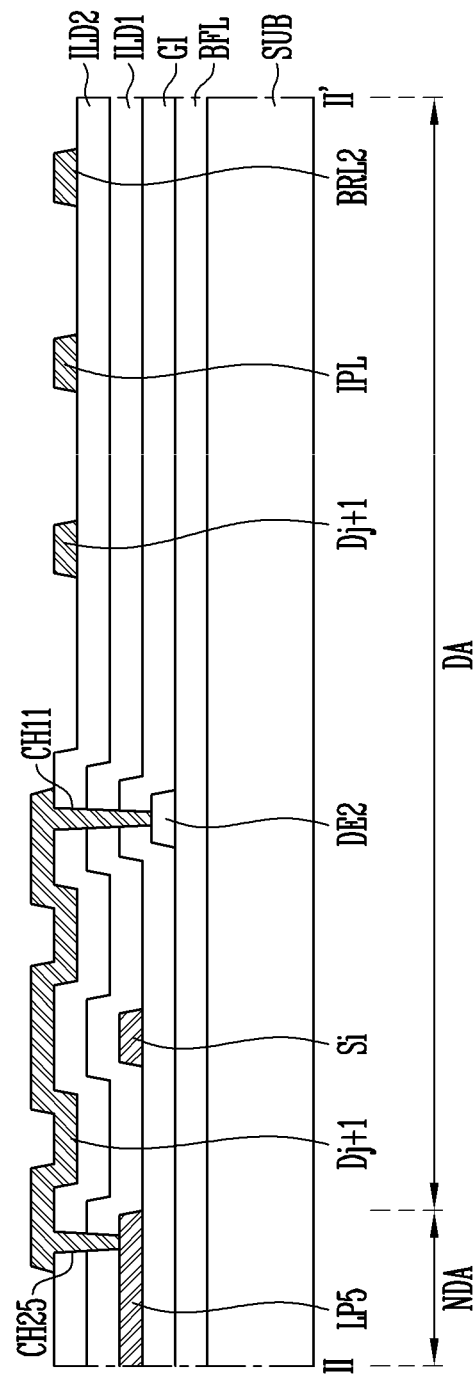
Figure 18E:
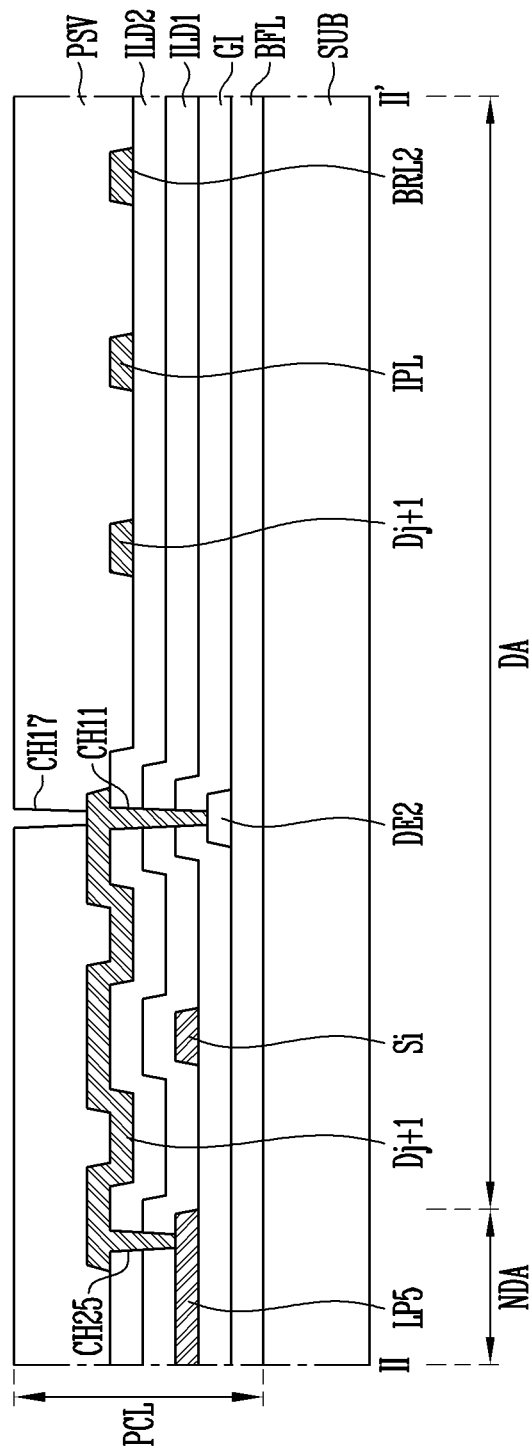
Figure 18F:
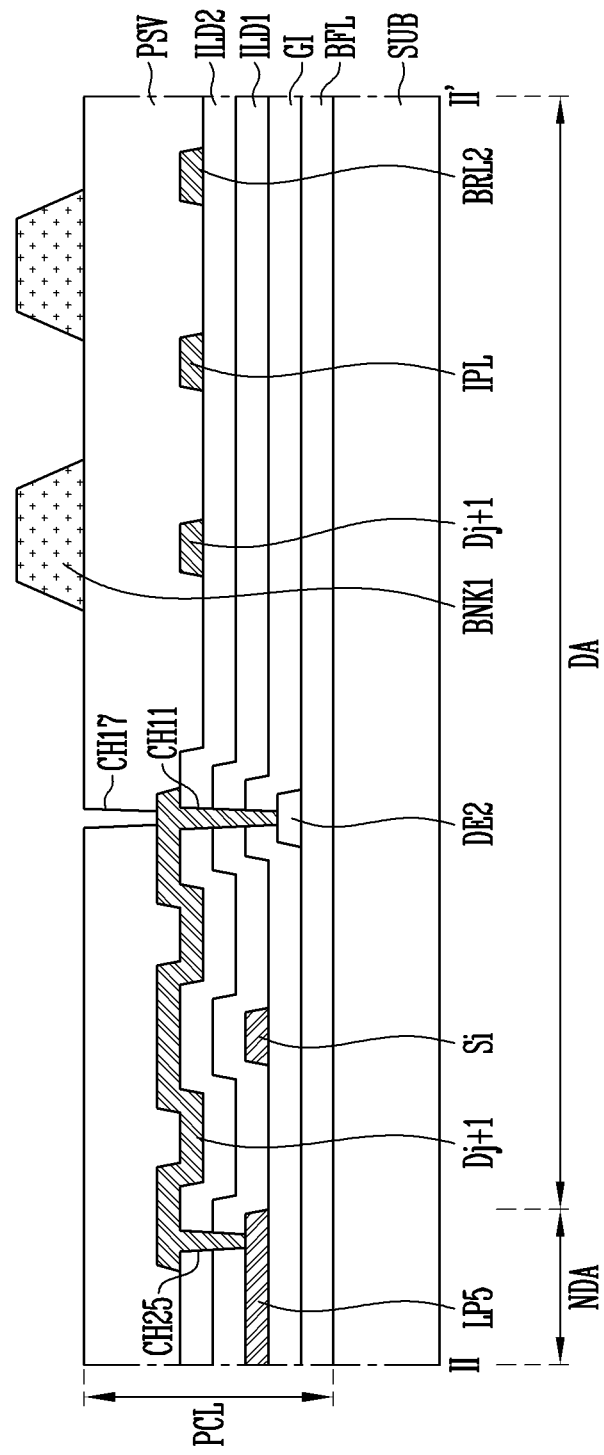
Figure 18G:
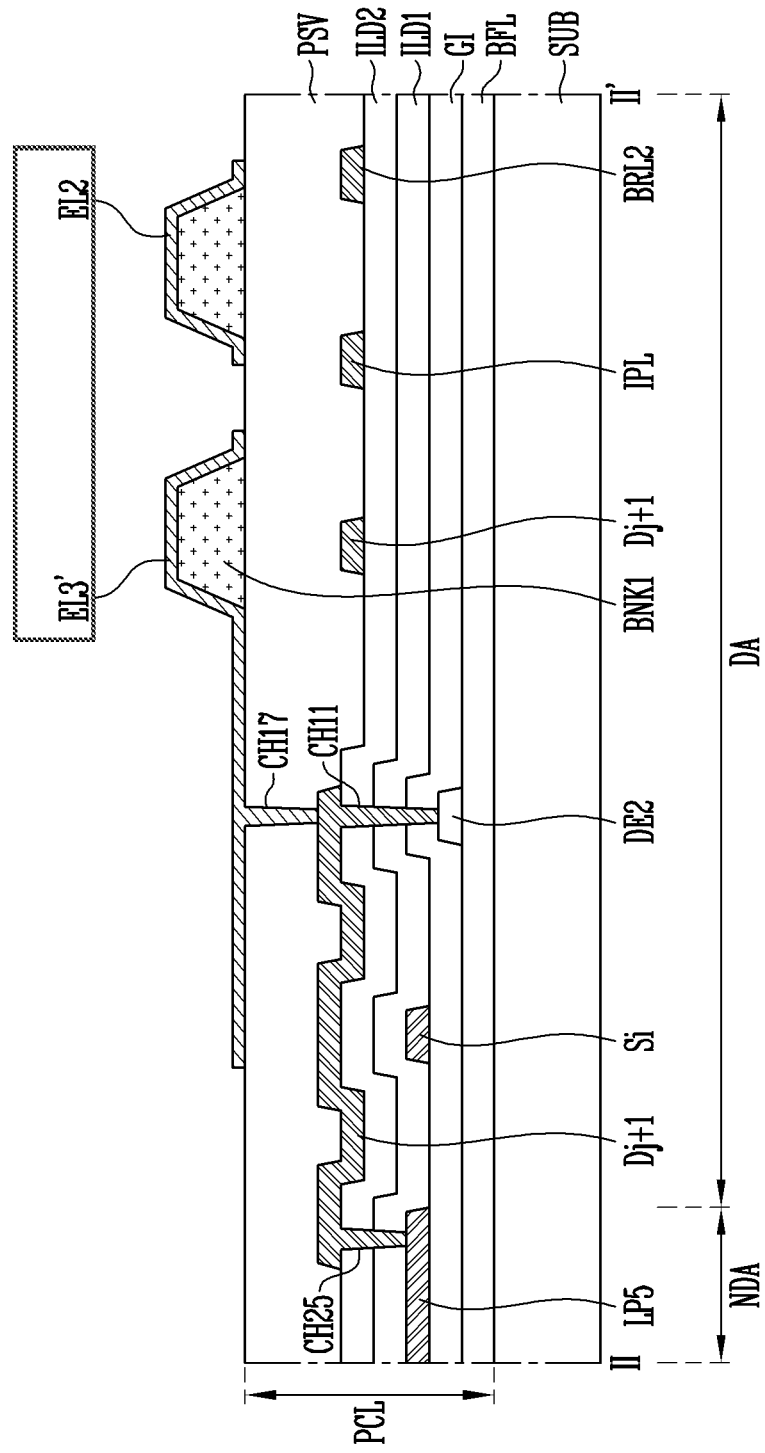
Figure 18H:
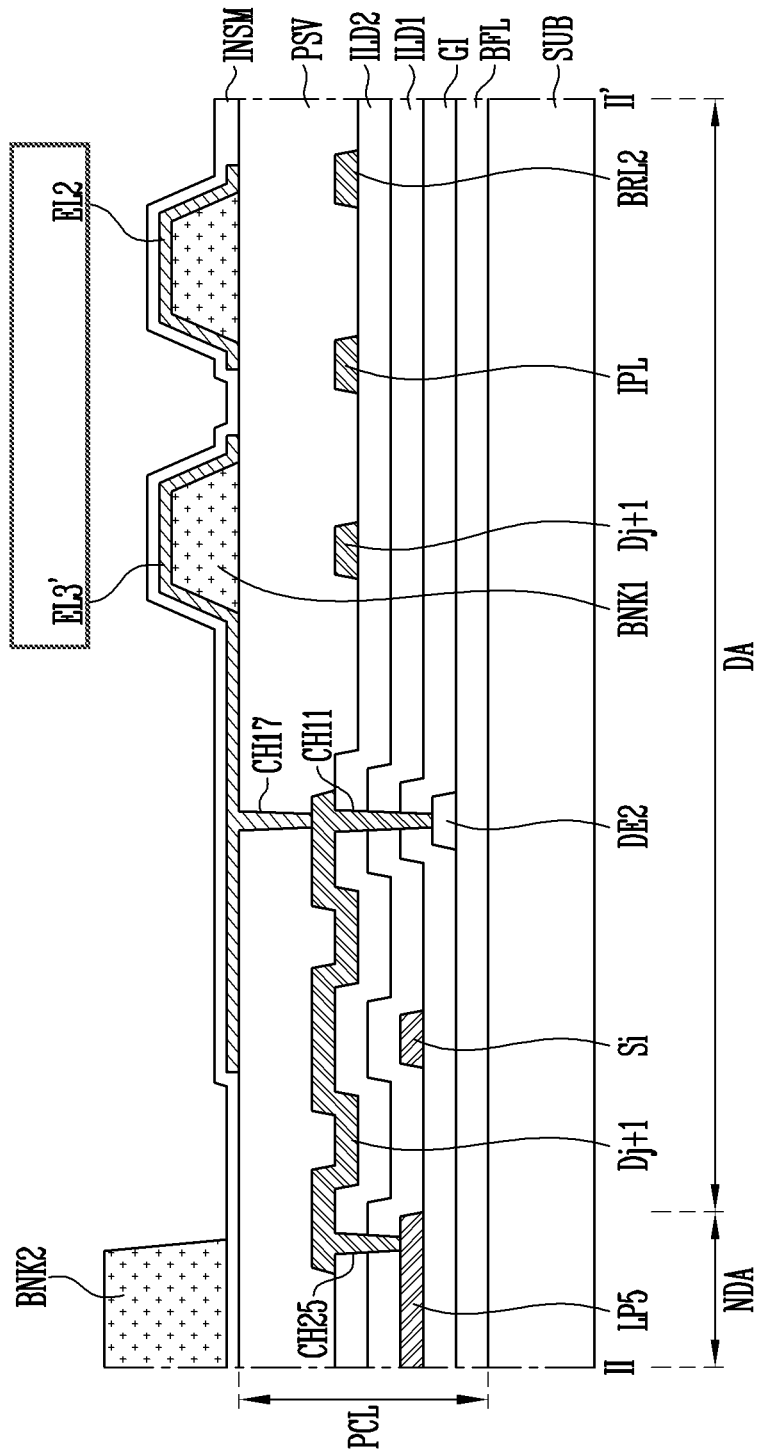
Figure 18I:
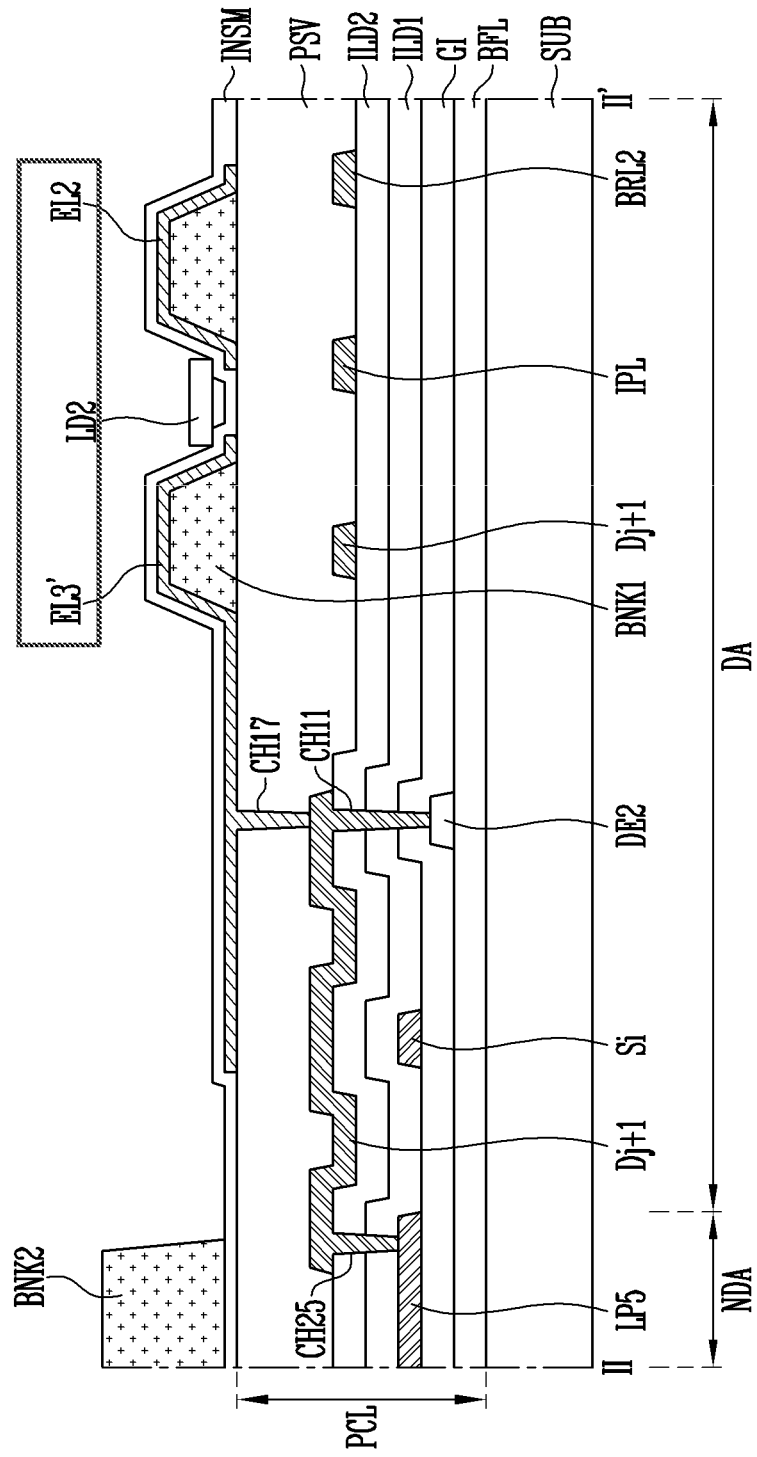
Figure 18J:
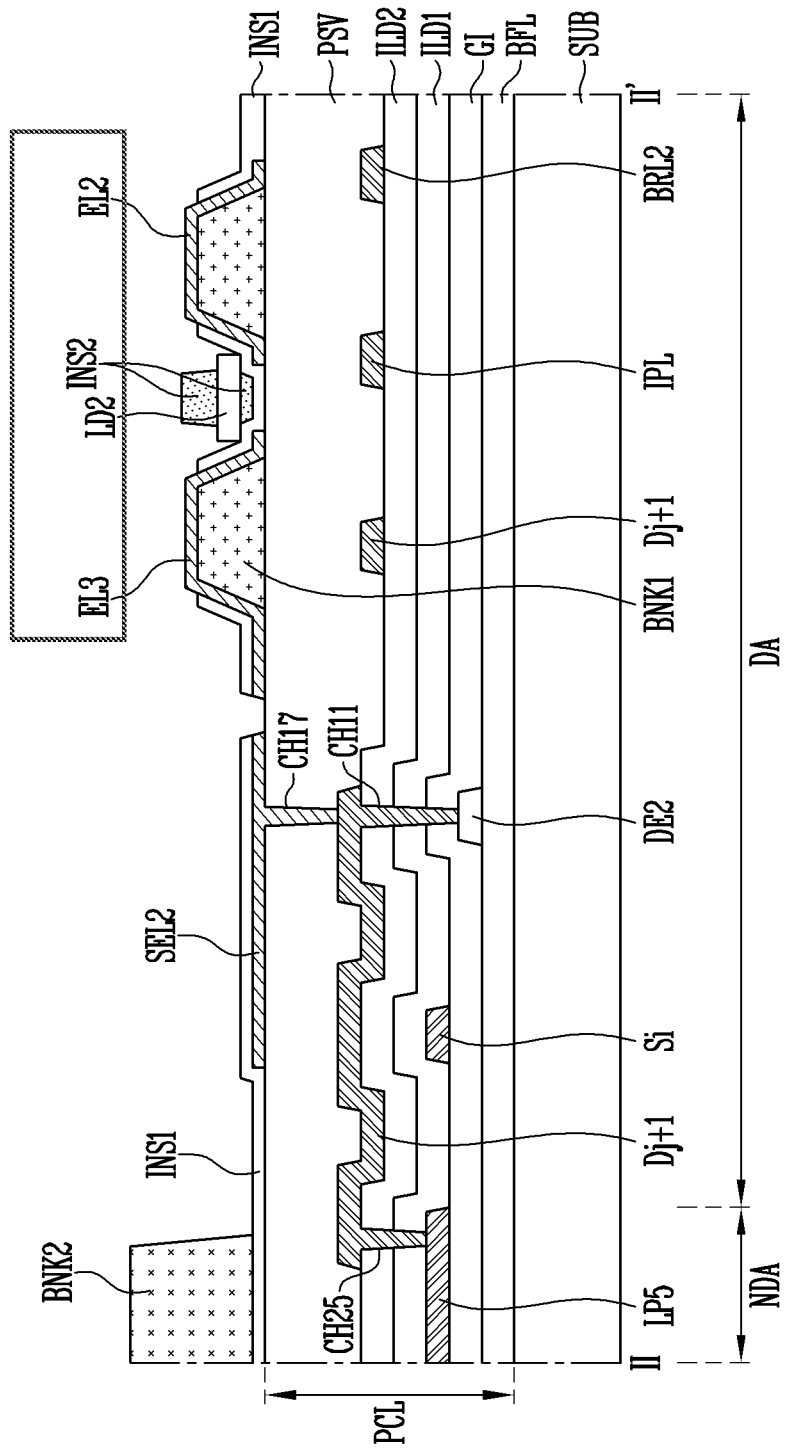
Figure 18K:
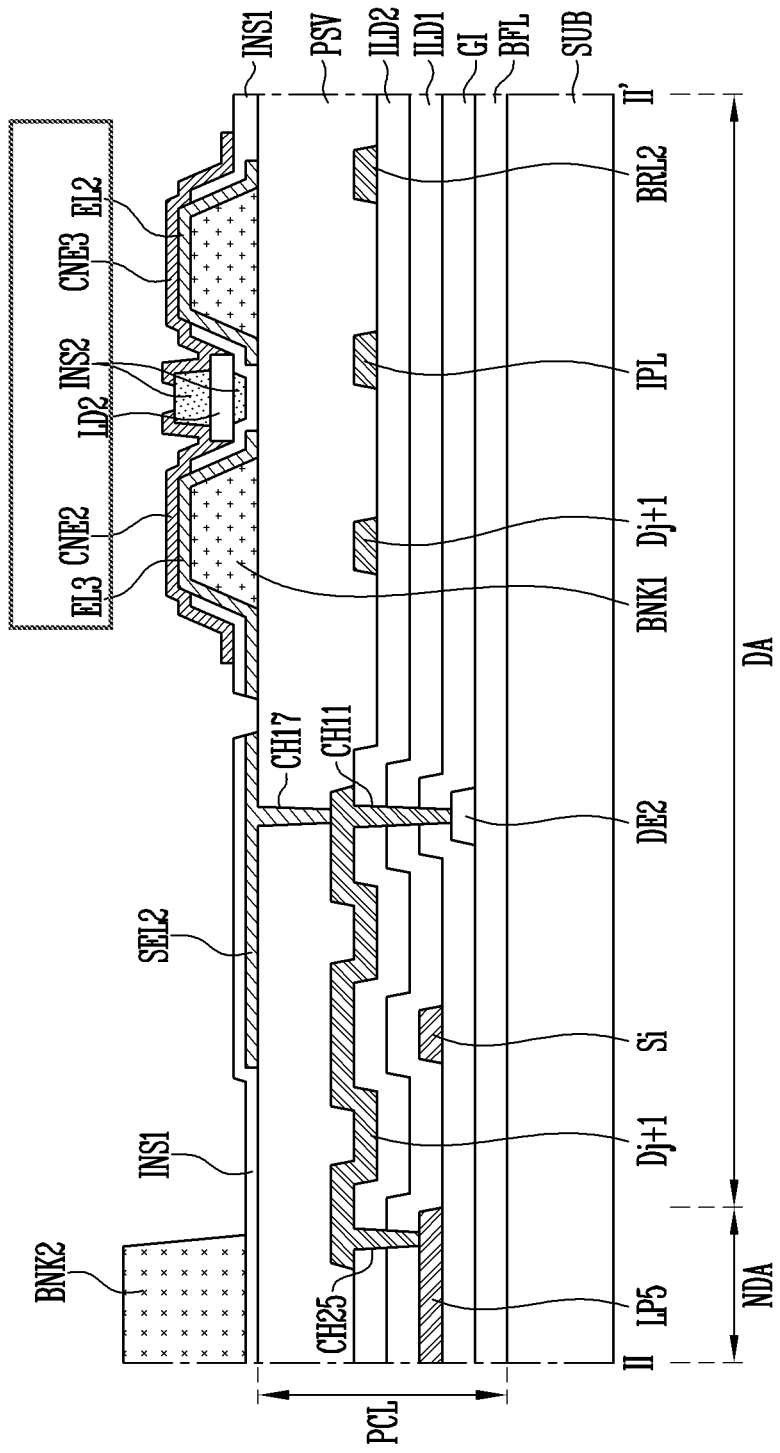
Figure 18L:
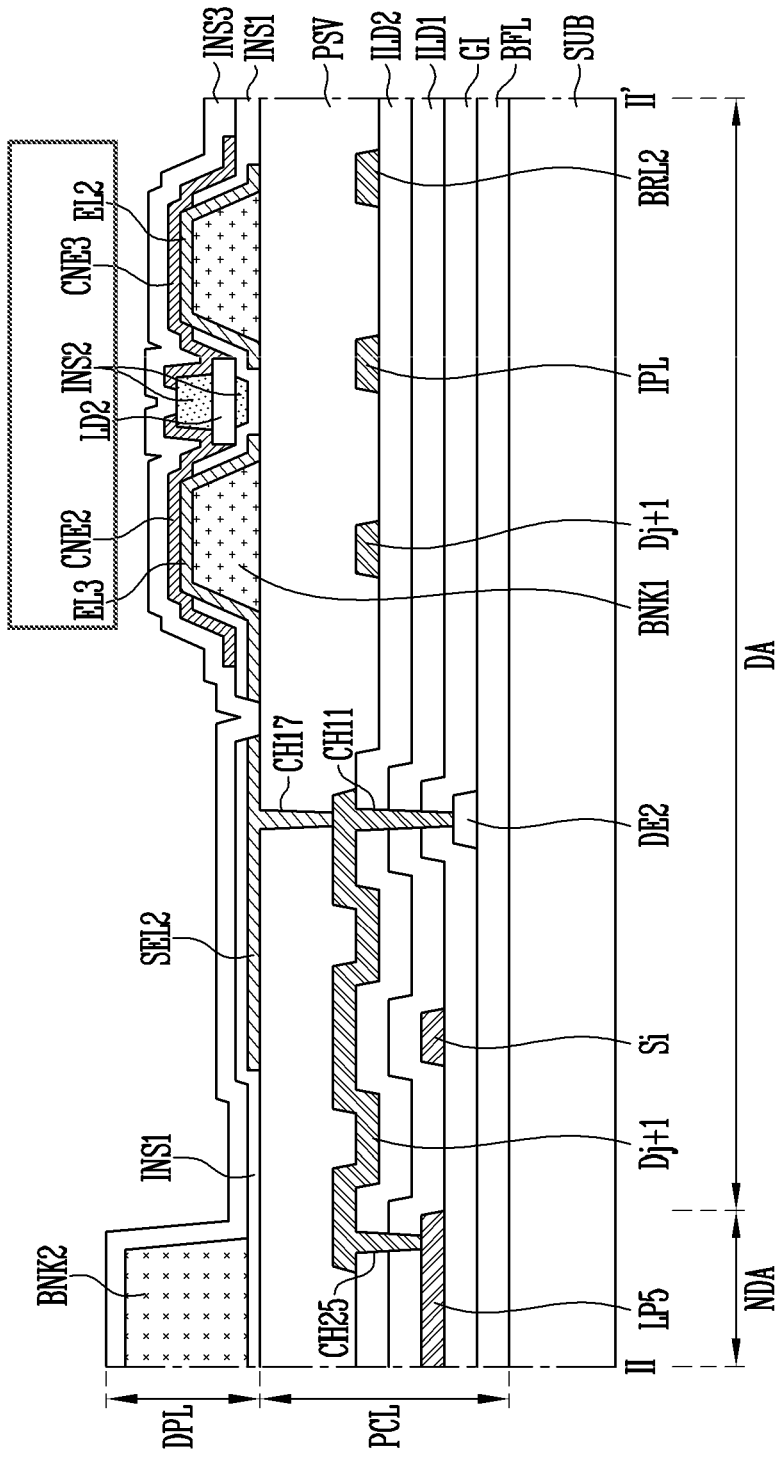

A (j+1)th data line Dj+1 in the data lines Dj and Dj+1 may be connected to the second drain electrode DE2 located in the second pixel area PXA2 through the eleventh contact hole CH11 (e.g., see FIG. 18D). Also, the (j+1)th data line Dj+1 may be connected to the fifth line LP5 of the non-display area NDA through the twenty-fifth contact hole CH25 (e.g., see FIG. 18D).

The first power line PL1 may be connected to the first drain electrode DE1 located in each of the first and second pixel areas PXA1 and PXA2 through the second contact hole CH2 (e.g., as shown in FIG. 17C-17H).

The initialization power line IPL may be connected to the first connection line CNL1 through the eighth contact hole CH8. Also, the initialization power line IPL may be connected to the third drain electrode DE3 located in each of the first and second pixel areas PXA1 and PXA2 through the first connection line CNL1, the seventh contact hole CH7, and the fifth connection line CNL5 (e.g., as shown in FIG. 17C-17H). Additionally, the initialization power line IPL may be connected to the fourth line LP4 of the non-display area NDA through the twenty-fourth contact hole CH24.

The first bridge line BRL1 may be connected to the second line LP2 of the non-display area NDA through the twenty-second contact hole CH22. The second bridge line BRL2 may be connected to the third line LP3 of the non-display area NDA through the twenty-third contact hole CH23.

The second connection line CNL2 provided in each of the first and second pixel areas PXA1 and PXA2 may be connected to the scan line Si through the ninth contact hole CH9, and may be connected to the second gate electrode GE2 through the tenth contact hole CH10.

The third connection line CNL3 provided in each of the first and second pixel areas PXA1 and PXA2 may be connected to the second source electrode SE2 through the twelfth contact hole CH12, and may be connected to the first gate electrode GE1 through the thirteenth contact hole CH13.

The fourth connection line CNL4 provided in each of the first and second pixel areas PXA1 and PXA2 may be connected to the third gate electrode GE3 through the fifth contact hole CH5, and may be connected to the control line CLi through the sixth contact hole CH6.

The fifth connection line CNL5 provided in each of the first and second pixel areas PXA1 and PXA2 may be connected to the third drain electrode DE3 through the fourth contact hole CH4, and may be connected to the first connection line CNL1 through the seventh contact hole CH7.

Referring to FIGS. 1A-5, 6E, 8-16, 17D, and 18A-18E, a passivation layer PSV is formed over the second conductive layer CL2. The passivation layer PSV may include fourteenth to seventeenth contact holes CH14 to CH17 exposing some of the components included in the second conductive layer CL2 to the outside.

The fourteenth contact hole CH14 of the passivation layer PSV may expose a portion of an upper electrode UE, the fifteenth contact hole CH15 of the passivation layer PSV may expose a portion of the first bridge line BRL1, the sixteenth contact hole CH16 of the passivation layer PSV may expose a portion of the second bridge line BRL2, and the seventeenth contact hole CH17 of the passivation layer PSV may expose a portion of the (j+1)th data line Dj+1.

Referring to FIGS. 1A-5, 6E, 8-16, and 18A-18F, a first bank pattern BNK1 is formed on the passivation layer PSV. The first bank pattern BNK1 on the passivation layer PSV may be spaced from an adjacent first bank pattern BNK1 at a certain distance. When viewed on a plane, the first bank pattern BNK1 may have a bar shape extending along a second direction DR2, but the present disclosure is not limited thereto. The first bank pattern BNK1 may include an inorganic insulating layer made of an inorganic material or an organic insulating layer made of an organic material.

Referring to FIGS. 1A-5, 6E, 8-16, 17E, and 18A-18G, a first' electrode EL1', a second electrode EL2, and a third' electrode EL3', which include a conductive material (or substance) having high reflexibility, are formed on the passivation layer PSV including the first bank patterns BNK1.

The first' electrode EL1', the second electrode EL2, and the third' electrode EL3' may be formed on corresponding first bank patterns BNK1, and be spaced from each other.

The first' electrode EL1', the second electrode EL2, and the third' electrode EL3' may extend along the second direction DR2. The first' electrode EL1' may include a protrusion part in a first direction DR1. The protrusion part of the first' electrode EL1' may overlap with each of the upper electrode UE and the first bridge line BRL1.

The first' electrode EL1' may be connected to the upper electrode UE through the fourteenth contact hole CH14, and be connected to the first bridge line BRL1 through the fifteenth contact hole CH15. Accordingly, the first' electrode EL1' is connected to the second line LP2 of the non-display area NDA through the first bridge line BRL1.

The second electrode EL2 is connected to the second bridge line BRL2 through the sixteenth contact hole CH16. Accordingly, the second electrode EL2 is connected to the third line LP3 of the non-display area NDA through the second bridge line BRL2.

The third' electrode EL3' is connected to the (j+1)th data line Dj+1 through the seventeenth contact hole CH17. Accordingly, the third' electrode EL3' is connected to the fifth line LP5 of the non-display area NDA through the (j+1)th data line Dj+1.

Referring to FIGS. 1A-5, 6E, 8-16, and 18A-18H, an insulating material layer INSM is formed over the first' electrode EL1', the second electrode EL2, and the third' electrode EL3'. The insulating material layer INSM may include an inorganic insulating layer made of an inorganic material or an organic insulating layer made of an organic material.

Subsequently, a second bank pattern BNK2 is formed on the insulating material layer INSM. The second bank pattern BNK2 may be a pixel defining layer which defines (or partitions) light emitting areas of first and second pixels PXL1 and PXL2. The second bank pattern BNK2 may include an inorganic insulating layer including an inorganic material and/or an organic insulating layer including an organic material. In some embodiments, the second bank pattern BNK2 may be formed through the same process as the first bank pattern BNK1.

Referring to FIGS. 1A-5, 6E, 8-16, 17F, and 18A-18I, an electric field is formed between two adjacent electrodes by respectively applying corresponding alignment signals (or alignment voltages) to the first' electrode EL1', the second electrode EL2, and the third' electrode EL3' through the second to third lines LP2 to LP3 and the fifth line LP5 disposed in the non-display area NDA. The alignment signal of the second line LP2 may be transferred to the first' electrode EL1' through the first bridge line BRL1, the alignment signal of the third line LP3 may be transferred to the second electrode EL2 through the second bridge line BRL2, and the alignment signal of the fifth line LP5 may be transferred to the third' electrode EL3' through the (j+1)th data line Dj+1.

Each of the first' electrode EL1', the second electrode EL2, and the third' electrode EL3' may be an alignment electrode (or alignment line) for aligning light emitting elements LD in each of the first and second pixel areas PXA1 and PXA2.

When an alignment signal (or alignment voltage) of an AC power source or DC power source having a suitable voltage (e.g., a set or predetermined voltage) and a period (e.g., a set or predetermined period) is applied to each of the first' electrode EL1', the second electrode EL2, and the third' electrode EL3', an electric field according to a potential difference between two adjacent electrodes from among the first' electrode EL1', the second electrode EL2, and the third' electrode EL3' may be formed between the two adjacent electrodes. In the state in which the electric field is formed between the two adjacent electrodes, a mixed solution including light emitting elements LD are injected into each of the first and second pixel areas PXA1 and PXA2 by using an inkjet printing process, etc. For example, an inkjet nozzle may be disposed above the insulating material layer INSM, and a solvent in which a plurality of light emitting elements LD are mixed may be injected into each of the first and second pixel areas PXA1 and PXA2 through the inkjet nozzle. The solvent may be at least one of acetone, water, alcohol, and toluene, but the present disclosure is not limited thereto. For example, the solvent may be provided in the form of ink or paste. The method of injecting the light emitting elements LD into each of the first and second pixel areas PXA1 and PXA2 is not limited to the above-described embodiment, and may be variously changed.

The solvent may be removed after the light emitting elements LD are injected.

When the light emitting elements LD are injected into each of the first and second pixel areas PXA1 and PXA2, self-alignment of the light emitting elements LD may be induced due to the electric field formed between the two adjacent electrodes. Accordingly, light emitting elements LD may be aligned each of between the first' electrode EL1' and one side LS of the second electrode EL2 and between the other side RS of the second electrode EL2 and the third' electrode EL3'. Each of the light emitting elements LD may be aligned on the insulating material layer INSM in each of the first and second pixel areas PXA1 and PXA2.

Referring to FIGS. 1A-5, 6E, 8-16, 17G, and 18A-18J, after the light emitting elements LD are aligned, a second insulating layer INS2 is formed over each of the light emitting elements LD. The second insulating layer INS2 may expose both end portions of each of the light emitting elements LD to the outside by covering at least one of an upper surface of each of the light emitting elements LD.

A first insulating layer INS1 is formed by etching the insulating material layer INSM to expose each of a portion of the first' electrode EL1', a portion of the second electrode EL2, and a portion of the third' electrode EL3' through the process of forming the second insulating layer INS2, an etching process performed before/after the process, or the like.

In one or more embodiments, a first electrode EL1, a first sub-electrode SEL1, a third electrode EL3, and a second sub-electrode SEL2 are formed by removing the exposed portion of the first' electrode EL1' and the exposed portion of the third' electrode EL3' through the process of forming the second insulating layer INS2, an etching process using a mask after the process such that each of the first and second pixels PXL1 and PXL2 can be independently (or individually) driven from pixels PXL adjacent thereto, or the like.

The first sub-electrode SEL1 is connected to the first bridge line BRL1, and the third sub-electrode SEL3 is connected to the (j+1)th data line Dj+1.

The first electrode EL1 and the first sub-electrode SEL1, which are formed through the process of removing the exposed portion of the first' electrode EU', may be electrically and/or physically separated from each other. The third electrode EL3 and the second sub-electrode SEL2, which are formed through the process of removing the exposed portion of the third' electrode EL3', may be electrically and/or physically separated from each other.

Because the first sub-electrode SEL1 and the first electrode EL1 are separated from each other through the above-described process, the first electrode EL1 may be electrically and/or physically separated from the first bridge line BRL1. In one or more embodiments, because the second sub-electrode SEL2 and the third electrode EL3 are separated from each other through the above-described process, the third electrode EL3 may be electrically and/or physically separated from the (j+1)th data line Dj+1.

The first electrode EL1 may be connected to the upper electrode UE through the fourteenth contact hole CH14, and serve as a driving electrode for driving the light emitting elements LD. The third electrode EL3 may be in a floating state, and may serve as a reflective member for reflecting light emitted from each of the light emitting elements LD between the second electrode EL and the third electrode EL3 in an image display direction of the display device.

Referring to FIGS. 1A-5, 6E, 8-16, 17H, and 18A-18K, first to third contact electrodes CNE1, CNE2, and CNE3 are formed on the first to third electrodes EL1, EL2, and EL3.

The first contact electrode CNE1 may be formed on the first electrode EL1, and may overlap with the first electrode EL1 and one of both end portions of each of first light emitting elements LD1. The second contact electrode CNE2 may be formed on the second electrode EL2, and may overlap with the second electrode EL2, the other of both end portions of each of the first light emitting elements LD1, and one of both end portions of each of second light emitting elements LD2. The third contact electrode CNE3 may be formed on the third electrode EL3, and may overlap with the other of both the end portions of each of the second light emitting elements LD2.

Referring to FIGS. 1A-5, 6E, 8-16, and 18A-18L, a third insulating layer INS3 is formed, which covers the first to third contact electrodes CNE1 to CNE3. The third insulating layer INS3 may have a structure in which at least one inorganic layer and at least one organic layer are alternately stacked.

In accordance with the present disclosure, there can be provided a display device in which light emitting elements are aligned in a pixel area by using a fan-out line constituting a first conductive layer and a bridge line and a data line, which constitute a second conductive layer, so that the display device can be formed through a sample fabricating process by omitting a fabricating process of a separate component for supplying an alignment signal.

Further, a method of fabricating the display device can be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display device comprising:
a substrate comprising a display area including a plurality of pixel areas and a non-display area located at at least one side of the display area;
a pixel in each of the plurality of pixel areas; and
a plurality of fan-out lines in the non-display area to form a first conductive layer,
wherein the pixel in each of the plurality of pixel areas comprises:
a pixel circuit layer comprising a data line, at least one transistor, at least one capacitor, and a first bridge line and a second bridge line to form a second conductive layer different from the first conductive layer; and
a display element layer on the pixel circuit layer, the display element layer comprising a plurality of light emitting elements,
wherein each of the first and second bridge lines is electrically connected to a corresponding fan-out line from among the plurality of fan-out lines.

2. The display device of claim 1, wherein the pixel circuit layer comprises first to fourth insulating layers sequentially disposed on the substrate,
wherein the display element layer comprises:
first to third electrodes spaced from each other on the fourth insulating layer;
the plurality of light emitting elements between the first to third electrodes;
a first sub-electrode electrically connected to the first bridge line through a first contact hole penetrating the fourth insulating layer; and
a second sub-electrode electrically connected to the data line through a second contact hole penetrating the fourth insulating layer.

3. The display device of claim 2, wherein each of the first and second sub-electrodes is electrically separated from the first to third electrodes.

4. The display device of claim 2, wherein the first and second sub-electrodes are at the same layer as the first to third electrodes.

5. The display device of claim 2, wherein the second electrode is electrically connected to the second bridge line through a third contact hole penetrating the fourth insulating layer.

6. The display device of claim 2, wherein the pixel circuit layer comprises:
a scan line to transfer a scan signal to the pixel;
the data line to transfer a data signal to the pixel;
a power line to transfer a driving voltage to the pixel; and
an initialization power line to transfer an initialization voltage to the pixel.

7. The display device of claim 6, wherein the first electrode is electrically separated from the first bridge line, and the third electrode is electrically separated from the data line.

8. The display device of claim 6, wherein at least a portion of the first electrode overlaps with the first bridge line in a plan view,
at least a portion of the second electrode overlaps with the second bridge line in the plan view, and
at least a portion of the third electrode overlaps with the data line in the plan view.

9. The display device of claim 6, wherein the first conductive layer is on the first insulating layer, and the second conductive layer is on the third insulating layer.

10. The display device of claim 6, wherein the scan line is at the same layer as the plurality of fan-out lines, and
the data line is at the same layer as the first and second bridge lines.

11. The display device of claim 6, wherein the first and second bridge lines and the data line extend in one direction, and are spaced from each other.

12. The display device of claim 2, wherein the display element layer further comprises:
an insulating pattern on an upper surface of each of the plurality of light emitting elements; and
a contact electrode on each of the first to third electrodes.

13. The display device of claim 12, wherein the contact electrode on the first electrode, the contact electrode on the second electrode, and the contact electrode on the third electrode are on the insulating pattern, and are spaced from each other.

14. The display device of claim 2, wherein the first bridge line is connected to the corresponding fan-out line from among the plurality of fan-out lines and the first sub-electrode,
the second bridge line is connected to the corresponding fan-out line from among the plurality of fan-out lines and the second electrode, and
the data line is connected to a corresponding fan-out line from among the plurality of fan-out lines and the second sub-electrode.

* * * * *